United States Patent
Uchiki et al.

(10) Patent No.: US 6,456,672 B1
(45) Date of Patent: Sep. 24, 2002

(54) AUTOMATIC FREQUENCY CONTROL COMMUNICATION SYSTEM

(75) Inventors: Tatsuya Uchiki, Tokyo (JP); Toshiharu Kojima, Tokyo (JP); Hiroyasu Sano, Tokyo (JP); Seiji Okubo, Tokyo (JP); Makoto Miyake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/066,823

(22) Filed: Apr. 28, 1998

(30) Foreign Application Priority Data

Oct. 30, 1997 (JP) .............................................. 9-298412

(51) Int. Cl.⁷ .............................................. H04L 27/06
(52) U.S. Cl. ........................ 375/344; 375/130; 375/269
(58) Field of Search ................................ 375/344, 262, 375/269, 279, 308, 329, 341, 285, 130, 140, 141, 146, 147, 167, 347, 349; 370/546, 508

(56) References Cited

U.S. PATENT DOCUMENTS

| | | | |
|---|---|---|---|
| 3,409,875 A | | 11/1968 | De Jager et al. |
| 5,117,195 A | | 5/1992 | Robbins |
| 5,117,427 A | * | 5/1992 | Miyake et al. |
| 5,193,222 A | * | 3/1993 | Sasaki |
| 5,241,567 A | * | 8/1993 | Shimakata |
| 5,305,353 A | | 4/1994 | Weerackody |
| 5,504,774 A | * | 4/1996 | Takai et al. ................. 375/130 |
| 5,511,097 A | * | 4/1996 | Tsumura ..................... 375/324 |
| 5,594,758 A | * | 1/1997 | Petranovich ................ 375/344 |
| 5,610,949 A | * | 3/1997 | Petranovich ................ 375/330 |
| 5,625,652 A | * | 4/1997 | Petranovich ................ 375/355 |
| 5,710,784 A | | 1/1998 | Kindred et al. |
| 5,844,907 A | | 12/1998 | Tatsuya |
| 5,903,556 A | * | 5/1999 | Matui .......................... 370/342 |

FOREIGN PATENT DOCUMENTS

| | | |
|---|---|---|
| EP | 675606 A | 10/1995 |
| EP | 771084 A | 5/1997 |
| JP | 1233847 | 9/1989 |
| JP | 6276107 | 9/1994 |
| JP | 07-066760 | 3/1995 |
| JP | 7107073 | 4/1995 |
| WO | WO95/06368 | 3/1995 |

OTHER PUBLICATIONS

*Patent Abstracts of Japan*, Publication No. 08330910 A, Dec. 13, 1996.

*Digital Communications by Satellite* (excerpt), by V.K. Bhargava (pub. by Jateck Publishing Co.) in 1981 by John Wiley & Sons, Inc.

TDMA Communication (excerpt), pp. 9–14, published Apr. 5, 1989.

Natali, Francis D., "AFC Tracking Algorithms," IEEE Transactions on Communications, pp. 935–47, vol. COM–32, No. 8, Aug. 1984.

* cited by examiner

*Primary Examiner*—Jean Corrielus

(57) ABSTRACT

In a communication system using the time diversity transmission scheme, the communication system provided with the stable automatic frequency control circuit with the wide frequency pull-in range and under low CN ratio transmission is achieved by removing the modulation phase from the received data through the application of the data correlation of the time diversity. The frequency offset in the received signal is compensated as the phase rotator rotates the phase of the received signal, the phase converter converts the phase rotator output into a phase, the serial-to-parallel converter converts the phase converter outputs into serial-to-parallel sequence, the delay units gives a delay to the serial-to-parallel converter output, the phase adder adds the serial-to-parallel converter output to the delay unit output, the multiplier multiplies the phase adder output by a certain value, the integrator integrates the multiplier output, another integrator integrates the integrator output, and the phase rotator controls the phase of the received signal based on the other integrator output.

47 Claims, 35 Drawing Sheets

Fig.2

| {A_i} | $A_{-1}$ | $A_0$ | $A_1$ | $A_2$ | ... | $A_{N-1}$ | $A_N$ | ... |
|---|---|---|---|---|---|---|---|---|
| {B_i} | $B_{-1} = A_{-1-N}$ | $B_0 = A_{-N}$ | $B_1 = A_{1-N}$ | $B_2 = A_{2-N}$ | ... | $B_{N-1} = A_{-1}$ | $B_N = A_0$ | ... |
| {C_i} | $C_{-1}$ | $C_0$ | $C_1$ | $C_2$ | ... | $C_{N-1}$ | $C_N$ | ... |

$\phi c_i = \{\phi c_{i,1}, \phi c_{i,2}\}$
$\phi c_{i,1} = \phi a_i$
$\phi c_{i,2} = \phi b_i$

| $\{\phi c_i\}$ | $\phi c_{-1,1} = \phi a_{-1}$ | $\phi c_{-1,2} = \phi b_{-1}$ | $\phi c_{0,1} = \phi a_0$ | $\phi c_{0,2} = \phi b_0$ | $\phi c_{1,1} = \phi a_1$ | $\phi c_{1,2} = \phi b_1$ | $\phi c_{1,1} = \phi a_2$ | $\phi c_{1,2} = \phi b_2$ | ... | $\phi c_{N-1,1} = \phi a_{N-1}$ | $\phi c_{N-1,2} = \phi b_{N-1}$ | $\phi c_{N,1} = \phi a_N$ | $\phi c_{N,2} = \phi b_N$ | ... |
|---|---|---|---|---|---|---|---|---|---|---|---|---|---|---|
| | $\phi c_{-1}$ | | $\phi c_0$ | | $\phi c_1$ | | $\phi c_2$ | | ... | $\phi c_{N-1}$ | | $\phi c_N$ | | ... |
| $\{\phi a_i\}$ | $\phi a_{-1}$ | | $\phi a_0$ | | $\phi a_1$ | | $\phi a_2$ | | ... | $\phi a_{N-1}$ | | $\phi a_N$ | | ... |
| $\{\phi b_i\}$ | $\phi b_{-1} = \phi a_{-1-N}$ | | $\phi b_0 = \phi a_{-N}$ | | $\phi b_1 = \phi a_{1-N}$ | | $\phi b_2 = \phi a_{2-N}$ | | ... | $\phi b_{N-1} = \phi a_{-1}$ | | $\phi b_N = \phi a_0$ | | ... |

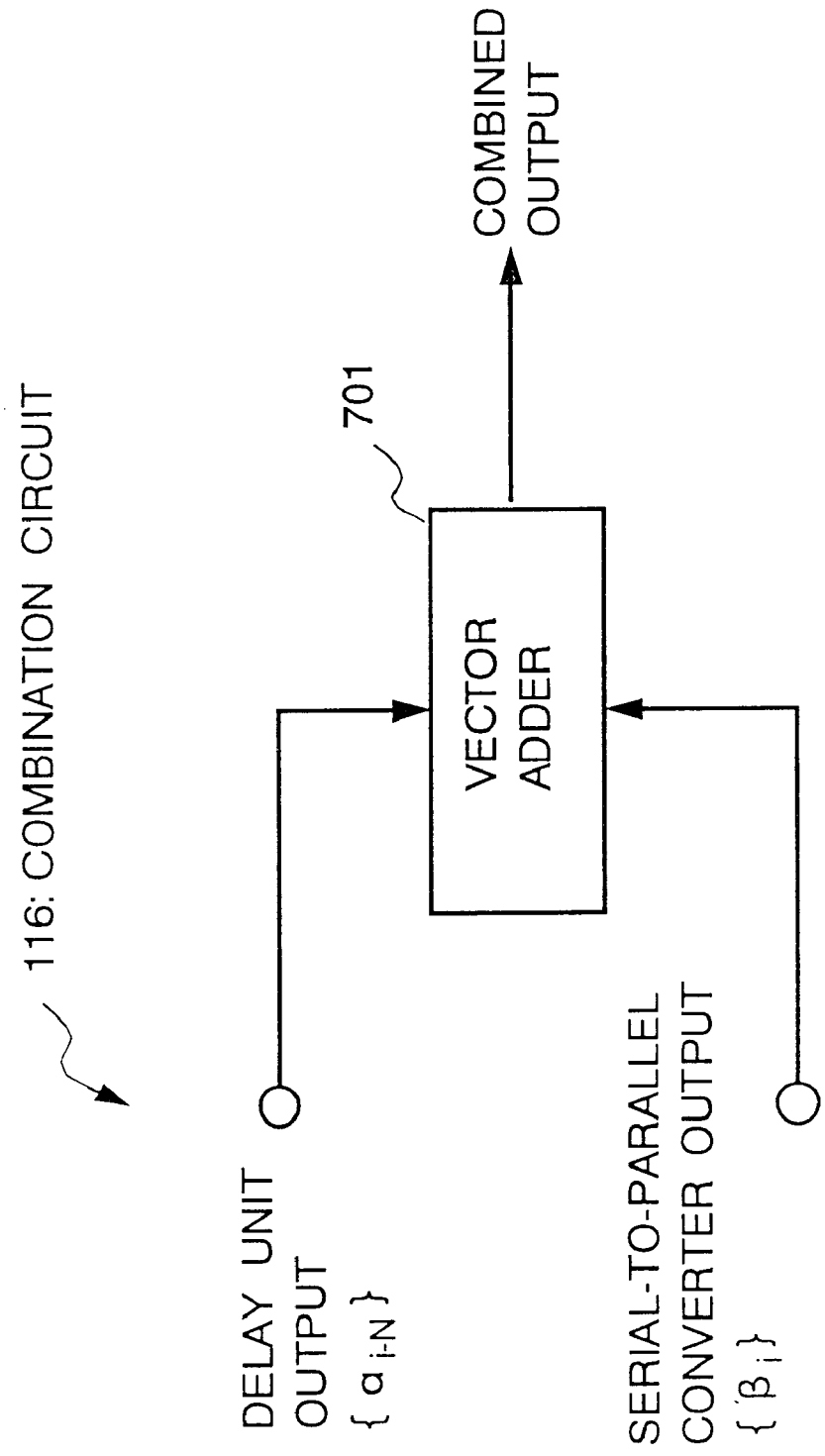

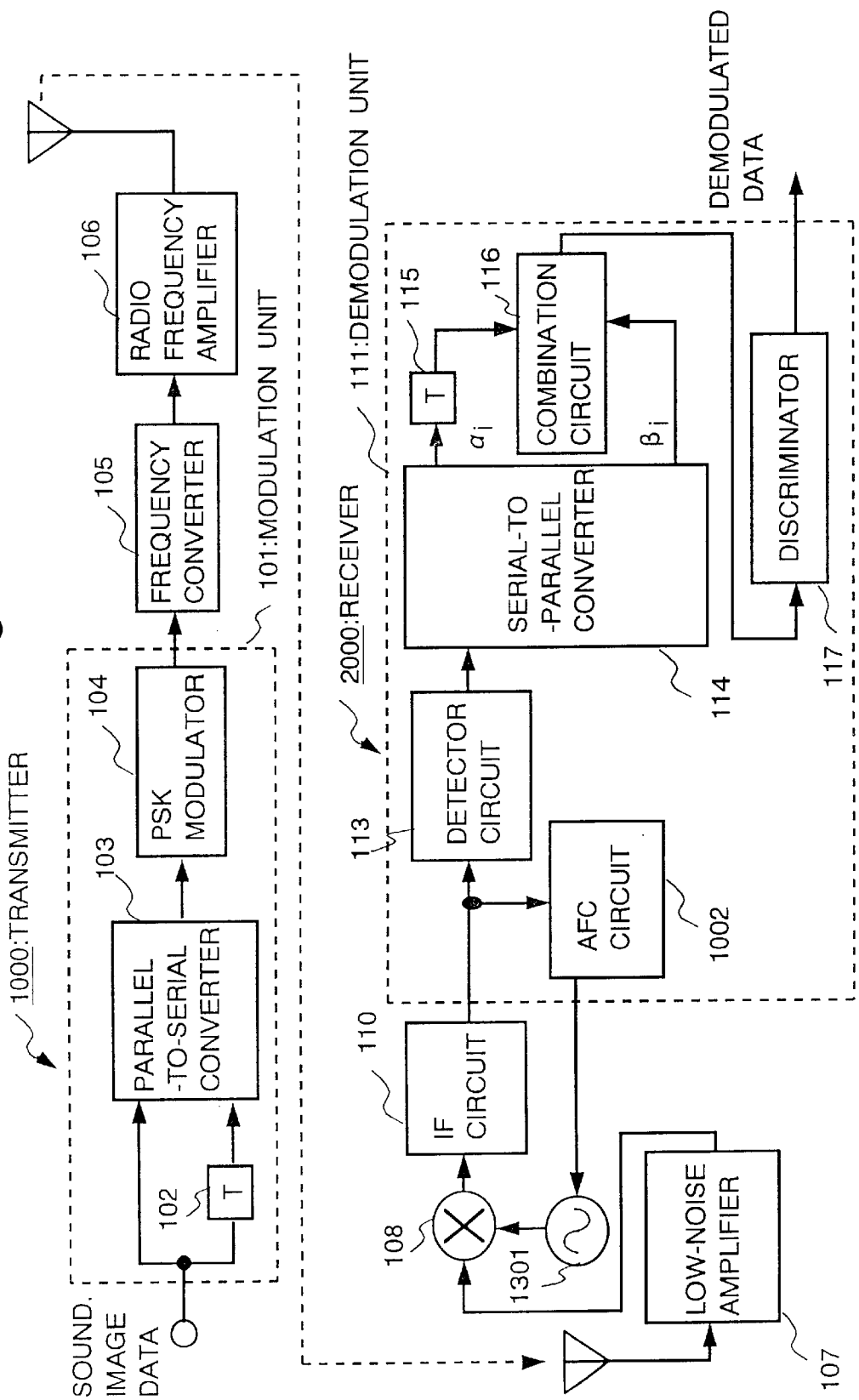

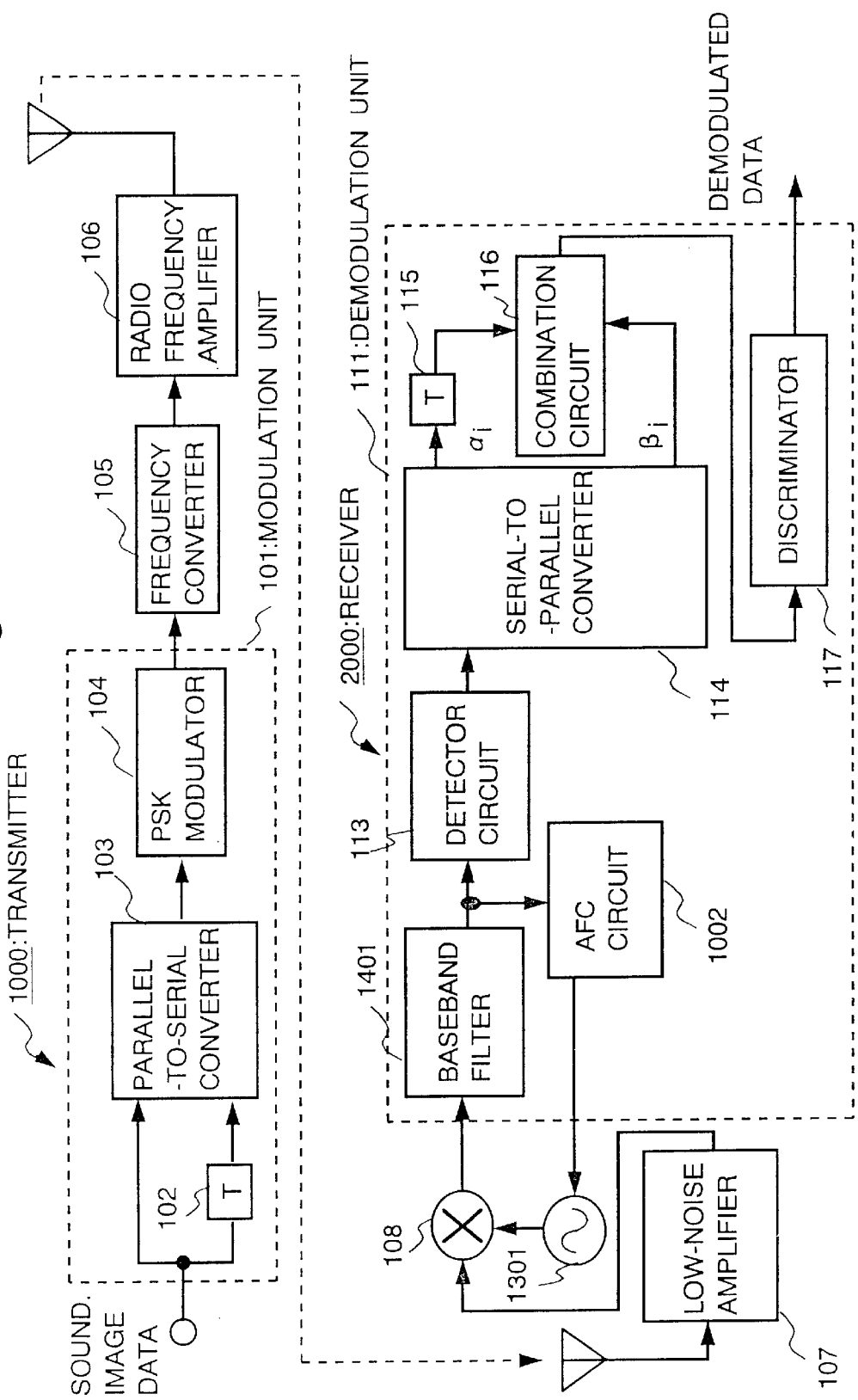

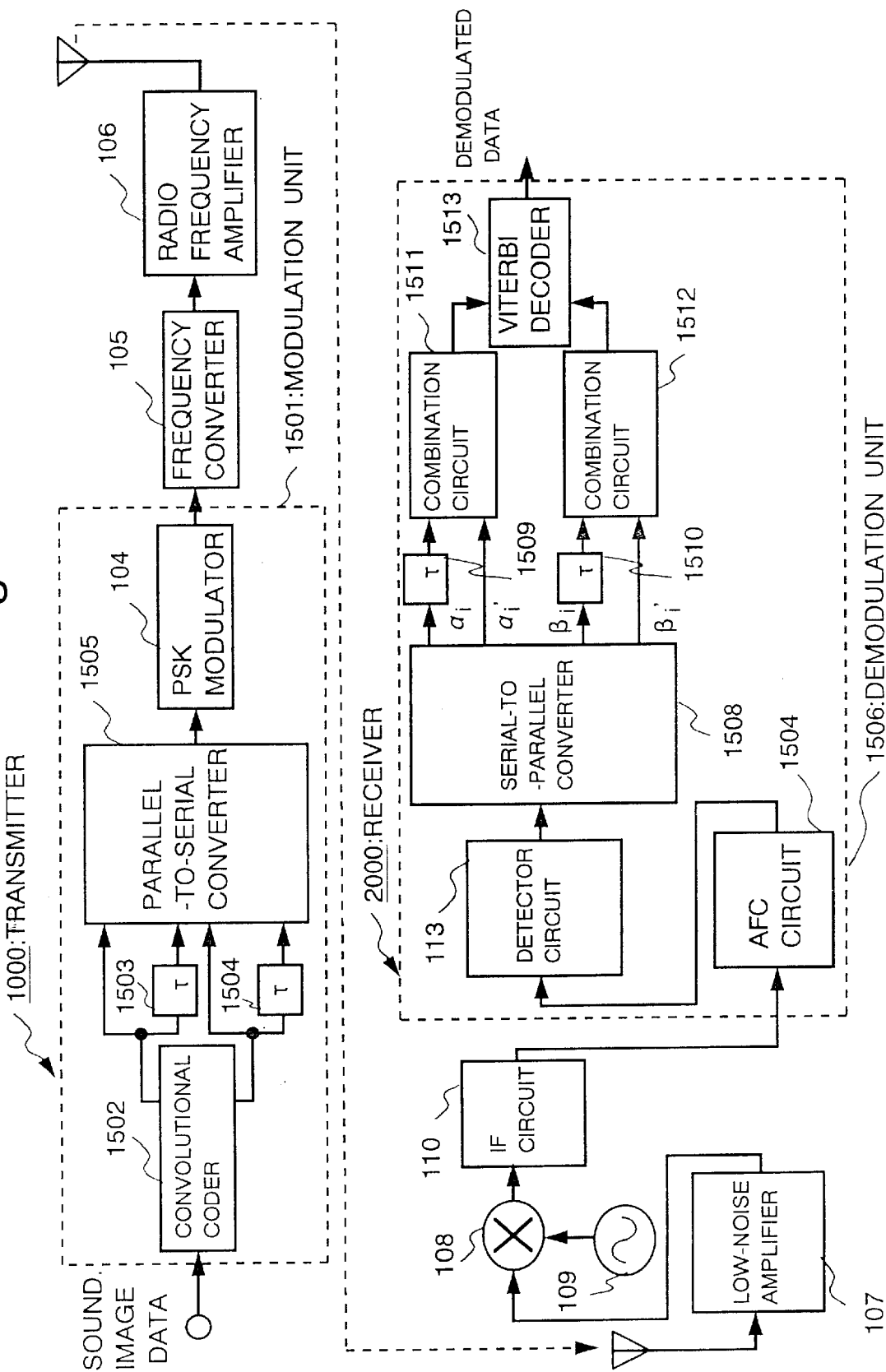

Fig.16

| {A_i} | $A_1$ | $A_2$ | ... | $A_M$ | $A_{M+1}$ |
|---|---|---|---|---|---|
| {A_i'} | $A_1' = A_{1-M}$ | $A_2' = A_{2-M}$ | ... | $A_M' = A_0$ | $A_{M+1}' = A_1$ |
| {B_i} | $B_1$ | $B_2$ | ... | $B_M$ | $B_{M+1}$ |
| {B_i'} | $B_1' = B_{1-M}$ | $B_2' = B_{2-M}$ | ... | $B_M' = B_0$ | $B_{M+1}' = B_1$ |
| {Γ_i} | $\Gamma_1$ | $\Gamma_2$ | ... | $\Gamma_M$ | $\Gamma_{M+1}$ |

| $\Gamma_{1,1} = A_1$ | $\Gamma_{1,2} = A_1'$ | $\Gamma_{1,3} = B_1$ | $\Gamma_{1,4} = B_1'$ | $\Gamma_{2,1} = A_2$ | $\Gamma_{2,2} = A_2'$ | $\Gamma_{2,3} = B_2$ | $\Gamma_{2,4} = B_2'$ | ... | $\Gamma_{M,1} = A_M$ | $\Gamma_{M,2} = A_M'$ | $\Gamma_{M,3} = B_M$ | $\Gamma_{M,4} = B_M'$ | $\Gamma_{M+1,1} = A_{M+1}$ | $\Gamma_{M+1,2} = A_{M+1}'$ | $\Gamma_{M+1,3} = B_{M+1}$ | $\Gamma_{M+1,4} = B_{M+1}'$ |

$\Gamma_i = (\Gamma_{i,1}, \Gamma_{i,2}, \Gamma_{i,3}, \Gamma_{i,4})$
$\Gamma_{i,1} = A_i \quad \Gamma_{i,3} = B_i$
$\Gamma_{i,2} = A_i' \quad \Gamma_{i,4} = B_i'$

Fig.18

$\phi Y_i = (\phi Y_{i,1}, \phi Y_{i,2}, \phi Y_{i,3}, \phi Y_{i,4})$
$\phi Y_{i,1} = \phi a_i \quad \phi Y_{i,3} = \phi b_i$
$\phi Y_{i,2} = \phi a_i' \quad \phi Y_{i,4} = \phi b_i'$

AUTOMATIC FREQUENCY CONTROL COMMUNICATION SYSTEM

BACKGROUND OF THE INVENTION

This invention relates to the improvement of a receiver in the field of radio communications.

DESCRIPTION OF THE RELATED ART

Automatic Frequency Control (AFC) circuit using a pilot signal, an automatic frequency control circuit of a conventional automatic frequency control communication system, is set forth in "AUTOMATIC FREQUENCY CONTROL CIRCUIT" in Japanese Unexamined Patent Application No. HEI08-330910. The conventional art is outlined below.

The configuration of a conventional AFC circuit is shown in FIG. 31, wherein, a frequency converter 3101, a pilot signal extraction circuit 3102, an arc tangent calculation circuit 3103, a phase-difference calculation circuit 3104, a linear approximation circuit 3105, a frequency-error calculation circuit 3106, a variable oscillator 3107, and a memory 3108 are illustrated.

The operation is explained next. A digital radio communication system is generally not free from frequency offset in received signals due to the difference in oscillation frequencies between the oscillators used by a transmitter and a receiver, due to temperature change and other factors (this is called as frequency offset). Frequency offset is also caused by the Doppler shift incurred on the mobile unit in mobile communications and on the satellite in satellite communications. Because frequency offset in the received signal can degrade bit error rate, the AFC circuit is applied to the receiver to compensate for the frequency offset in the received signals.

In FIG. 31, an input to the AFC circuit is a received signal having frequency offset. After the received signal is input to the AFC circuit, it is input to frequency converter 3101. Frequency converter 3101 then converts the received signal to an intermediate frequency. Being converted to an intermediate frequency, the received signal is output from the AFC circuit while a pilot signal is extracted by a pilot signal extraction circuit 3102. A pilot signal is a sequence whose modulation phase is already known to the receiver, and the phase information of the known sequence is already stored in memory 3108 of the receiver, and by comparing the phase information to the phase of the received pilot signal, the frequency error can be obtained disregarding the modulation phase.

The pilot signal extracted by pilot signal extraction circuit 3102 is operated by arc tangent calculation circuit 3103 to obtain its arc tangent. A phase of the pilot signal is obtained through the arc tangent calculation. The phase difference of the pilot signal and phase information stored in memory 3108 are calculated by phase difference calculation circuit 3104.

Linear approximation circuit 3105 regards the output from phase difference calculation circuit 3104 as the linear function of time, and approximates phase difference linearly. Frequency error calculation circuit 3106 calculates a frequency error based on the inclination of the output from linear approximation circuit 3105. Based on the frequency error output from frequency error calculation circuit 3106, variable oscillator 3107 controls the frequency to be provided for frequency converter 3101 so as to eliminate the frequency error.

Based on the frequency error in the received signal output from frequency converter 3101, variable oscillator 3107 controls the frequency to be provided for frequency converter 3101 to make frequency error zero. Thus, automatic frequency control is achieved.

For the above mentioned AFC circuit, in order for the receiver to obtain the frequency error without removing the modulation phase, a pilot signal having the phase information known to the receiver must be inserted in the transmission data. It is undesirable as it degrades throughput. In addition, such a technique requires a memory in the receiver to calculate a phase difference in the received known sequence. Thus, it is not desirable as an extended circuitry is required, which results in increased power consumption.

Another automatic frequency control circuit in the conventional automatic frequency control communication system is a non-linear AFC circuit, which is expounded in "DIGITAL COMMUNICATIONS BY SATELLITE" (written by V. K. Bhargava, published by Jateck Publishing Co., on May 21, 1986). Given below is the explanation of this conventional art.

FIG. 32 is a configuration of the conventional AFC circuit, wherein, multipliers 3201 and 3202, a phase converter 3203, hard limiters 3204 and 3205, multipliers 3206 and 3207, and an adder 3208 are shown.

The operation is explained below. In FIG. 32, a reference carrier signal is branched out to two. One of which is input to multiplier 3202 and the other is input to phase converter 3203, where the reference carrier signal is phase shifted by $\pi/2$, and then input to multiplier 3201. Like the previously explained conventional automatic frequency control circuit, the received signal having frequency offset is input to the AFC circuit shown in FIG. 32. The received signal having frequency offset is multiplied by the reference carrier signal of the frequency roughly equals the received signal by multipliers 3201 and 3202.

Signals output from multipliers 3201 and 3202 are input to hard limiters 3204 and 3205 for sign determination. At multiplier 3206, the input to hard limiter 3205 is multiplied by the output from hard limiter 3204, while at multiplier 3207, the input to hard limiter 3204 is multiplied by the output from hard limiter 3205, respectively. Then at adder 3208, the output from multiplier 3206 is deducted from the output from multiplier 3207, to obtain a frequency error signal.

Let us assume that the received signal r (t) and the reference carrier signal R (t) are given by the expressions below.

$$r(t) = x(t)\cos(\omega_c t + \theta_i) + y(t)\sin(\omega_c t + \theta_i)$$

$$R(t) = \cos(\omega_c t + \theta_0)$$

where, $\omega_c$ denotes a frequency of the received signal, $\theta_i$ denotes a phase of the received signal, $\theta_0$ denotes a phase of the reference carrier signal, x(t) denotes an amplitude of the real part of r(t), and y(t) denotes an amplitude of the imaginary part of r(t).

According to the foregoing "DIGITAL COMMUNICATIONS BY SATELLITE", the frequency error signal e(t) is expressed approximately using $\phi = \theta_i - \theta_0$, as follows:

$$e(t) = -K\phi \text{ ($K$ being constant)}$$

Then, assuming that the Binary Phase Shift Keying (BPSK) modulation is applied as the modulation method, a baseband signal diagram of a noise-free received signal is shown in FIG. 33. Let us now assume that the phase of a transmitted signal is 0, a real signal point is point A, and a received signal point is point C of FIG. 33. That is, $\theta_i=\theta$, $\theta_0=0$, and the error signal $e(t) =-K\theta$. The phase difference between the real signal point A and the received signal point C becomes a positive value, indicating the frequency of the reference signal is lower than the frequency of the received signal.

When the carrier/noise(CN) ratio of the received signal is low, the position of the received signal point is significantly deviated from its original point due to the influence of noise. The distance from the signal point B (having the opposite polarity to the signal point A) may become shorter than the distance from the real signal point A. The position of the received signal point deviated due to noise is assumed to be C' in FIG. 33. Because the distance between C' and B becomes shorter than the distance between signals C' and A, $\theta'$ is detected instead of the real value $\theta$ as the phase rotation distance stemling from the frequency offset. In the example shown in FIG. 33, $\theta$ and $\theta'$ differ not only in their values but also in their polarities.

When polarities of $\theta$ and $\theta'$ are different, the AFC circuit controls to increase the frequency offset rather than its designed purpose of eliminating the frequency offset. The AFC circuit has a certain pull-in range in controllable frequency offset depending on the modulation or phase detection method. The frequency offset can be compensated up to the range half the symbol rate when the BPSK modulation is applied as the modulation method, and only up to ¼ when the Quadrature Phase Shift Keying (QPSK) modulation is applied. If the frequency offset exceeds the pull-in range, or when the frequency error varies depending on time due to the Doppler shift, etc., in addition to low CN ratio, the AFC circuit generates asynchronization, thereupon becomes unable to eliminate frequency offset, causing substantial degradation of the bit error rate.

And how the modulation phase affects in obtaining the frequency error will be discussed below.

If the modulation phase is either 0 or 1 in the binary PSK (BPSK), for instance, point A of FIG. 34 is transmitted when the modulation phase is "0", and point B of FIG. 34 is transmitted when the modulation phase is "1". It is assumed that these points rotate to A' and B' due to the frequency offset and then be received. At this time, because the receiver does not know what the modulation phase (whether it is 0 or 1) is, if, for instance, point A' is received, and if the modulation phase is assumed to be "0", then the shift of the phase angle due to the frequency offset is $\theta$, but if the modulation phase is assumed to be "1", then the shift of the phase angle due to the frequency offset becomes $(\pi+\theta)$.

$A \rightarrow A':\theta$ $A \rightarrow B':\pi+\theta$ $B \rightarrow B':\theta$ $B \rightarrow A':\pi+\theta$ Under such circumstances, to determine the modulation phase, "whether or not the phase angle of the received signal is larger or smaller than $\pi/2$" is used. That is, if the phase angle of the received signal is from 0 to $\pi/2$, the modulation phase is "0", and the phase angle shift due to the frequency offset equals the phase angle of the received signal. Conversely, if the phase angle of the received signal is between $\pi/2$ and $\pi$, the modulation phase is "1", and the phase angle shift due to the frequency offset equals "phase angle of the received signal-$\pi$". This phase angle shift due to the frequency offset can be calculated by doubling the phase angle.

The double frequency multiplication, or the method of removing the modulation phase doubling the phase angle due to the frequency offset is explained next. FIG. 35 shows a block diagram for a double frequency multiplication. The AFC having a Phase Lock Loop (PLL) type feedback loop shown in FIG. 35 is designed to obtain the phase shift due to the frequency offset based on the phase difference obtained between the current data and the data of one-data time before. In concrete, in dotted part 3501 of FIG. 35, at D, the phase difference between the current data and the previous data delayed for one-data time period is obtained. In the example of FIG. 34, the output from dotted part 3501 is a vector having the phase angle of $\theta$ or $(\pi+\theta)$.

The next dotted part 3502 is the removing part of the modulation phase. The real part (in-phase part) and the imaginary part (orthogonal part) of the vector having the phase angle $\theta$ or $(\pi+\theta)$ are multiplied. Assuming the phase angle is $\phi$, then, $\cos(\phi) \times \sin(\phi) = (1/2)\sin(2\phi)$ where, $\phi$ equals $\theta$ or $\pi+\theta$, but irrespective of the modulation phase, the sin value double the phase angle $\theta$ is obtained because $\theta \times 2 = 2\theta$ $(\pi+\theta) \times 2 = 2\pi + 2\theta = 2\theta$ The assumption "when $\theta \ll 1$, $\theta \approx \sin \theta$" is applied to the output from dotted part 3502, and then the output from dotted part 3502 is divided by two. That is, $(1/2)\sin(2\phi)$ $=(1/2)\sin(2\theta)$ $\approx (1/2) \cdot 2\theta = \theta$ However, because only polarity is required for the PLL-type feedback loop illustrated in FIG. 35, the phase angle is calculated by simply multiplying the loop gain g. The double frequency multiplication shown in FIG. 35 allows the removal of the modulation phase by doubling the phase angle due to the frequency offset.

Problems to be Solved by the Invention

The automatic frequency control circuit in the conventional automatic frequency control communication system has a problem of throughput deterioration because a known sequence is inserted in transmission signals to detect frequency offset. Moreover, because the receiver needs a memory to store data corresponding to the known sequence, the circuitry expands and power consumption increases. If frequency offset is large, or if frequency offset varies depending on time in addition to low C/N ratio, the AFC circuit generates asynchronization, thereby the compensation for the frequency offset is disabled.

The present invention aims at overcoming the above-mentioned problems.

The objective of the present invention is to achieve a communication system which can obtain a frequency error without removing modulation phase in the AFC circuit and to eliminate the frequency offset of the received signal using the obtained frequency error in the system using the time diversity scheme.

Yet another objective of the present invention is to achieve a communication system which provides a stable AFC circuit even under low C/N ratio, by reducing frequency offset errors stemming from determination errors in the frequency errors caused from the determination errors of modulation phase in the system using the time diversity scheme.

Yet another objective of the present invention is to achieve a communication system which can obtain frequency errors without removing the modulation phase in the AFC circuit and eliminate the frequency offset of the received signal by feeding the obtained frequency errors back to an Intermediate Frequency (IF) circuit in a system using the time diversity scheme.

Yet another objective of the present invention is to achieve a communication system which can obtain frequency errors without removing modulation phase in the AFC circuit and eliminate frequency offset from received signals by feeding the obtained frequency errors back to a Radio Frequency (RF) oscillator in the system using the time diversity scheme.

Yet another objective of the present invention is to achieve a communication system that provides better bit error rate in the system using the time diversity scheme.

Still another objective of the present invention is to achieve an excellent hindrance-proof and interference-proof communication system using the time diversity scheme.

SUMMARY OF THE INVENTION

An automatic frequency control communication system may comprise a transmitter which inputs a transmission data, generates a delayed data giving a determined time delay to the transmission data, multiplexes the delayed data to no delayed data of the transmission data for generating a multiplexed data, modulates the multiplexed data using Phase Shift Keying (PSK) modulation for generating a transmission signal, and transmits the transmission signal, and a receiver which receives the transmission signal transmitted by the transmitter as a received signal, detects the delayed data and the no delayed data included in the received signal, compensates for a phase shift of the receiving signal based on the delayed data and the no delayed data, and demodulates data of the received signal based on the delayed data and the no delayed data.

The automatic frequency control communication system, wherein the transmitter may include a transmission delay unit for inputting the transmission data, giving the determined time delay to the input transmission data, and outputting the delayed data, a parallel-to-serial converter for converting the transmission data and the delayed transmission data from parallel to serial data, a PSK modulation unit for PSK modulating the parallel-to-serial converted data a frequency converter for converting a frequency of the PSK modulated data, and a transmission unit for transmitting the frequency-converted data, and wherein the receiver may include an oscillator for oscillating a radio frequency, a mixer for inputting the received signal and mixing the input receiving signal with an output from the oscillator to convert the received signal into an IF signal, an IF circuit for converting the output from the mixer into a baseband signal, an AFC circuit for eliminating a frequency offset from the output from the IF circuit, a defecter circuit for detecting the output from the AFC circuit, a serial-to-parallel converter for converting the output from the detector circuit into the received data corresponding to the transmission data of the transmitter and into a first delayed received data corresponding to the delayed transmission data of the transmitter, a received delay unit for giving the determined time delay to the received data and outputting a second delayed received data, a combination circuit for combining the first delayed received data with the second delayed received data, and a discriminator for discriminating a phase of the output from the combination circuit and outputting a demodulated data.

The automatic frequency control communication system, wherein the transmitter may include the transmission delay unit for inputting the transmission data, giving the determined time delay to the input transmission data and outputting the delayed transmission data, the parallel-to-serial converter for converting the transmission data and the delayed transmission data from parallel to serial data, the PSK modulation unit for PSK modulating the parallel-to-serial converted data, the frequency converter for converting a frequency of the PSK modulated data, and the transmission unit for transmitting the frequency-converted data, and wherein the receiver may include the oscillator for oscillating the radio frequency, the mixer for inputting the received signal and mixing the input received signal with the output from the oscillator to convert the received signal into the baseband signal, a baseband filter for getting the mixer output filtered, the AFC circuit for feeding a frequency control signal back to the oscillator to eliminate the frequency offset from the output from the baseband filter, the defecter circuit for detecting the output from the baseband filter, the serial-to-parallel converter for converting the output from the detector circuit into the received data corresponding to the transmission data of the transmitter and to the first delayed received data corresponding to the delayed transmission data of the transmitter from serial to parallel data, the received delay unit for giving the determined time delay to the received data and outputting the second delayed received data, the combination circuit for combining the first delayed received data with the second delayed received data, and the discriminator for discriminating the phase of the combination circuit and outputting the demodulated data.

The automatic frequency control communication system, wherein the transmitter includes a convolutional coder for inputting the transmission data, and convolutionally coding the input transmission data, the transmission delay unit for giving the determined time delay to the convolutionally coded transmission data, and outputting a delayed transmission data, the parallel-to-serial converter for converting the convolutionally coded transmission data and the delayed transmission data convolutionally coded and with the given delay into parallel to serial data, the PSK modulation unit for PSK modulating the parallel-to-serial converted data, the frequency converter for converting the frequency of the PSK modulated data, and the transmission unit for transmitting the frequency converted data, and wherein the receiver may include the oscillator for oscillating the frequency, the mixer for inputting the received signal, and mixing the received signal with the output from the oscillator to convert the received signal into the IF signal, the IF circuit for converting the mixer output into the baseband signal, the AFC circuit for eliminating the frequency offset from the IF circuit, the detector circuit for detecting the output from the AFC circuit, the serial-to-parallel converter for converting the output from the detector circuit into the received data corresponding to the transmission data of the transmitter and the first delayed received data corresponding to the delayed transmission data of the transmitter from serial to parallel data, the received delay units for giving the determined time delay to the received data, and outputting the second delayed received data, the combination circuit for combining the first delayed received data with the second delayed received data, and the maximum likelihood decoder for maximum likelihood decoding the output from the combination circuit.

The automatic frequency control communication system, wherein the AFC circuit may obtain a frequency error without removing a modulation phase in the output from the IF circuit, and eliminate the frequency offset by feeding a frequency error signal back to the IF circuit, and the detector circuit may detect the output from the IF circuit.

The automatic frequency control communication system, wherein the AFC circuit may obtain the frequency error without removing the modulation phase in the output from the IF circuit, and eliminate the frequency offset by feeding the frequency error signal back to the oscillator, and the detector circuit may detect the output from the IF circuit.

The automatic frequency control communication system, wherein the transmitter may include the convolutional coder for inputting the transmission data and convolutionally coding the transmission data, the transmission delay unit for giving the determined time delay to the convolutionally coded transmission data, and outputting the delayed transmission data, the parallel-to-serial converter for converting the convolutionally coded transmission data and the delayed transmission data which is convolutionally coded with the given delay from parallel into serial data, the PSK modulation unit for PSK modulating the parallel to serial converted data, the frequency converter for converting the frequency of the PSK modulated data, and the transmission unit for transmitting the frequency-converted data, and wherein the receiver may include the oscillator for oscillating the radio frequency, the mixer for inputting the received signal, and mixing the input received signal with the output from the oscillator to convert the received signal into the baseband signal, the baseband filter for getting the output from the mixer to be filtered, the AFC circuit for outputting the frequency control signal out of the output from the baseband filter, the detector circuit for detecting the output from the baseband filter, the serial-to-parallel converter for converting the output from the detector circuit into the received data corresponding to the transmission data of the transmitter and the first delayed received data corresponding to the delayed transmission data of the transmitter from serial into parallel data, the received delay unit for giving the received data the determined time delay and outputting the second delayed received data, the combination circuit for combining the first delayed received data with the second delayed received data, and the maximum likelihood decoder for decoding the output from the combination circuit in the maximum likelihood.

The automatic frequency control communication system, wherein the transmitter may be equipped with a spread circuit for spreading the spectrum of the PSK modulated transmission data, and the frequency converter may convert the frequency of the spread transmission data into spectrum by the spread circuit, and wherein the receiver may be equipped with an Inverse spread circuit for inversely spreading the spectrum of the output from the AFC circuit, and the detector circuit detects the output from the inversely spread circuit.

The automatic frequency control communication system, wherein the transmitter may have the spread circuit for spreading the spectrum of the transmission data converted from parallel to serial, and the PSK modulation unit may PSK modulate the transmission data whose spectrum has been spread by the spread circuit, and wherein the receiver may have the inverse spread circuit for spreading spectrum of the output from the detector circuit inversely, and wherein the serial-to-parallel converter may convert the output from the inverse spread circuit from serial to parallel data.

The automatic frequency control communication system, wherein the combination circuit of the receiver may perform an equal gain combination.

The automatic frequency control communication system, wherein the combination circuit of the receiver may perform a maximum ratio combination.

The automatic frequency control communication system, wherein the convolutional coder may input the transmission data, and convolutionally code the input transmission data in order to output the transmission data made up of a plurality of data sequences, the transmission delay unit may give the determined time delay to the transmission data corresponding to the data sequences in order to output the delayed transmission data, and the parallel-to-serial converter may convert the transmission data corresponding to the data sequences and the delayed transmission data from parallel into serial data, and wherein the serial-to-parallel converter may convert the output from the detector circuit into the received data corresponding to the transmission data corresponding to the data sequences and the first delayed received data corresponding to the delayed transmission data corresponding to the data sequences from serial to parallel data, the received delay unit outputs the second delayed received data to which the determined time delay may be given to the received data, the combination circuit may combine the first delayed received data and the second delayed received data, and the maximum likelihood coder may code the output from the combination circuit corresponding to the data sequences in the maximum likelihood in order to output the coded data.

The automatic frequency control communication system, wherein the convolutional coder may input the transmission data, and convolutionally code the input transmission data in order to output convolutionally coded data made up of the plurality of data sequences, the transmission delay unit may give the convolutionally coded data corresponding to each data sequence the first transmission delay time corresponding to the data sequences to output the first transmission data, and may give the convolutionally coded data corresponding to each data sequence the second transmission delay time corresponding to the data sequences to output the second transmission data, and the parallel-to-serial converter may convert the first transmission data and the second transmission data of the data sequences from parallel into serial data, and wherein the serial-to-parallel converter may convert the output from the detector circuit into the first received data corresponding to the first transmission data corresponding to the data sequences and the second received data corresponding to the second transmission data corresponding to the data sequences, the received delay unit may give the first received data corresponding to the data sequences the first receiving delay time corresponding to the data sequences in order to output the first delayed signal, and may give the second received data corresponding to the data sequences the second received delay time corresponding to the data sequences in order to output the second delayed signal, the combination circuit may combine the first delayed signal and the second delayed signal, and the maximum likelihood coder may code the output from the combination circuit corresponding to the data sequences in maximum likelihood in order to output the decoded data, and wherein a sum of the first transmission delay time and the first received delay time may equal each of the data sequence, and the sum of the second transmission delay time and the second received delay time corresponding to the data sequences may equal.

A communication method may comprise steps of inputting a transmission data, generating delayed data giving a determined time delay to the transmission data, multiplexing the delayed data to no delayed data of the transmission data for generating a multiplexed data modulating the multiplexed data using the Phase Shift Keying (PSK) modulation for generating a transmission signal, transmitting the transmission signal, received the transmission signal transmitted by the transmitter as a received signal, detecting the delayed data and the no delayed data included in the received signal, compensating for a phase shift of the received signal based on the delayed data and the no delayed data, and demodulating data of the received signal based on the delayed data and the no delayed data.

BRIEF EXPLANATION OF THE DRAWINGS

The present invention will become more fully understood from the detailed description given hereinbelow and the accompanying drawings which are given by way of illustration only, and thus do not limit the present invention, and wherein:

FIG. 2 illustrates an input/output data of a parallel-to-serial conversion circuit of Embodiment 1;

FIG. 6 shows the input/output data of the parallel-to-serial converter in the AFC circuit of Embodiment 1;

FIG. 7 shows the configuration of a combination circuit of Embodiment 1;

FIG. 13 shows a configuration of a communication system of Embodiment 4;

FIG. 14 shows a configuration of a communication system of Embodiment 5 of the present invention;

FIG. 15 shows a configuration of a communication system of Embodiment 6 of the present invention;

FIG. 16 shows an input/output data of a parallel-to serial converter of Embodiment 6;

FIG. 18 shows the input/output data of the parallel-to serial converter of the AFC circuit according to Embodiment 6;

PREFERRED EMBODIMENTS OF THE INVENTION

Embodiment 1

Figure 1:
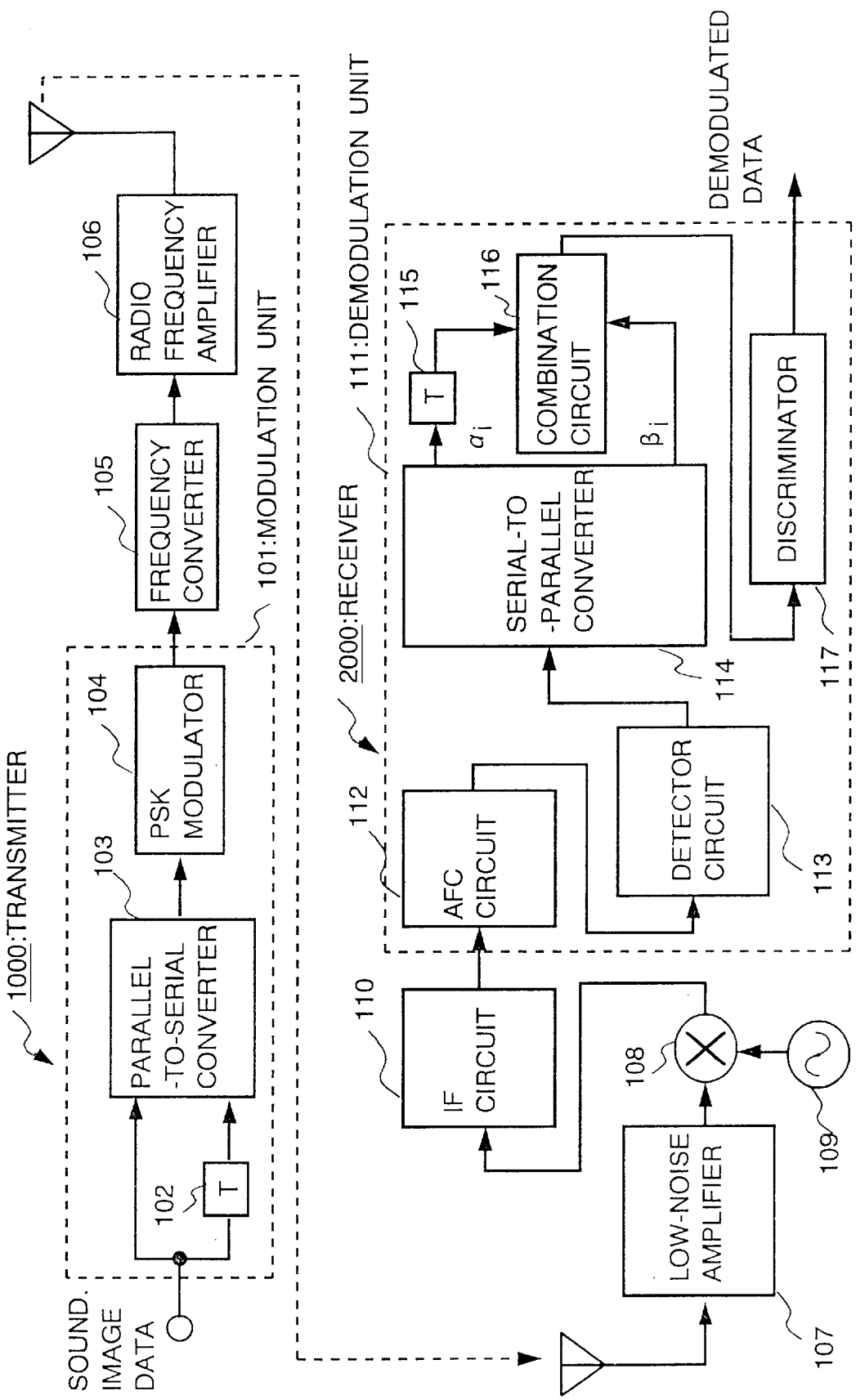
FIG. 1 shows a configuration of a communication system of Embodiment 1 of the present invention.

Embodiment 1 will be set forth below with reference to figures. FIG. 1 shows the configuration of a communication system of Embodiment 1. In FIG. 1, a modulation unit 101 of a transmitter 1000, delay units 102 and 115 having the delay time equivalent to the N-bit data time T, a parallel-to-serial converter 103, a Phase Shift Keying (PSK) modulator 104, a frequency converter 105, a radio-frequency amplifier 106, a low-noise amplifier 107 of receiver 2000, a mixer 108, an oscillator 109, an Intermediate Frequency (IF) circuit 110, a demodulation unit 111 of the receiver, an Automatic Frequency Control (AFC) circuit 112, a detector circuit 113, a serial-to-parallel converter 114, a combination circuit 116 and a determinator 117 are illustrated.

Next, the operation is explained. In FIG. 1, data such as sound, image, etc., is converted into digital signal by a sound coder(not shown), and so on, to make a data sequence to be transmitted. The data sequence to be transmitted is input into modulation unit 101 and branched out to two units, one of which is input directly to parallel-to-serial converter 103. The other is given the delay time T, which is equivalent to the N-bit data time period, at delay unit 102. Parallel-to-serial converter 103 converts (multiplexes) two parallel input data sequences into serial data sequences having double the data rate of the input data sequence.

Figure 2:
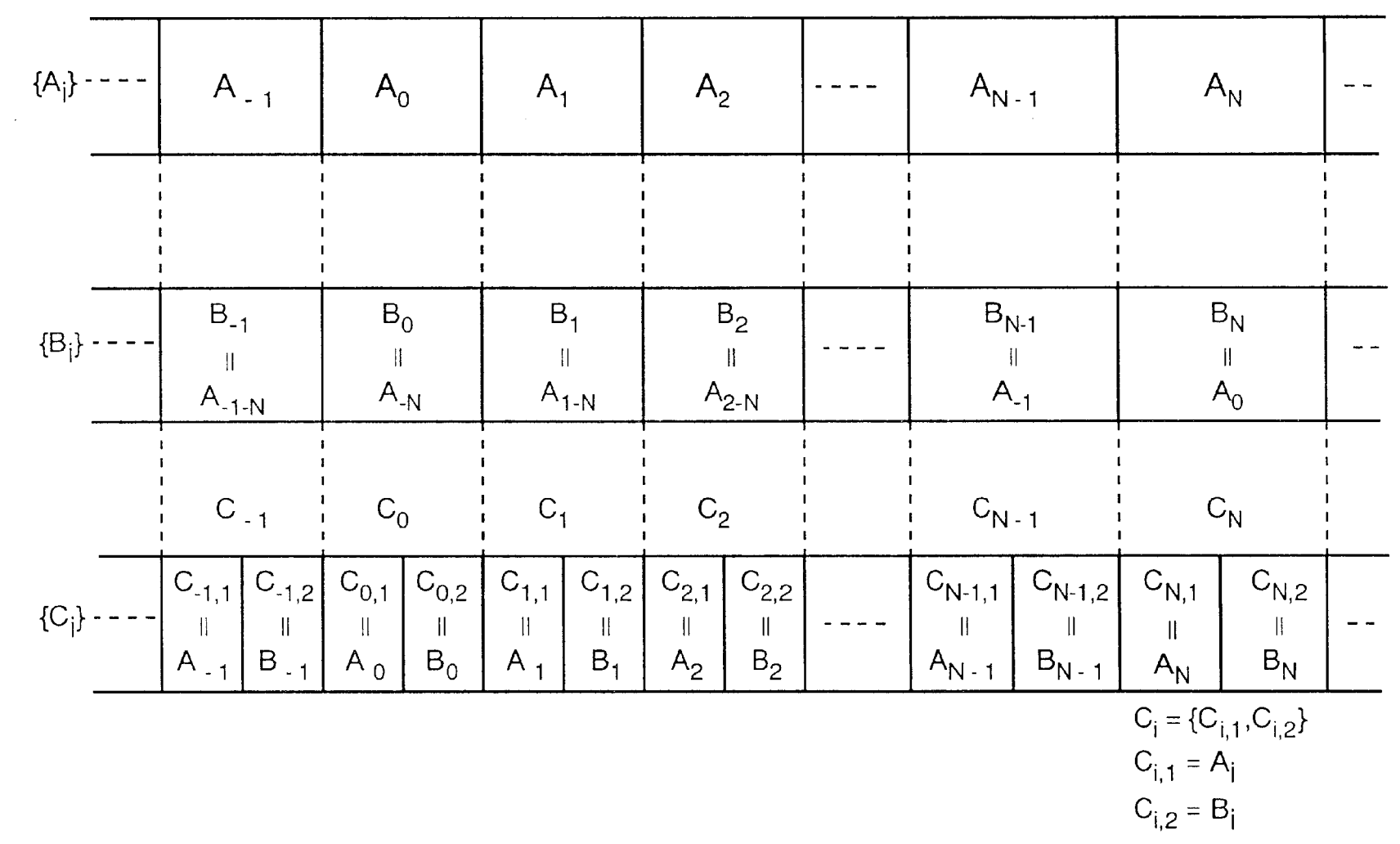

Data conversion at parallel-to-serial converter 103 is explained using a figure. FIG. 2 is a timing chart showing the data sequence $\{A_i\}$ (where i being an integer) to be transmitted, the data sequence $\{B_i\}$ which is given the N-bit delay corresponding to the delay time T to $\{A_i\}$ by the delay unit 102, and $\{C_i\}$ which is the output of parallel-to-serial converter 103. From FIG. 2, the relationship between $\{A_i\}$ and $\{B_i\}$ can be expressed as:

$B_i = A_{i-N}$

The output $\{C_i\}$ from parallel-to-serial converter 103 can be expressed as below by $\{A_i\}$ and $\{B_i\}$:

$C_i\{C_{i,1}, C_{i,2}\} = \{A_i, B_i\} = \{A_i, A_{i-N}\}$

The output from parallel-to-serial converter 103 is PSK modulated by PSK modulator 104, and the PSK modulated signal is converted into a Radio Frequency (RF) by frequency converter 105. A signal converted into a radio frequency is power amplified by radio-frequency amplifier 106 before being transmitted. The transmitted radio signal is received by receiver 2000, and power amplified by low-noise amplifier 107, and then input to mixer 108. Mixer 108 mixes the received signal with the oscillation frequency close to the RF frequency of the received signal output from oscillator 109, and then converts the received signal into intermediate frequency (IF) to produce a received IF signal. In concrete, the difference between the RF frequency of the received signal and the oscillation frequency of oscillator 109 becomes the frequency of the received IF signal.

Assuming the oscillation frequency of oscillator 109 is $f_{RF-OSC}$, and the frequency of the received signal is $f_{RF-SIG}$, then the frequency $f_{IF-SIG}$ of the received IF signal can be expressed by the following expression.

$If_{F-SIG} = |f_{RF-OSC} - f_{RF-SIG}|$

Figure 3:
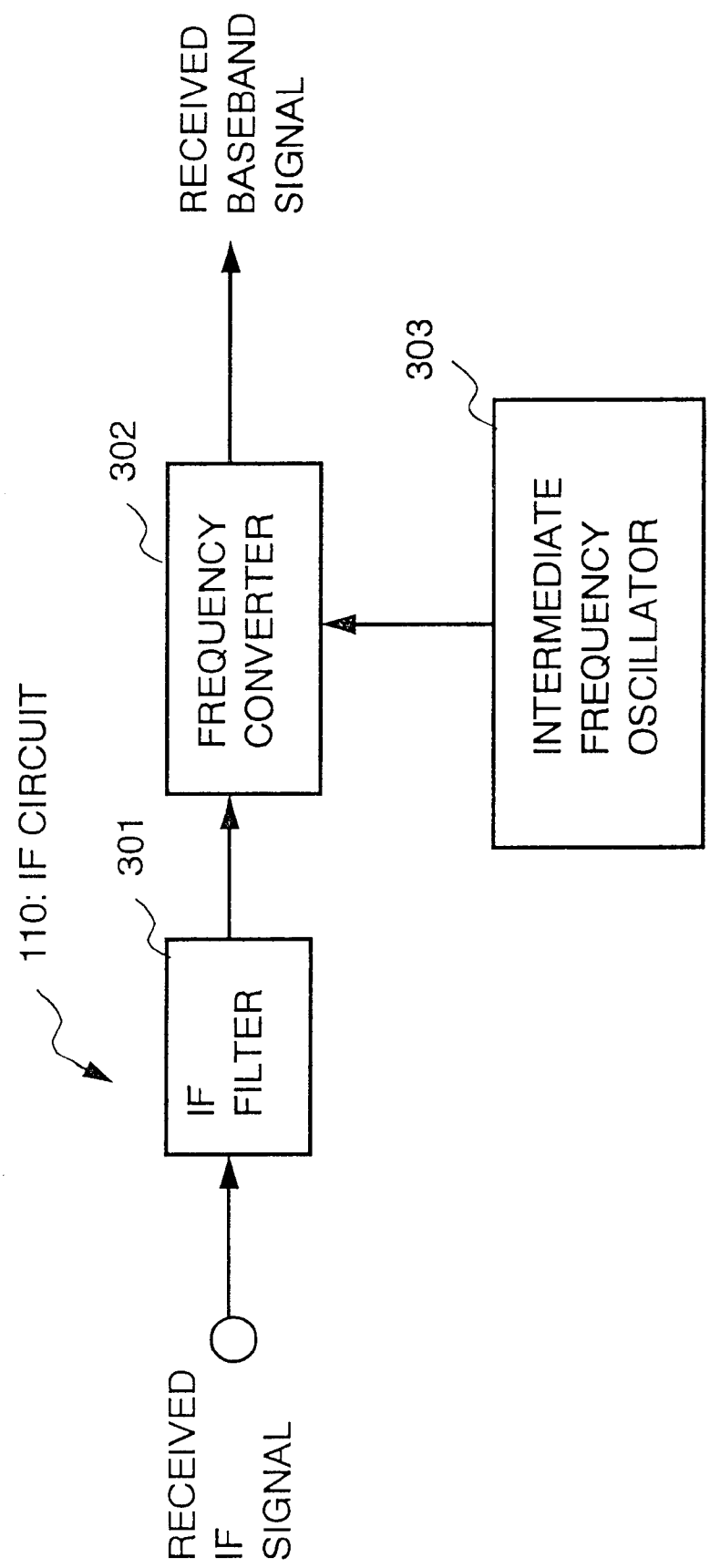
FIG. 3 shows the configuration of an IF circuit of Embodiment 1.

The converted received IF signal is input to IF circuit 110. The operation of IF circuit 110 is explained with a figure. FIG. 3 shows the configuration of IF circuit 110, in which an IF filter 301, a frequency converter 302, and an intermediate frequency oscillator 303 are shown. The received IF signal input into IF circuit 110 is input to IF filter 301. IF filter 301 filters received IF signals off for desired signals. The filtered desired signal is input to frequency converter 302.

Using the intermediate frequency roughly equivalent to the received IF signals output from intermediate frequency oscillator 303, frequency converter 302 converts the received IF signals into received baseband signals. That is, when the oscillation frequency of intermediate frequency oscillator 303 is assumed $f_{IF-OSC}$, then the frequency of the received baseband signal $f_{BB-SIG}$ can be expressed by the following expression.

$f_{BB-SIG} = |f_{IF-OSC} - f_{IF-SIG}|$

The converted received baseband signals are input to modulation unit 111 as the output from IF circuit 110.

Normally, it is desirable that the frequency of the received baseband signal $f_{BB-SIG}$ be 0. In a normal communication system, because the oscillation frequencies of the oscillators used for the transmitter and the receiver do not necessarily equal due to temperature change, and other factors, offset (frequency offset) is included in the frequency of the received signal. Also, frequency offset is caused by the Doppler shift of the mobile unit in mobile communications or of the satellite in the satellite communications. That is, $f_{BB-SIG}$ is not 0. $f_{BB-SIG}$ at this time is assumed to be frequency offset $\Delta f$. When the received signal has frequency offset $\Delta f$, the phase of the received signal shifts. In concrete, the received baseband signal input into demodulation unit 111 rotates on the baseband signal diagram at the speed based on $\Delta f$.

When a coherent detection system is used as the detection scheme, to make the recovered carrier phase follow such a phase shift, the bandwidth of the carrier filter must be made wider. When the bandwidth of the carrier filter is widened, however, bit error because of noise increases. On the other hand, when the differential detection system is used, when frequency offset becomes larger, error increases because the phase shifting degree between symbols increases. Therefore, frequency offset must be compensated for before detecting the received baseband signal. A circuit for compensating for the frequency offset in the received signal is Automatic Frequency Control (AFC) circuit 112. AFC circuit 112 controls the frequency offset of the received signal to be always 0.

Figure 4:
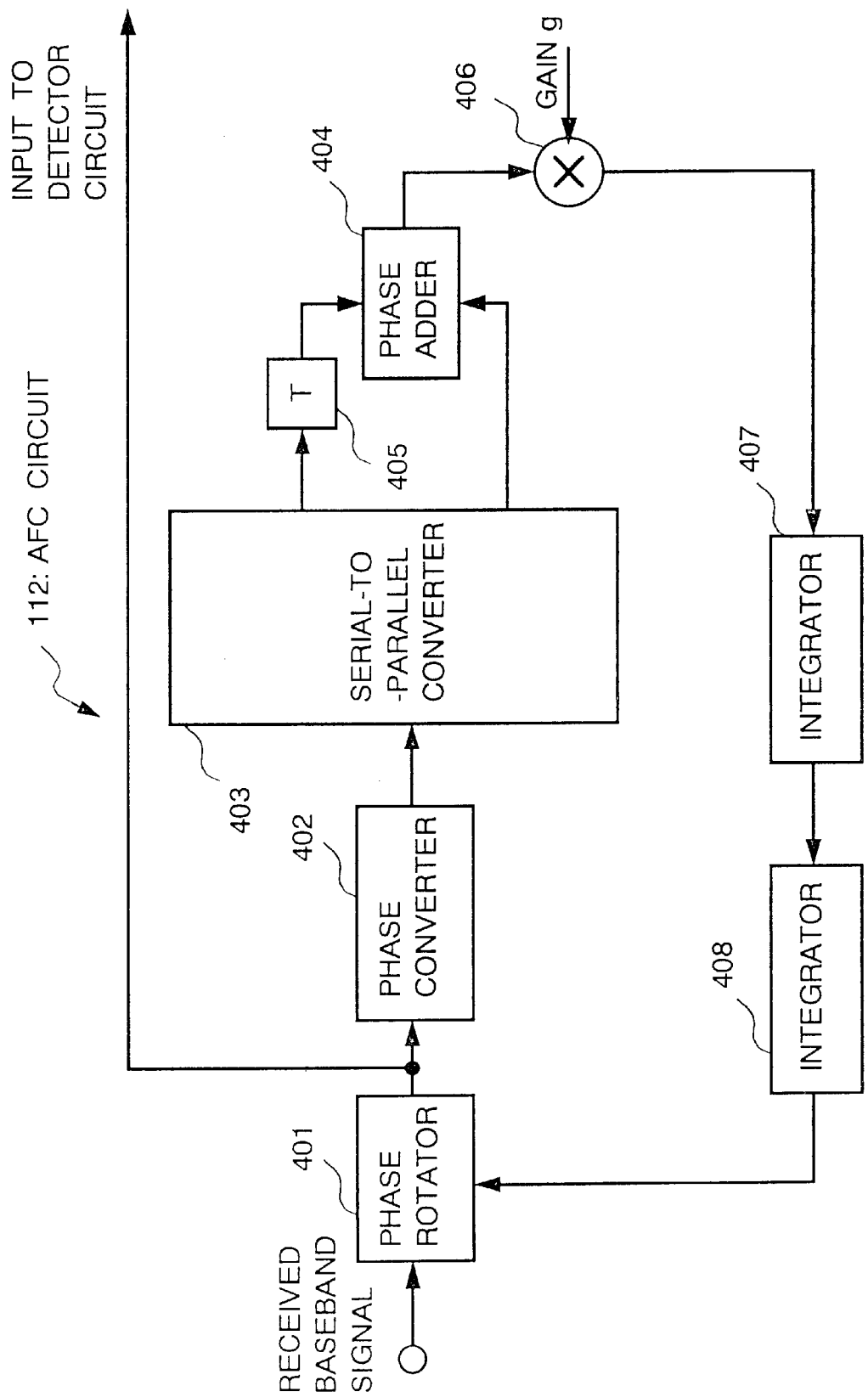
FIG. 4 illustrates the configuration of an AFC circuit of Embodiment 1.

The received baseband signal input into demodulation unit 111 is input into AFC circuit 112 and the frequency offset is compensated. The operation of AFC circuit 112 is explained using a figure. FIG. 4 shows a configuration example of AFC circuit 112. In FIG. 4, a phase rotator 401, a phase converter 402, a serial-to-parallel converter 403, a phase adder 404, a delay unit 405, a multiplier 406, and integrators 407 and 408 are illustrated.

The received baseband signal input into AFC circuit 112 has frequency offset $\Delta f$, and the received phase rotates at the speed based on $\Delta f$ in the range from 0 to $2\pi$. Let us assume here the frequency of the received IF signal is higher than the oscillation frequency of intermediate frequency oscillator 303 of IF circuit 110, and the phase of the received baseband signal rotates counterclockwise. Then, If the frequency offset is denoted by $\Delta f$ (Hz), and the baud rate by R (baud), then the phase shifting degree $\theta$(rad) per one symbol can be expressed as follows:

$\theta = \Delta f / R \text{(rad)}$

When input to AFC circuit 112, the received baseband signal is input into phase rotator 401, where the signal is rotated clockwise by $\theta s$, which is output from integrator 408, symbol by symbol. Here, $\theta s$ denotes an estimated degree of phase rotation per symbol. If phase shifting degree $\theta$ equals the estimated degree of phase rotation $\theta s$, then the received phase rotated counterclockwise by $\theta$ due to the frequency offset can be compensated by rotating the phase clockwise by $\theta s$. The output from phase rotator 401 is output to detector circuit 113 as the output from AFC circuit 112, and input into phase converter 402. Phase converter 402 outputs the phase of the received baseband signal which is the output from phase rotator 401.

Figure 5:
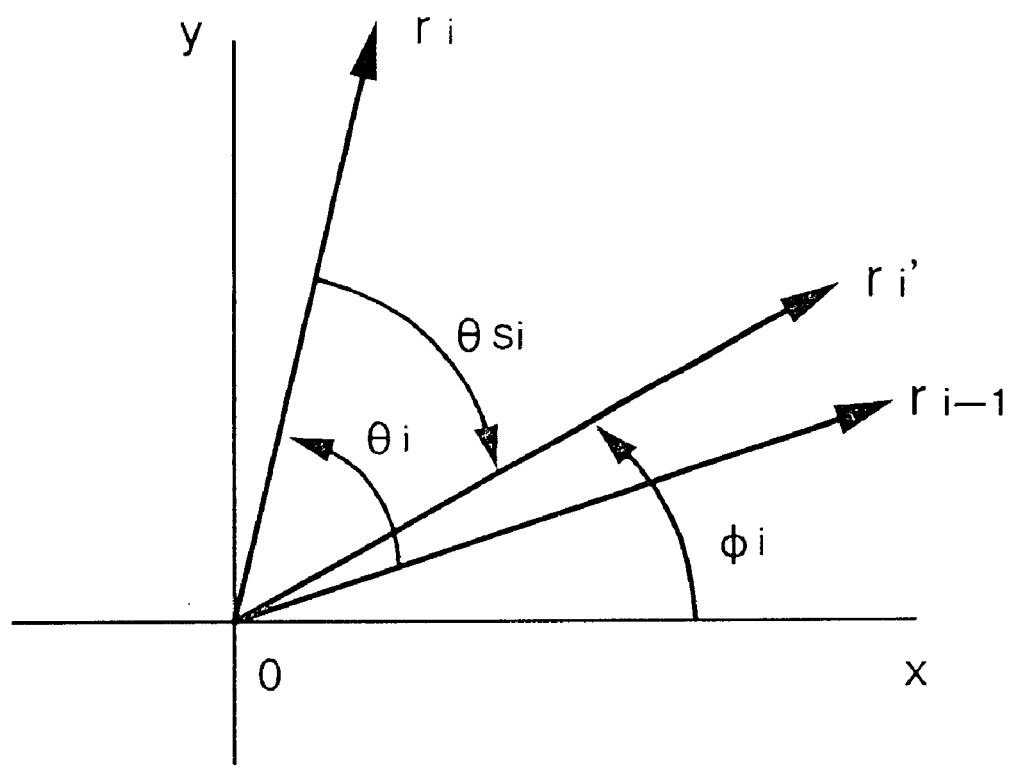
FIG. 5 is a baseband signal diagram showing the phase compensation by the AFC circuit of Embodiment 1.

This is explained using a figure. FIG. 5 is a baseband signal diagram to explain the operation of phase rotator 401 and phase converter 402 when $\theta \neq \theta s$. In FIG. 5, the received baseband signal $r_i$ rotates by $\theta_i$ compared to the received signal $r_{i-1}$ of the immediately previous symbol due to the frequency offset. By rotating this reversely by the estimated degree of phase rotation $\theta_{si}$ by phase rotator 401, the phase shift due to the frequency offset is compensated.

Phase converter 402 outputs the phase $\theta_i$ of the received signal $r_i'$, which has been compensated for the phase shift due to the frequency offset, to serial-to-parallel converter 403 as the phase data sequence. Serial-to-parallel converter 403 converts the input phase data sequence into two parallel phase data sequences with halved data rate.

Data conversion by serial-to-parallel converter 403 is explained using a figure. FIG. 6 is a timing chart showing the phase data sequence $\{\phi c_i\}$ output from phase converter 402, the phase data sequence $\{\phi a_i\}$ corresponding to the data sequence $\{a_i\}$ to which no delay has been given by the transmitting side, and the phase data sequence $\{\phi b_i\}$ corresponding to the data sequence $\{b_i\}$ to which the delay time T equivalent to the N-bit data time period is given by delay unit 102 at the transmitting side. The phase data sequence $\{\phi a_i\}$ and the phase data sequence $\{\phi b_i\}$ are the output from serial-to-parallel converter 403. As shown in FIG. 6, the relationship between $\{\phi c_i\}$, $\{\phi a_i\}$, and $\{\phi b_i\}$ can be expressed as below.

$$\phi c_i = \{\phi c_{i,1}, \phi c_{1,2}\} = \{\phi a_i, \phi b_i\}$$

Without taking noise into account for simplification, because $\{b_i\}$ is given the delay T to $\{a_i\}$ at transmission, the relationship between $\{a_i\}$ and $\{b_i\}$ can be expressed as below using the number of bits N per time T.

$$b_i = a_{i-N}$$

Therefore, the relationship between the phase data sequences $\{\phi a_i\}$ and $\{b_i\}$ corresponding to $\{a_i\}$ and $\{b_i\}$ can be expressed as below.

$$\phi b_i = \phi a_{i-N}$$

Based on this, $\{\phi c_i\}$ can be expressed as below using $\{\phi a_i\}$, $$\phi c_i = \{\phi a_i, \phi a_{i-N}\}$$

Of the outputs from serial-to-parallel converter 403, data sequences given the delay equivalent to the N-bit data time period T by the transmitting side are directly input to phase adder 404. Meanwhile, data sequences given no delay equivalent to the N-bit data time period T at the transmitting side are input to delay unit 405, and where the N-bit data time period T is given, and then input to phase adder 404.

The phase data sequence $\{\phi a_i\}$ is given the delay time T equivalent to the N-bit time period by delay unit 405.

The delay time for the input to phase adder circuit 404, namely, $\{\phi a_{i-N}\}$ and $\{\phi b_i\}$ therefore becomes T for both including the delay time given by the transmitting side, and $\{\phi a_{i-N}\}$ and $\{\phi b_i\}$ can be expressed as below.

$$\{\phi a_{i-N}\} = \{\ldots \phi a_{1-N}, \phi a_{2-N}, \ldots \phi a_1, \phi a_2, \phi a_3, \ldots\}$$

$$\{\phi b_i\} = \{\ldots \phi b_1, \phi b_2, \ldots \phi b_{N+1}, \phi b_{N+2}, \phi b_{N+3}, \ldots\}$$

$$= \{\ldots \phi a_{1-N}, \phi a_{2-N}, \ldots \phi a_1, \phi a_2, \phi a_3, \ldots\}$$

That is, because $\{\phi a_{i-N}\}$ and $\{\phi b_i\}$ become the same phase data sequences, the modulation phases of data corresponding to both sequences are equal. Phase adder 404 subtracts the delay unit output $\{\phi a_{i-N}\}$ from the output $\{\phi b_i\}$ from serial-to-parallel converter 403, and outputs phase error $\delta f_i$. $\delta f_i$ can be expressed as below.

$$\delta f_i = \{\phi b_i\} - \{\phi a_{i-N}\}$$

In the above expression, both $\{\phi a_{i-N}\}$ and $\{\phi b_i\}$ are the received phases expressed from 0 to $2\pi$. The phase error $\delta f_i$ is the variation amount of the frequency offset occurred during the time T corresponding to the N-bit time period. What the above expression means is, to obtain the frequency offset $\delta f_i$, only phase difference needs to be calculated. In the conventional example, a pilot signal whose modulation phase is already known to the receiver is needed to be inserted in the transmission signal. Or, in order for the receiver to obtain the frequency error by removing the modulation phase, the compensable range of the frequency offset became narrow. With this system, because identical data exist in a certain interval, if the received data is separated into data sequences which are data sequences before being multiplexed by the transmitting side, by utilizing the characteristics of time diversity that the modulation phases for both data corresponding to both data sequences are same, the frequency error can be obtained without removing the modulation phase and by maintaining the compensable frequency range to the symbol rate.

The present invention is based on the application of the time diversity scheme, and the two signals used for obtaining the frequency offset have the same modulation phase. Therefore, both data to be used for phase comparison are either 0 or 1, thus there is no need for the receiver to determine the modulation phase.

The phase error $\delta f_i$ which is the output from phase adder 404 is input to multiplier 406 and gain g is multiplied. Therefore, the output from multiplier 406, e.g., the input to integrator 407 becomes $g \delta f_i$. Gain g is a value concerning the pull-in speed of the frequency offset. Although the larger g becomes, the faster the pull-in speed becomes, the influence from noise, etc., will grow at normal time. When g becomes smaller, although the AFC operation can be stabilized at normal time, the pull-in speed slows down. Normally, the value g is arbitrarily determined based on the trade-off between the pull-in speed and the stability at normal time, or interchanged between the pull-in time and normal time.

Integrator 407 integrates the output from multiplier 406. The phase error $g \delta f_i$ is a quantity proportional to the error of phase shifting degree per symbol, and the output from integrator 407 is an estimated value of the phase shifting degree per symbol.

The output of integrator 407, or the estimated value of the phase shifting degree per symbol is input into integrator 408. Integrator 408 integrates the phase shifting degree per symbol, and outputs the phase amount for rotating the received signal, namely, the estimated phase rotating amount $\theta s$.

The estimated phase rotation amount $\theta s$ output from integrator 408 is input into phase rotator 401, and rotates the received baseband signal in the direction counter to the direction rotated by the frequency offset. Namely, by rotating the received signal in clockwise when the received signal is rotating counterclockwise, and conversely, in counterclockwise when the received signal is rotating in clockwise, the phase shift caused by frequency offset can be compensated.

The received baseband signal output from AFC circuit 112 with compensated frequency offset is input into detector circuit 113. Detector circuit 113 detects the received baseband signal.

The output from detector circuit 113 is input into serial-to-parallel converter 114 and then converted into two data sequences $\{\alpha_i\}$ and $\{\beta_i\}$. Because $\{\beta_i\}$ is given the delay T equivalent to the N-bit time period at transmission to $\{\alpha_i\}$, by giving the delay T equivalent to the N-bit time period to $\{\alpha_i\}$ by delay unit 115, the delay amount for both sequences can be made equal. Combination circuit 116 combines $\{\alpha_{i-N}\}$ and $\{\beta_i\}$ whose delay amount is made equal.

The operation of combination circuit 116 is explained using a figure. FIG. 7 is a configuration diagram of combination circuit 116 for performing equal gain combination. In FIG. 7, a vector adder 701 is shown. Namely, the equal gain combination can be realized by vector adder 701. $\{\alpha_{i-N}\}$ and $\{\beta_i\}$ input into combination circuit 116 are input into vector adder 701 and added by equal gain and then output from combination circuit 116.

The output from combination circuit 116 is input into determinator 117, whereby a transmission symbol is determined. Determinator 117 outputs the determined value, and the determined value is decoded as the demodulator output by a sound decoder, and so on, and then output as sound data, image data, etc.

In the above operation, by utilizing the characteristics of time diversity technique, which performs combined reception by sending an identical data at differentiated timing and equalizing the delay amount at the receiving side, the frequency offset can be obtained without eliminating the modulation phase of the received signal, and a communication system provided with a stable AFC circuit even under low CN ratio can be achieved. In addition, unlike the conventional examples, because a memory for memorizing known phase information is not required for the receiver, circuitry can be simplified and power consumption can be reduced.

Embodiment 2

Although combination circuit 116 of Embodiment 1 is configured to perform equal gain combination, this embodiment describes the maximum ratio combination.

Figure 8:
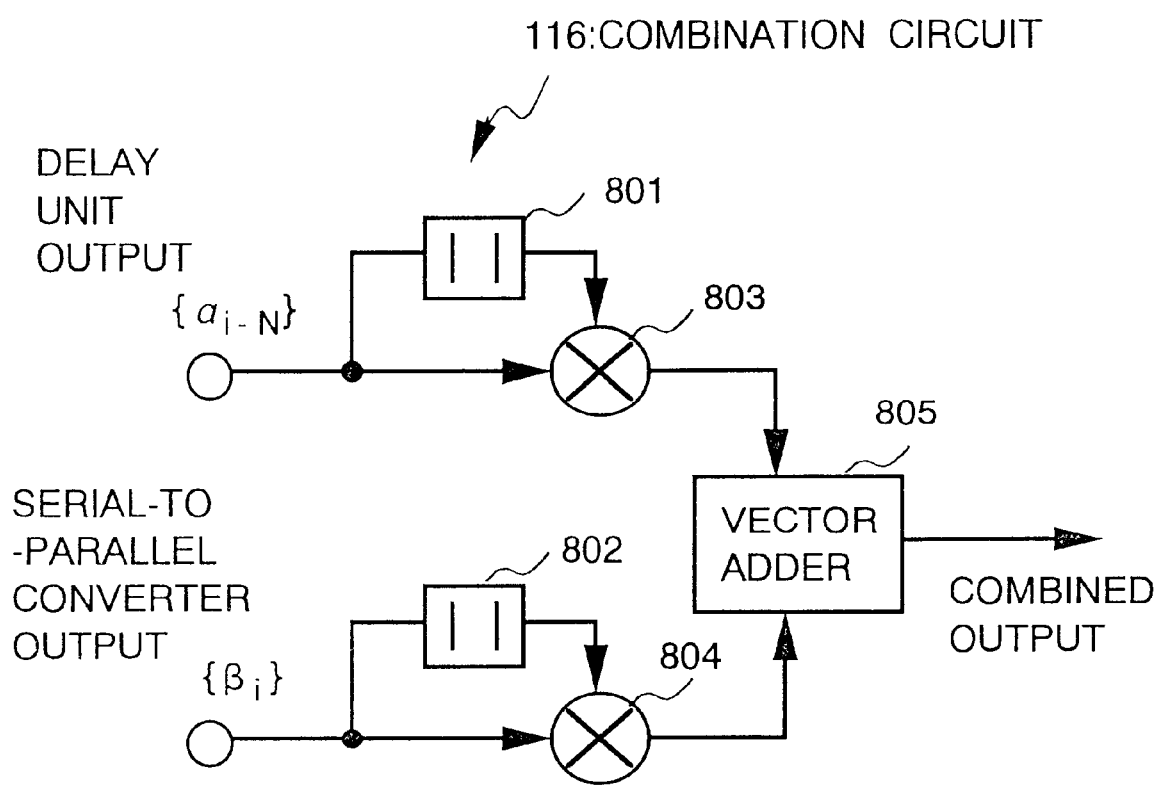
FIG. 8 shows a configuration of a combination circuit of Embodiment 2 of the present invention.

FIG. 8 shows a configuration example of combination circuit 116 for maximum ratio combination. In FIG. 8, absolute value detectors 801 and 802, multipliers 803 and 804, and a vector adder 805 are shown. $\{\alpha_{i-N}\}$ and $\{\beta_i\}$ input into combination circuit 116 are input into absolute value detectors 801 and 802, respectively, so as to detect the absolute values $|\alpha_{i-N}|$, $|\beta_i|$. The detected $|\alpha_{i-N}|$ and $|\beta_i|$ are multiplied by $\{\alpha_{i-N}\}$ and $\{\beta_i\}$ by multipliers 803 and 804, respectively, to be weighted in accordance with the SN ratio, and input into vector adder 805 to be added.

Figure 9:
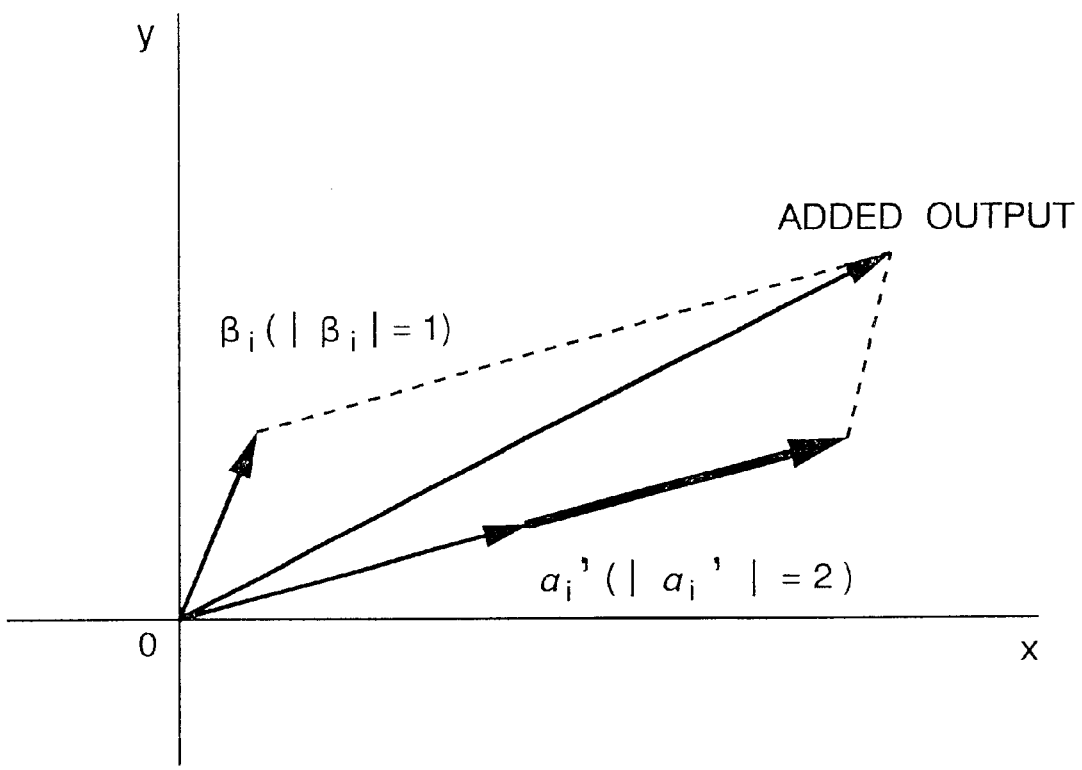
FIG. 9 illustrates the operation of the combination circuit according to Embodiment 2.

FIG. 9 is a baseband signal diagram for explaining the maximum ratio combination. In FIG. 9, if $|\alpha_{1-N}|$ equals 2, and $|\beta_i|$ is 1, then the input to vector adder 805 is single for $\{\beta_i\}$ and double for $\{\alpha_{i-N}\}$ as shown with the thick line. Namely, the signal with large amplitude is weighted while the signal with small amplitude is reduced in its weight before being added by vector adder 805 to obtain adder output.

By making combination circuit 110 as the maximum ratio combination, the diversity effect larger than the equal gain combination can be achieved.

Embodiment 3

In the foregoing Embodiment 1, although phase rotator 401 is incorporated inside AFC circuit 112 to rotate the phase of the received baseband signal, this embodiment is configured in a manner that the signal for controlling the frequency, namely the frequency control signal, is fed from AFC circuit 112 back to intermediate frequency oscillator 303 of IF circuit 110, so that phase rotator 401 and integrator 408 of AFC circuit 112 are omitted.

Figure 10:
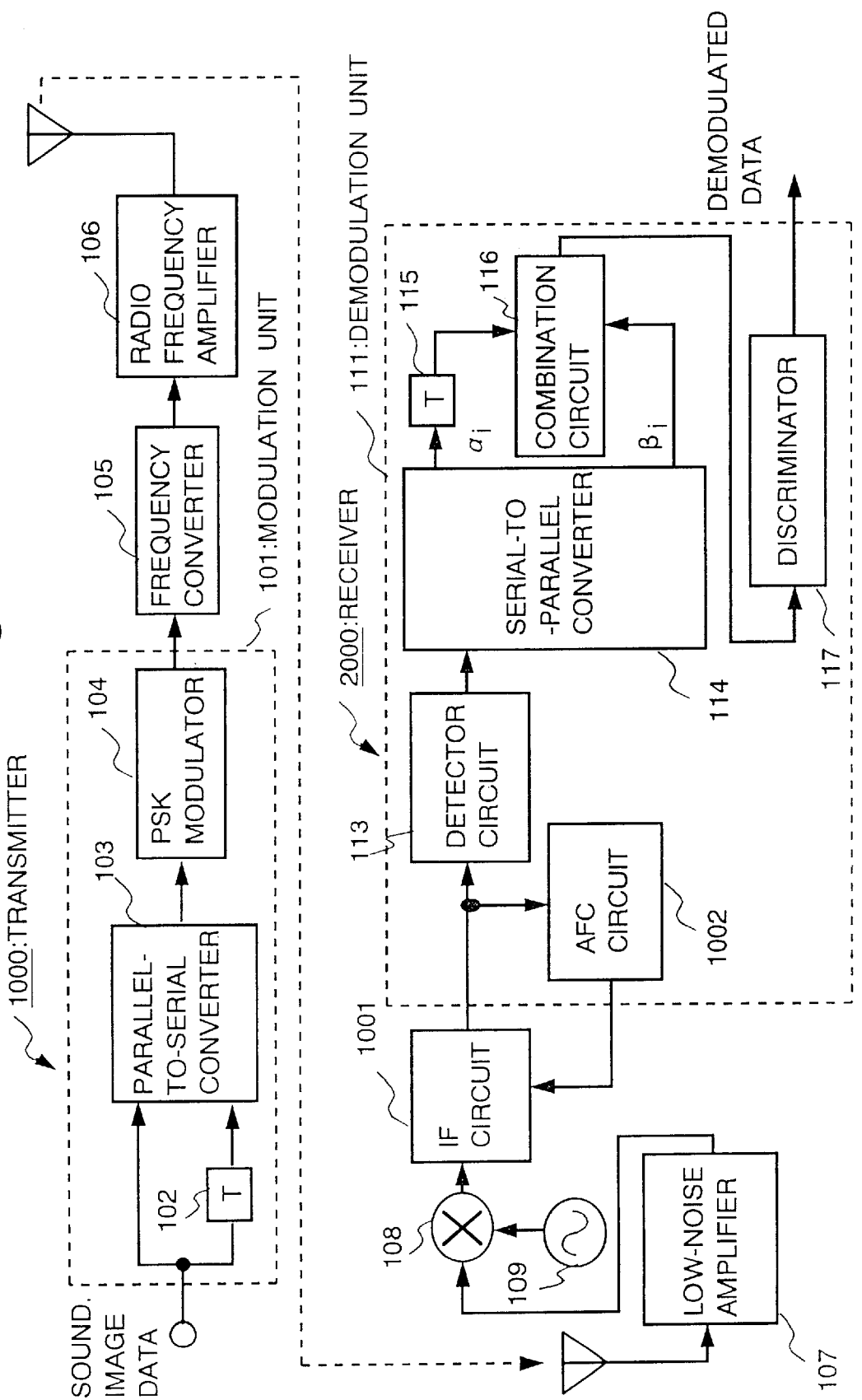
FIG. 10 shows a configuration of a communication system of Embodiment 3 of the present invention.

The configuration of a communication system of Embodiment 3 is shown in FIG. 10. In FIG. 10, parts the same as FIG. 1 are given the same numbers and their explanation is omitted. In FIG. 10, the received signal received by the receiver is amplified by low-noise amplifier 107, and input into mixer 108. Mixer 108 mixes the received signal with the oscillation frequency close to the received RF frequency output from oscillator 109, and converts the received signal into the intermediate frequency (IF). The converted received IF signal is input into IF circuit 1001 and then converted into the baseband signal. To IF circuit 1001, the frequency control signal output from the AFC circuit 1002 is also input.

Figure 11:
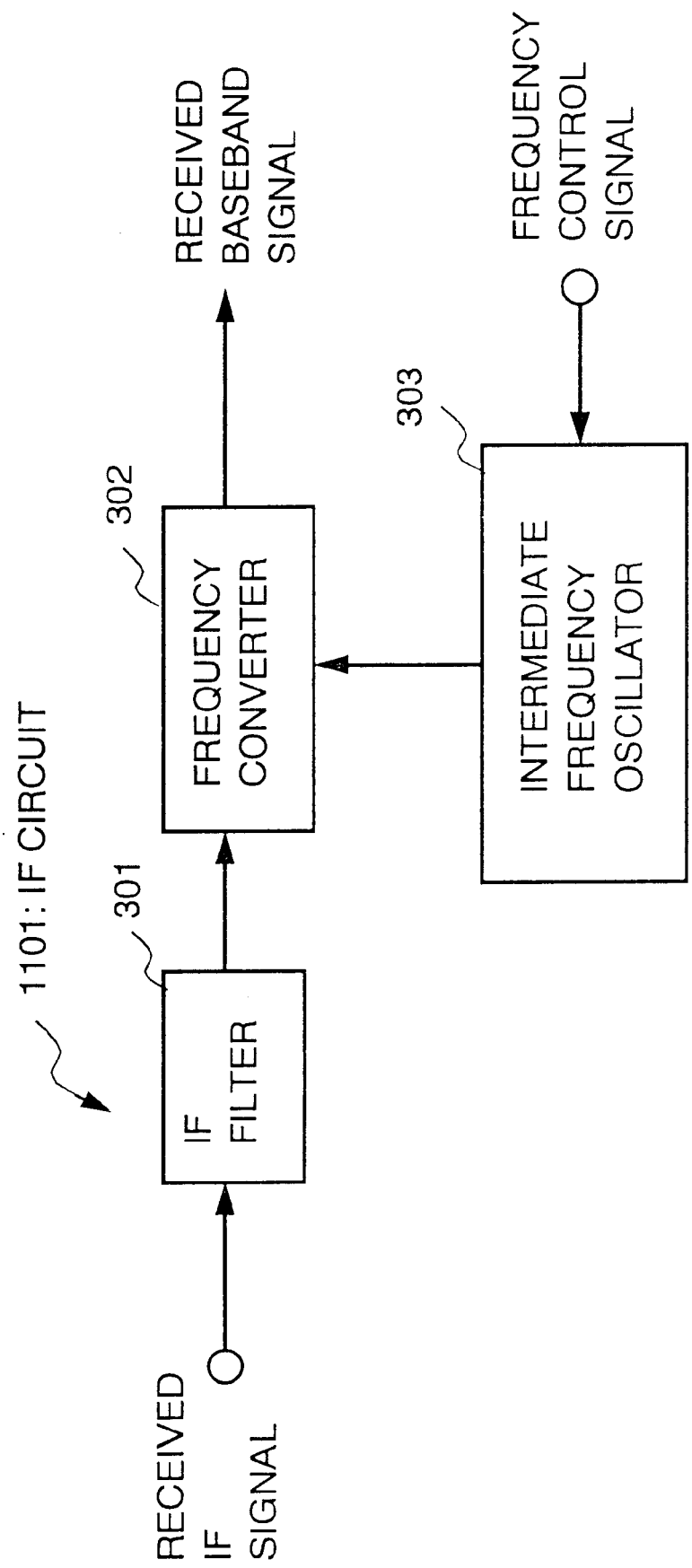
FIG. 11 show the configuration of an IF circuit according to Embodiment 3.

The operation of IF circuit 1001 is explained using a figure. FIG. 11 is a configuration diagram showing the configuration of IF circuit 1001, wherein an IF filter 301, a frequency converter 302, and an intermediate frequency oscillator 1101 are shown. The received IF signal input into IF circuit 1001 is input into IF filter 302 in order to have desired signals filtered, and then input into frequency converter 302.

Frequency converter 302 converts the received IF signal into received baseband signal using the intermediate frequency output from intermediate frequency oscillator 1101. At this time, a frequency control signal output from AFC circuit 1002 is input into intermediate frequency oscillator 1101. The intermediate frequency, which is an output from intermediate frequency oscillator 1101, is controlled its oscillation frequency by the frequency control signal so that the frequency offset from the received IF signal will become zero.

That is, if the intermediate frequency which is the output from intermediate frequency oscillator 1101 is assumed to be $f_{IF-OSC}$, and the frequency of the received IF signal to be $f_{IF-SIG}$, and if $f_{IF-OSC}$ is larger than $f_{IF-SIG}$, then the frequency control signal is input from AFC circuit 1002 to lower $f_{IF-OSC}$.

On the other hand, if $f_{IF-OSC}$ is smaller than $f_{IF-SIG}$, then the frequency control signal is input from AFC circuit 1002 to raise $f_{IF-OSC}$.

The received baseband signal which is the output from frequency converter 302 is input to demodulation unit 111 as the output of IF circuit 1001. The received baseband signal input to demodulation unit 111 is input to detector circuit 113 to be detected and input to AFC circuit 1002 as well. AFC circuit 1002 detects the frequency offset of the received baseband signal, and outputs the frequency control signal to IF circuit 1001.

Figure 12:
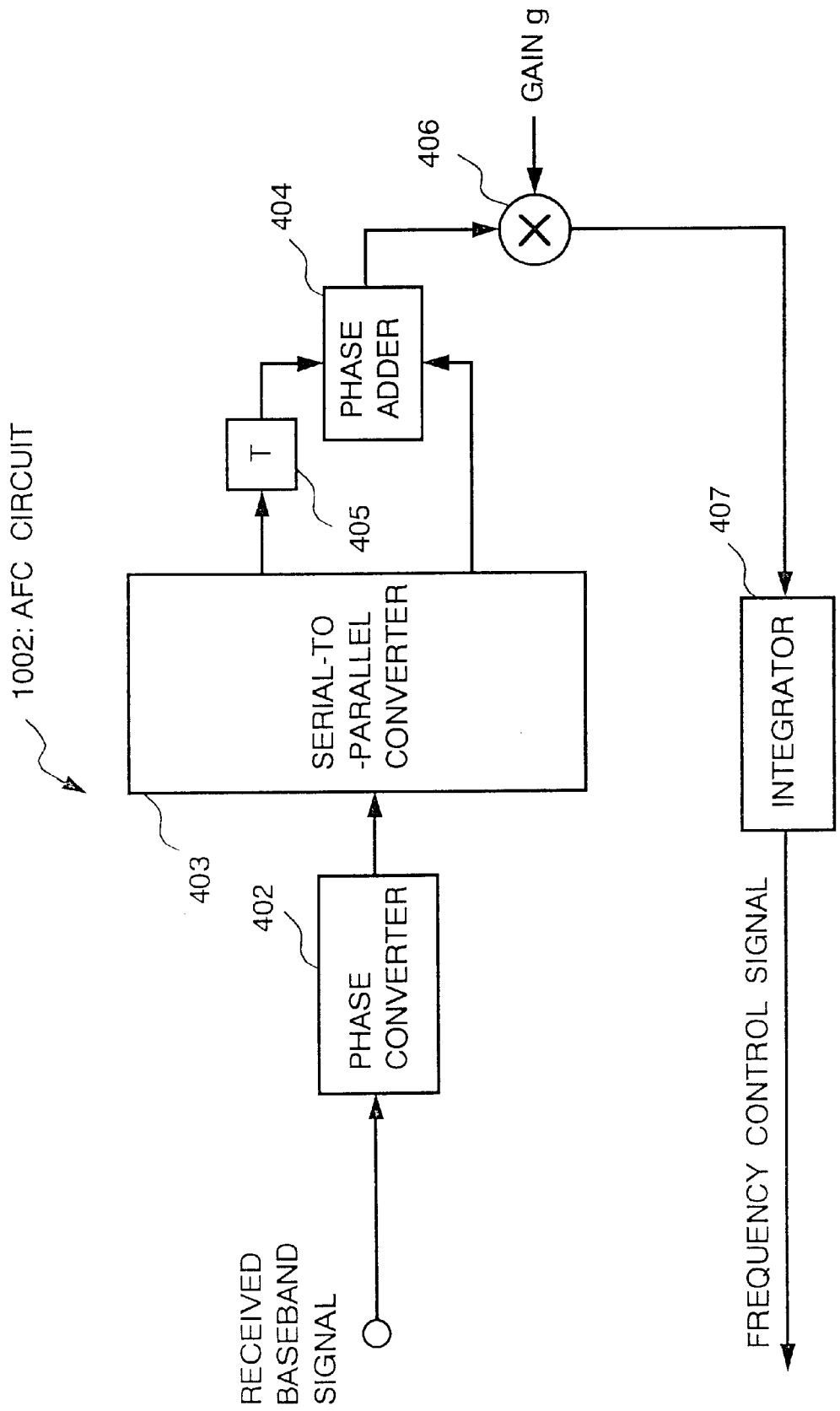
FIG. 12 shows the configuration of an AFC circuit of Embodiment 3.

FIG. 12 shows a configuration example of AFC circuit 1002. FIG. 12 is a configuration based on FIG. 4 whereof phase rotator 401 and integrator 408 are omitted. Although Embodiment 1 is configured to include phase rotator 401 in order to compensate for frequency offset, this Embodiment 3 omits phase rotator 401 because the frequency offset is compensated for by IF circuit 1001. Moreover, because output from integrator 407 is an estimated frequency offset, the estimated frequency offset is output as the frequency control signal to IF circuit 1001, and thus integrator 408 can be omitted.

As described above, the frequency control signal, which is the output from AFC circuit 1002, is fed back to intermediate frequency oscillator 1101 of IF circuit 1001, and the frequency offset is compensated for by IF circuit 1001. Therefore the phase rotator and integrator can be omitted for AFC circuit 1002, and the frequency offset can be obtained without removing the modulation phase of the received signal, and a communication system provided with a stable AFC circuit even under low CN ratio can be realized with less circuit configuration.

Embodiment 4

The previous Embodiment 3 is configured in a manner that the frequency control signal output from AFC circuit 1002 is fed back to intermediate frequency oscillator 1101 of IF circuit 1001. This Embodiment is configured in a manner that a frequency control signal output from AFC circuit 1002 is fed back to oscillator 109.

The configuration of a communication system of Embodiment 4 is shown in FIG. 13. In FIG. 13, the parts the same as those of FIG. 1 are given the same numbers and their explanation is omitted. Also, the parts the same as those of FIG. 10 are given the same numbers and their explanation is omitted. In FIG. 13, a received signal received by the receiver is amplified by low-noise amplifier 107, and input into mixer 108. Mixer 108 mixes the received signal with the oscillation frequency close to the received RF frequency output from oscillator 1301, and converts the received signal into the intermediate frequency.

In this Embodiment, the frequency control signal output from AFC circuit 1002 is input to oscillator 1301. Oscillation frequency close to the received RF frequency which is the output from oscillator 1301 is controlled by the frequency control signal, and the frequency difference from the received RF frequency is controlled to become equivalent to the oscillation frequency for intermediate frequency oscillator 303 of IF circuit 110.

That is, if the oscillation frequency, the output from oscillator 1301, is assumed to be $f_{RF-OSC}$, the frequency of the received RF signal to be $f_{RF-SIG}$, and the oscillation frequency of intermediate frequency oscillator 303 of IF circuit 110 to be $f_{IF-OSC}$, and, if $f_{R-OSC}$ is larger than $f_{RF-SIG}$, and if $f_{RF-OSC}-f_{RF-SIG}$ is larger than $f_{IF-OSC}$, a signal to lower $f_{RF-OSC}$ is input from AFC circuit 1002.

Conversely, if $f_{RF-OSC}-f_{RF-SIG}$ is smaller than $f_{IF-OSC}$, then a signal to raise $f_{RF-OSC}$ is input from AFC circuit 1002.

Also, if $f_{RF-OSC}$ is smaller than $f_{RF-SIG}$, and $f_{RF-SIG}-F_{RF-OSC}$ is larger than $f_{IF-OSC}$, then a signal to raise $f_{RF-OSC}$ is input from AFC circuit 1002.

Conversely, if $f_{RF-SIG}-f_{RF-OSC}$ is smaller than $f_{IF-OSC}$, then, a signal to lower $f_{RF-OSC}$ is input from AFC circuit 1001.

The received IF signal output from mixer 108 is input into IF circuit 110 and then converted into a baseband signal. The converted baseband signal is input to demodulation unit 111. The received baseband signal input to demodulation unit 111 is input to detector circuit 113 and to AFC circuit as well. AFC circuit 1002 detects the frequency offset of the received baseband signal and outputs a frequency control signal to oscillator 1301.

The frequency control signal output from AFC circuit 1002 is fed back to oscillator 1301, and the frequency offset is compensated for by controlling the oscillation frequency of oscillator 1301. Such configuration enables the omission of a phase rotator and an integrator from AFC circuit 1002, and the frequency offset can be obtained without removing the modulation phase of the received signal, and a communication system provided with a stable AFC circuit even under low-CN ratio can be realized with less circuit configuration.

Embodiment 5

The previous Embodiment 4 has a configuration in which the oscillation frequency of the RF oscillator is controlled and converted into a frequency having an equivalent oscillation frequency of the oscillator for the intermediate frequency by the mixer. However, this Embodiment sets forth the direct converter in which the oscillation frequency of the RF oscillator is controlled to be matched with the frequency of the received RF signal.

The configuration of a communication system for Embodiment 5 is shown in FIG. 14. In FIG. 14, parts the same as those with FIG. 1, FIG. 10, and FIG. 13 are given the same numbers and their explanation is omitted. In FIG. 14, a received signal received by the receiver is amplified by low-noise amplifier 107, and then input into mixer 108. Mixer 108 mixes the received signal with an oscillation frequency equivalent to a received RF frequency output from oscillator 1301, and converts the received RF signal into a baseband signal.

In this Embodiment, similarly to Embodiment 4, the frequency control signal output from AFC circuit 1002 is input to oscillator 1301. Oscillator 1301 controls the oscillation frequency to become the same as the frequency of the received RF signal.

That is, when the oscillation frequency $f_{RF-OSC}$ output from oscillator 1301 is lower than the frequency $f_{RF-SIG}$ of the received RF signal, AFC circuit 1002 inputs the frequency control signal to raise $f_{RF-OSC}$. On the other hand, when $f_{RF-OSC}$ is higher than $f_{RF-SIG}$, AFC circuit 1002 inputs the frequency control signal to lower $f_{RF-OSC}$.

The received baseband signal output from mixer 108 is input to demodulation unit 111. The received baseband signal input to demodulation unit 111 is filtered by a baseband filter 1401 to pick up a desired signal, and then input to detector circuit 113 and to AFC circuit 1002 as well. AFC circuit 1002 detects the frequency offset of the received baseband signal and outputs the frequency control signal to oscillator 1301.

The frequency control signal, an output from AFC circuit 1002, is fed back to oscillator 1301 to control the oscillation frequency of oscillator 1301. Such a configuration allows the phase rotator and integrator to be omitted from AFC circuit 1002, and the frequency offset to be obtained without removing the modulation phase of the received signal, and thereby a communication system provided with a stable AFC circuit even under low CN ratio can be realized. The application of the direct conversion scheme which directly converts the RF signal into baseband signal without converting into IF signal also enables the omission of the IF circuit, which helps realize a less circuit configuration.

Embodiment 6

Next, Embodiment 6 is explained using a figure. FIG. 15 is a configuration diagram of a communication system for Embodiment 6. In FIG. 15, a modulation unit 1501 for the transmitter, a convolutional coder 1502, delay units 1503, 1504, 1509, and 1510 having the delay time equivalent to the M-bit data time period τ, a parallel-to-serial converter 1505, a PSK modulator 104, a frequency converter 105, a radio-frequency amplifier 106, a low-noise amplifier 107, a mixer 108, an oscillator 109, an IF circuit 110, a demodulation unit 1506 for the receiver, an AFC circuit 1507, a detector circuit 113, a serial-to-parallel converter 1508, combination circuits 1511 and 1512, and a Viterbi decoder 1513 are illustrated. Parts the same as or correspond to FIG. 1 are given the same numbers and the explanation is omitted.

Next, the operation is explained. Similarly to Embodiment 1, data such as sound, images, etc., is converted into digital signal by a sound coder, etc., and becomes a data sequence to be transmitted. The data sequence to be transmitted is input to modulation unit 1501, and convolutionally encoded by convolutional coder 1502 with coding ratio R=1/2. Two data sequences output from convolutional coder 1502 are then branched out to two, one of which is directly input into parallel-to-serial converter 1505. While the other is given the delay time τ at delay units 1503 and 1504 having the delay time equivalent to the M-bit data time period τ, and then input into parallel-to-serial converter 1505. Parallel-to-serial converter 1505 converts four parallel input data sequences into serial data sequences quadruple the data rate of the input data sequence.

The way of data conversion of parallel-to-serial converter 1505 is explained using a figure. FIG. 16 is a diagram indicating timing chart of the convolutionally encoded data sequences $\{A_i\}$ and $\{B_i\}$, data sequences $\{A_i'\}$ and $\{B_i'\}$ added by the M-bit delay corresponding to the delay time τ to $\{A_i\}$ and $\{B_i\}$ by delay units 1503 and 1504, and output $\{\Gamma_i\}$ from parallel-to-serial converter 1505. The relationship between $\{A_i\}$ and $\{A_i'\}$ and $\{B_i\}$ and $\{B_i'\}$ is expressed as follows based on FIG. 16.

$$A_i'=A_{i-M}$$

$$B_i'=B_{i-M}$$

Moreover, output $\{\Gamma_i\}$ from parallel-to-serial converter 1505 can be expressed as follows according to $\{A_i\}$, $\{A_i'\}$, $\{B_i\}$, and $\{B_i'\}$.

$$\Gamma_i = \{\Gamma_{i,1}, \Gamma_{i,2}, \Gamma_{i,3}, \Gamma_{i,4}\}$$
$$= \{A_i, A_i', B_i, B_i'\} = \{A_i, A_{i-M}, B_i, B_{i-M}\}$$

The output from parallel-to-serial converter 1505 is PSK modulated by PSK modulator 104, and the PSK modulated signal is frequency converted into radio frequency (RF) by frequency converter 105. Frequency converted into RF is power amplified by the radio-frequency amplifier 106, and then transmitted. The transmitted radio signal is received by the receiver, power amplified by the low-noise amplifier 107 and then input into mixer 108. Mixer 108 mixes the received RF signal with oscillator 109 having the oscillation frequency close to the frequency of the received RF signal, converts the received signal into the intermediate frequency (IF) to produce the received IF signal. The converted received IF signal is input into IF circuit 110. IF circuit 110 converts the received IF signal into the received baseband signal.

Figure 17:
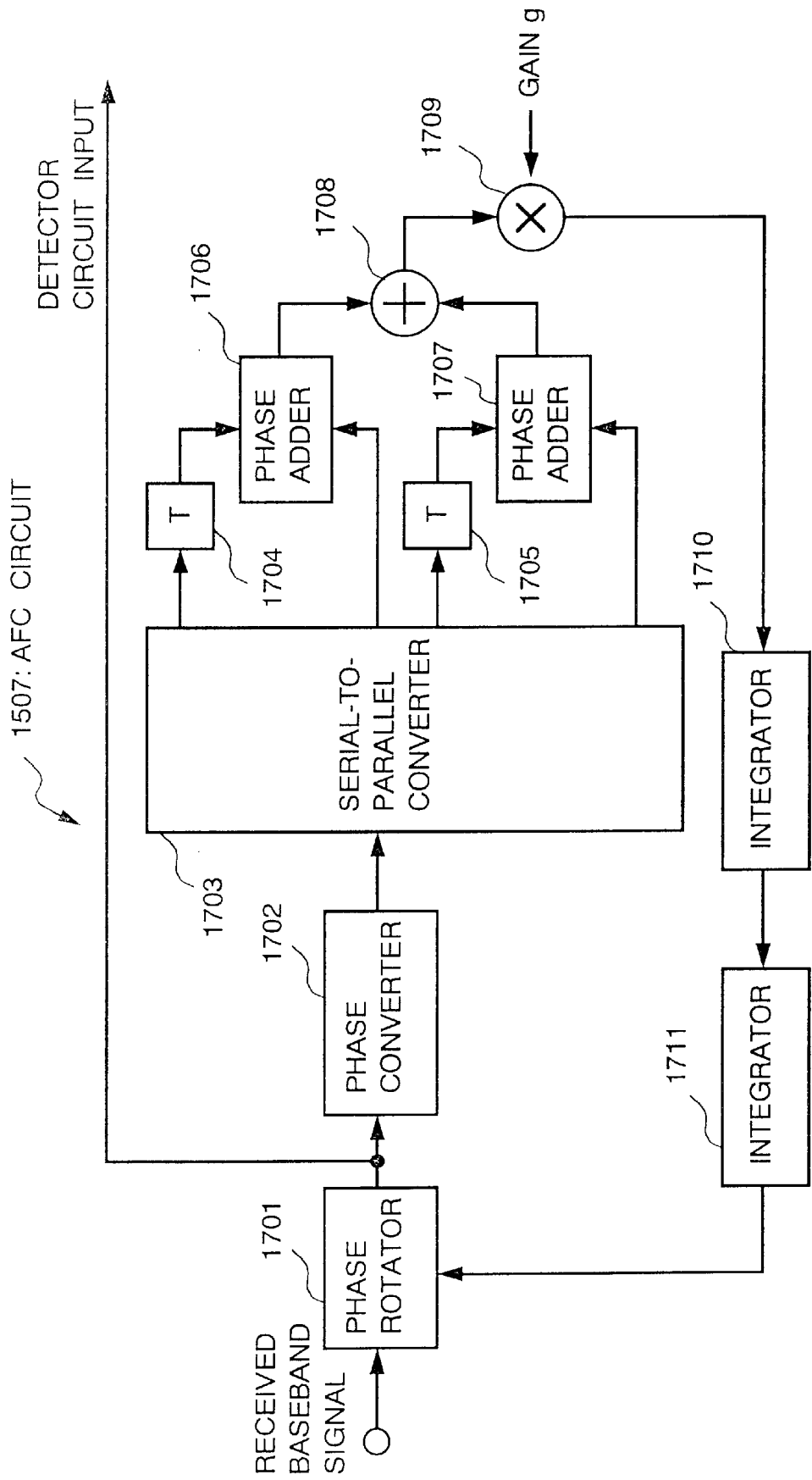
FIG. 17 shows the configuration of an AFC circuit of Embodiment 6.

The received baseband signal which is the output from IF circuit 110 is input into demodulation unit 1506. The received baseband signal input into demodulation unit 1506 is input into AFC circuit 1507 and the frequency offset is compensated. The operation of AFC circuit 1507 is explained using a figure. FIG. 17 shows a configuration example of AFC circuit 1507. In FIG. 17, a phase rotator 1701, a phase converter 1702, a serial-to-parallel converter 1703, phase adders 1704 and 1705, delay units 1706 and 1707, an adder 1708, a multiplier 1709, and integrators 1710 and 1711 are shown.

The received baseband signal input into AFC circuit 1507 has a frequency offset $\Delta f$, and the received phase rotates from 0 to $2\pi$ at the speed according to $\Delta f$. After input into AFC circuit 1507, the received baseband signal is input into phase rotator 1701, and rotates clockwise by the output $\theta s$ from integrator 1711 per symbol. Here, $\theta s$ denotes an estimated phase rotating amount per symbol. If $\theta$ equals $\theta s$, by rotating the phase by $\theta s$ in clockwise, the received phase rotated in counterclockwise by $\theta$ due to frequency offset can be compensated. The output from phase rotator 1701 is output to detector circuit 113 as the output from AFC circuit 1507, and then input into phase converter 1702 too. Phase converter 1702 outputs the phase of the received baseband signal which is the output from phase rotator 1701.

The output from phase converter 1702 is input into serial-to-parallel converter 1703. Serial-to-parallel converter 1703 converts an input phase data sequence into four parallel phase data sequences having the data rate one fourth of the input data sequence. Of the outputs from serial-to-parallel converter 1703, the data sequence given the delay $\tau$ equivalent to the M-bit data time period by the transmitter is directly input into phase adders 1706 and 1707. Of the outputs from serial-to-parallel converter 1703, data sequences not given the delay $\tau$ equivalent to the M-bit data time period by the transmitter is input into delay units 1704 and 1705, where, they are given the delay equivalent to the M-bit data time period $\tau$ and then input into phase adders 1704 and 1705.

Data conversion of serial-to-parallel converter 1703 is explained by using a figure. FIG. 18 is a timing chart of the phase data sequence $\{\phi\gamma_i\}$ output from phase converter 1702, the phase data sequence $\{\phi a_i\}$ corresponding to the data sequences $\{a_i\}$ and the phase data sequence $\{\phi b_i\}$ corresponding to the data sequence $\{b_i\}$ to both of which no delay is given at the transmitting side among the outputs from serial-to-parallel converter 1703, and the phase data sequence $\{\phi a_i'\}$ corresponding to data sequences $\{a_i'\}$ and $\{\phi b_i'\}$ corresponding to data sequence $\{b_i'\}$ to both of which the delay equivalent to the M-bit data time period $\tau$ is given by delay units 1503 and 1504 at the transmitting side. As shown in FIG. 18, the relationships between $\{\gamma r_i\}$ and $\{\phi a_i\}$, $\{\phi a_i'\}$, $\{\phi b_i\}$, and $\{\phi bi'\}$ are expressed as follows:

$$\{\phi\tau_i\} = \{\phi a_i, \phi a_i', \phi b_i, \phi b_i'\}$$

Assuming noiseless conditions for simplification, because $\{a_i'\}$ and $\{b_i'\}$ are given the delay equivalent to M $\tau$ to $\{a_i\}$ and $\{b_i\}$ at transmission time respectively, the relationships between $\{a_i\}$ and $\{a_i'\}$ and $\{b_i\}$ and $\{b_i'\}$ can be expressed using the number of bits M per time $\tau$ as follows:

$$a_i' = a_{i-M}$$
$$b_i' = b_{i-M}$$

Therefore, the relationship between the phase data sequences $\{\phi a_i'\}$ and $\{\phi a_i\}$ and $\{\phi b_i'\}$ and $\{\phi b_i\}$ corresponding to $\{a_i'\}$ and $\{a_i\}$ and $\{b_i'\}$ and $\{b_i\}$ can be expressed as follows:

$$\phi a_i' = \phi a_{i-M}$$
$$\phi b_i' = \phi b_{i-M}$$

Based on these, $\{\phi\sigma_i\}$ can be expressed as below using $\{\phi a_i\}$ and $\{b_i\}$.

$$\phi\tau_i = \{\phi a_i, \phi a_i', \phi b_i, \phi b_i'\}$$
$$= \{\phi a_i, \phi a_{i-M}, \phi b_i, \phi b_{i-M}\}$$

Among the outputs from serial-to-parallel converter 1703, sequences with the delays given by the transmitting side $\{\phi a_i'\}$ and $\{\phi b_i'\}$ are directly input into phase adders 1706 and 1707. Sequences which are given no delay by the transmitting side, $\{\phi a_i\}$ and $\{\phi b_i\}$ are input into delay units 1704 and 1705 and given the delay equivalent to the M-bit data time period $\tau$, and then input into phase adders 1706 and 1707.

The phase data sequences $\{\phi a_i\}$ and $\{\phi b_i\}$ are given the delay equivalent to the M-bit time period $\tau$ by delay units 1704 and 1705. Therefore, the delay time of the input into phase adder circuits 1704 and 1705, e.g., $\{\phi a_{i-M}\}$ and $\{\phi a_i'\}$, and $\{\phi b_{i-M}\}$ and $\{\phi b_i'\}$ becomes $\tau$ for both including the delay time given by the transmitting side. Thus, $\{\phi a_{i-M}\}$, $\{\phi a_i'\}$ and $\{\phi b_{i-M}\}$, $\{\phi b_i'\}$ can be expressed as below.

$$\{\phi a_{i-M}\} = \{\ldots, \phi a_{1-M}, \phi a_{2-M}, \phi a_{3-M}, \ldots, \phi a_1, \phi a_2, \phi a_3, \ldots\}$$
$$\{\phi a_i'\} = \{\ldots, \phi a_{1-M}, \phi a_{2-M}, \phi a_{3-M}, \ldots, \phi a_1, \phi a_2, \phi a_3 \ldots\}$$
$$\{\phi b_{i-M}\} = \{\ldots, \phi b_{1-M}, \phi b_{2-M}, \phi b_{3-M}, \ldots, \phi b_1, \phi b_2, \phi b_3 \ldots\}$$
$$\{\phi b_i'\} = \{\ldots, \phi b_{1-M}, \phi b_{2-M}, \phi b_{3-M}, \ldots, \phi b_1, \phi b_2, \phi b_3, \ldots\}$$

That is, because $\{\phi a_{i-M}\}$, $\{\phi a_i'\}$ and $\{b_{i-M}\}$, $\{\phi b_i'\}$ become the same phase data sequences, the modulation phase of the data corresponding to both sequences are the same. Phase adders 1704 and 1705 subtract the delay unit outputs $\{\phi a_{i-M}\}$ and $\{\phi b_{i-M}\}$ from the outputs $\{\phi a_i'\}$ and $\{\phi b_i'\}$ from serial-to-parallel converter 1703, and outputs phase errors $\delta f a_i$ and $\delta f b_i$. Further, phase adder 1708 adds $\delta f a_i$ to $\delta f b_i$, and outputs phase error $\delta f_i$. $\delta f_i$ can be expressed as follows:

$$\delta f_i = \delta fa_i + \delta fb_i$$
$$= \{\phi a_i'\} - \{\phi a_{i-M}\} +$$
$$\{\phi b_i'\} - \{\phi b_{i-M}\}$$

In the above expressions, $\{\phi a_{i-M}\}$, $\{\phi a_i'\}$, $\{\phi b_{i-M}\}$, $\{\phi b_i'\}$, are the received phase expressed from 0 to $2\pi$, respectively. Also, $\delta fa_i$ and $\delta fb_i$ are the shifting amount of frequency offset occurred during time $\tau$ corresponding to the M-bit time period. By adding $\delta fa_i$ and $\delta fb_i$, the phase error $\delta f_i$ can be obtained.

The phase error $\delta f_i$ which is output from phase adder 1708 is input into multiplier 1709 and multiplied by gain g. Therefore, the output from multiplier 1709, namely, the input to integrator 1710 becomes g $\delta f_i$.

Integrator 1710 integrates the output from multiplier 1709. g $\delta f_i$ is an amount concerning the error in phase shifting degree per symbol, and the output from integrator 1710 becomes an estimated value of phase shifting degree per symbol.

The output from integrator 1710, e.g., the estimated value of phase shifting degree per symbol is input into integrator 1711. Integrator 1711 integrates phase shifting degree per symbol, and outputs phase degree for rotating the received signal, e.g., the estimated phase rotating degree θs.

The estimated phase rotating amount output from integrator 1711 is input into phase rotator 1701, and rotates the received baseband signal to the direction counter to the direction rotated by the frequency offset. Namely, by rotating the received signal in clockwise when the received signal is rotating counter clockwise, and in counterclockwise when the received signal is rotating clockwise, the phase shifting caused by frequency offset can be compensated.

The received baseband signal for which the frequency offset output from the AFC circuit is compensated is input into detector circuit 113. Detector circuit 113 detects the received baseband signal.

The output from detector circuit 113 is input into serial-to-parallel converter 1508, and converted into four data sequences, $\{a_i\}$, $\{a_i'\}$, $\{\beta_i\}$, $\{\beta_i'\}$. Because $\{\alpha_i'\}$ and $\{\beta_i'\}$ are given the delay $\tau$ equivalent to the M-bit time period at transmission time to $\{\alpha_i\}$ and $\{\beta_i\}$, the delay amount for both sequences can be made equal by giving the delay $\tau$ equivalent to the M-bit time period to $\{\alpha_i\}$, $\{\beta_i\}$ by delay units 1509 and 1510. Combination circuits 1511 and 1512 combine $\{\alpha_{i-m}\}$ and $\{\alpha_i'\}$, and $\{\beta_{i-M}\}$ and $\{\beta_i'\}$ having equalized delay amount.

The outputs from combination circuits 1511 and 1512 are input into Viterbi decoder 1513, whereby the maximum likelihood decoding is performed. The Viterbi decoder operates as the maximum likelihood decoder for convolutional coding. The output from Viterbi decoder 1513, e.g., the decoder output is decoded by sound decoder, etc., and output as sound data, image data, etc.

In the above operation, by using the characteristics of time diversity technique which transmits the identical data at differentiated timing, and performs combined reception with the delay amount equalized by the receiving side, frequency error can be obtained without removing modulation phase of the received signal, and realizes a communication system provided with a stable AFC circuit even under low CN ratio. Moreover, by realizing a configuration in which convolutional coding is performed by the transmitter and Viterbi decoding by the receiver, it is advantageous in lowering error rate in the identical $E_b/N_0$.

Embodiment 7

Figure 19:
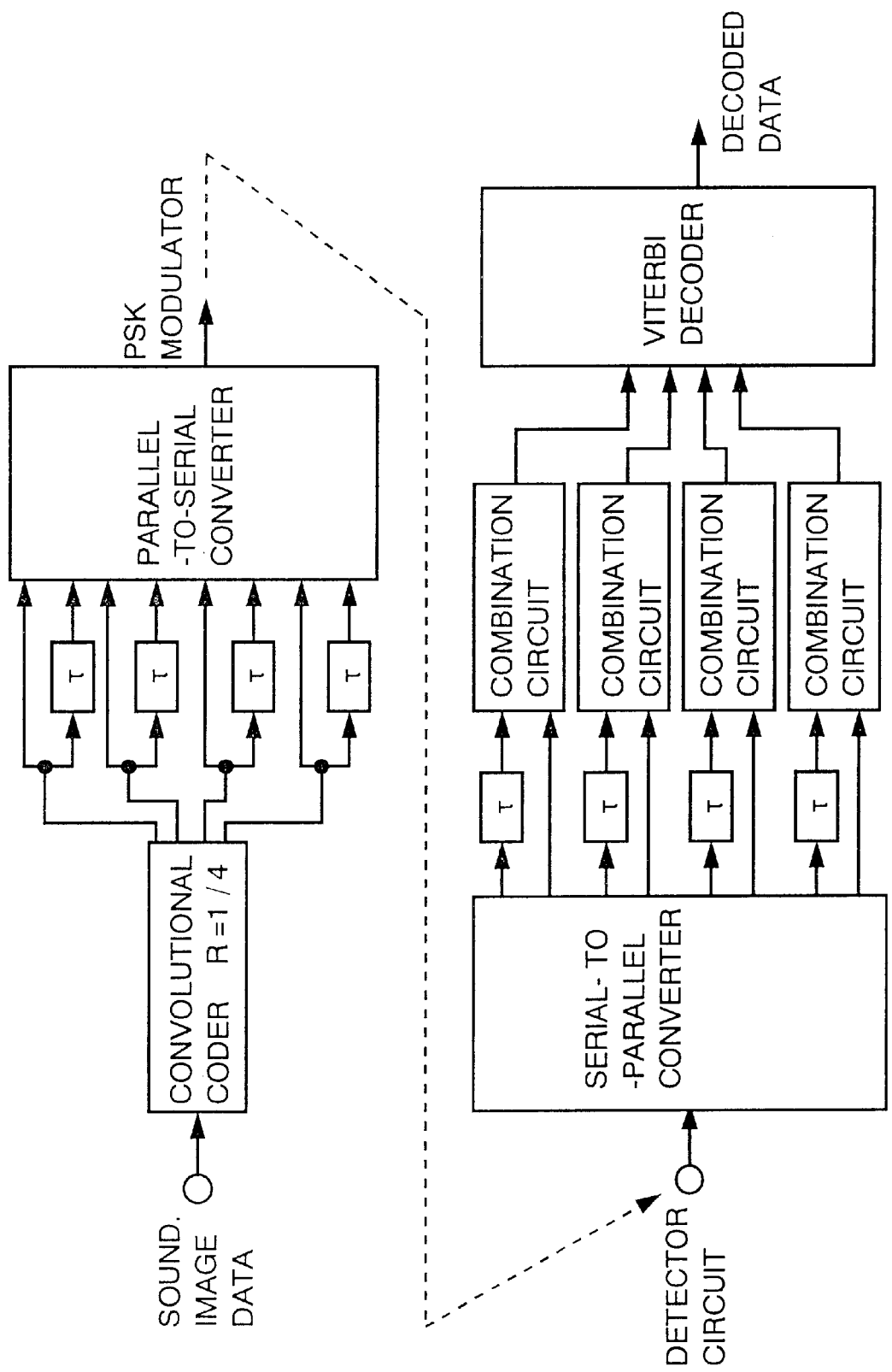
FIG. 19 shows a convolutional coder, delay units and a parallel-to serial converter of the modulation unit, and a serial-to-parallel converter, delay units, combination circuits and the Viterbi decoder of the demodulation unit of Embodiment 7.

With the above Embodiment 6, coding rate R of convolutional coder 1502 is set to 1/2 as shown in FIG. 15, but it does not always have to be 1/2. For instance, in order to increase the coding rate, R could be made 3/4 by generating punctured code for the Viterbi decoding by deleting the unit of the convolutional coding bits periodically. Or, in order to raise error correction capability, the coding rate R could be made 1/4 as shown in FIG. 19. When R is 1/4 as indicated in FIG. 19, because the parallel-to-serial converter corresponding to parallel-to-serial converter 1505 of FIG. 15 has 8 to inputs, the output data rate becomes the data rate octuple of the input data sequence, and the output data rate of the serial-to-parallel converter corresponding to serial-to parallel converter 1508 becomes ⅛th the data rate of the input data sequence.

Embodiment 8

Figure 20:
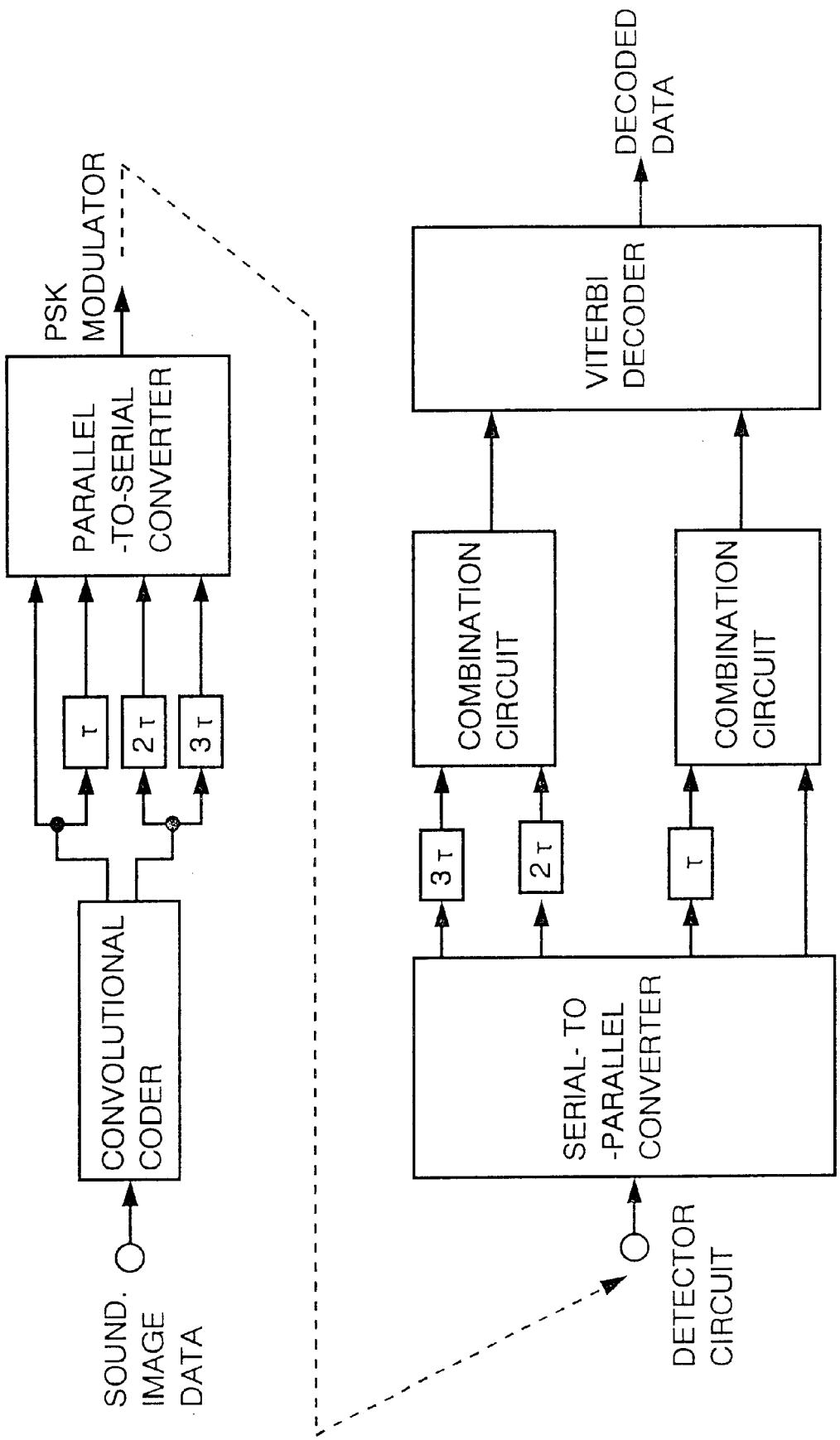
FIG. 20 shows a convolutional coder, delay units and a parallel-to-serial converter of the modulation unit, and a serial-to-parallel converter, delay units, combination circuits and the Viterbi decoder of the demodulation unit of Embodiment 8.

In the above Embodiment 6, the delay given by the transmitter and the receiver is set to time equivalent to the M-bit data time period $\tau$ as shown in FIG. 15. However, it does not always have to be $\tau$, it is possible that modulation unit 1501 give the delay 0, $\tau$, $2\tau$, $3\tau$ to four data sequences as shown in FIG. 20, and the delay given by demodulation unit 1506 be $3\tau$, $2\tau$, $\tau$, 0 to make the delay amount equal. Because there are delay difference among identical data sequences, the configuration of AFC circuit 1507 can be made the same as the configuration for Embodiment 7.

Figure 21:
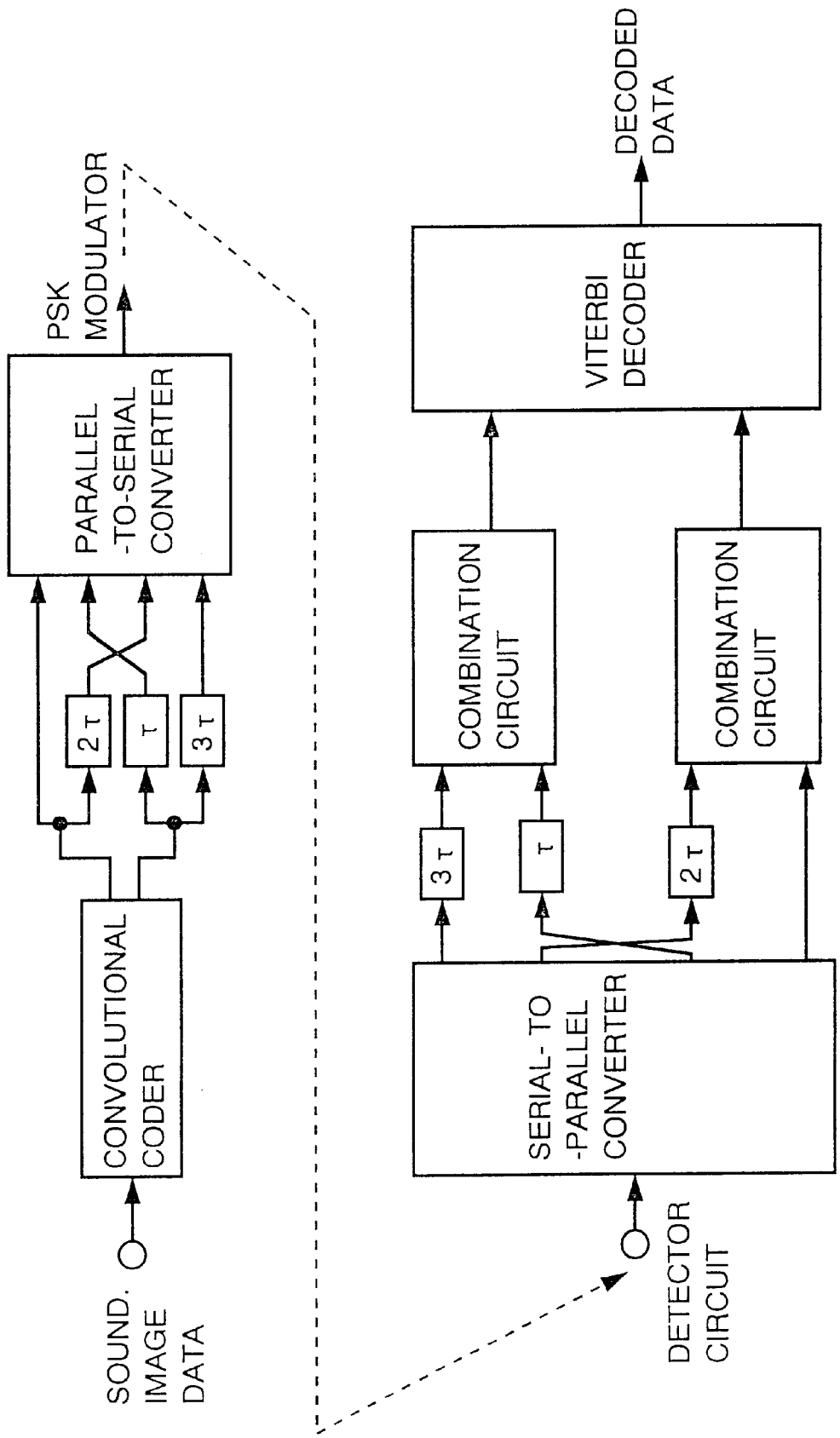
FIG. 21 shows a convolutional coder, delay units and a parallel-to-serial converter of the modulation unit, and a serial-to-parallel converter, delay units, combination circuits and the Viterbi decoder of the demodulation unit of Embodiment 9.

In the above Embodiment 6, the delay given by the transmitter and the receiver is made $\tau$, the time equivalent to the M-bit data time period, it does not always have to be $\tau$. For instance, the delay amount to be given to four data sequences and the order of the parallel-to-serial converter can be set as illustrated in FIG. 21. In this case, because the delay amount among the identical data sequences becomes $2\tau$, respectively, if the variation of received signal level due to effects of fading, etc., is slow, improved effect of the bit error rate by the time diversity is larger compared with the delay amount $\tau$. Because the delay difference among the identical data sequences is $2\tau$ in this case, the delay time for delay units 1706 and 1707 of AFC circuit 1507 in FIG. 17 can be made $2\tau$, respectively.

Embodiment 10

Although phase rotator 1701 is incorporated inside AFC circuit 1507 so as to rotate the phase of the received baseband signal in Embodiment 6, this embodiment is configured in such a manner that the signal for controlling frequency, namely, the frequency control signal is fed from AFC circuit 1507 back to intermediate frequency oscillator 303 of IF circuit 110. This configuration allows the omission of phase rotator 1701 and integrator 1711 of the AFC circuit.

Figure 22:
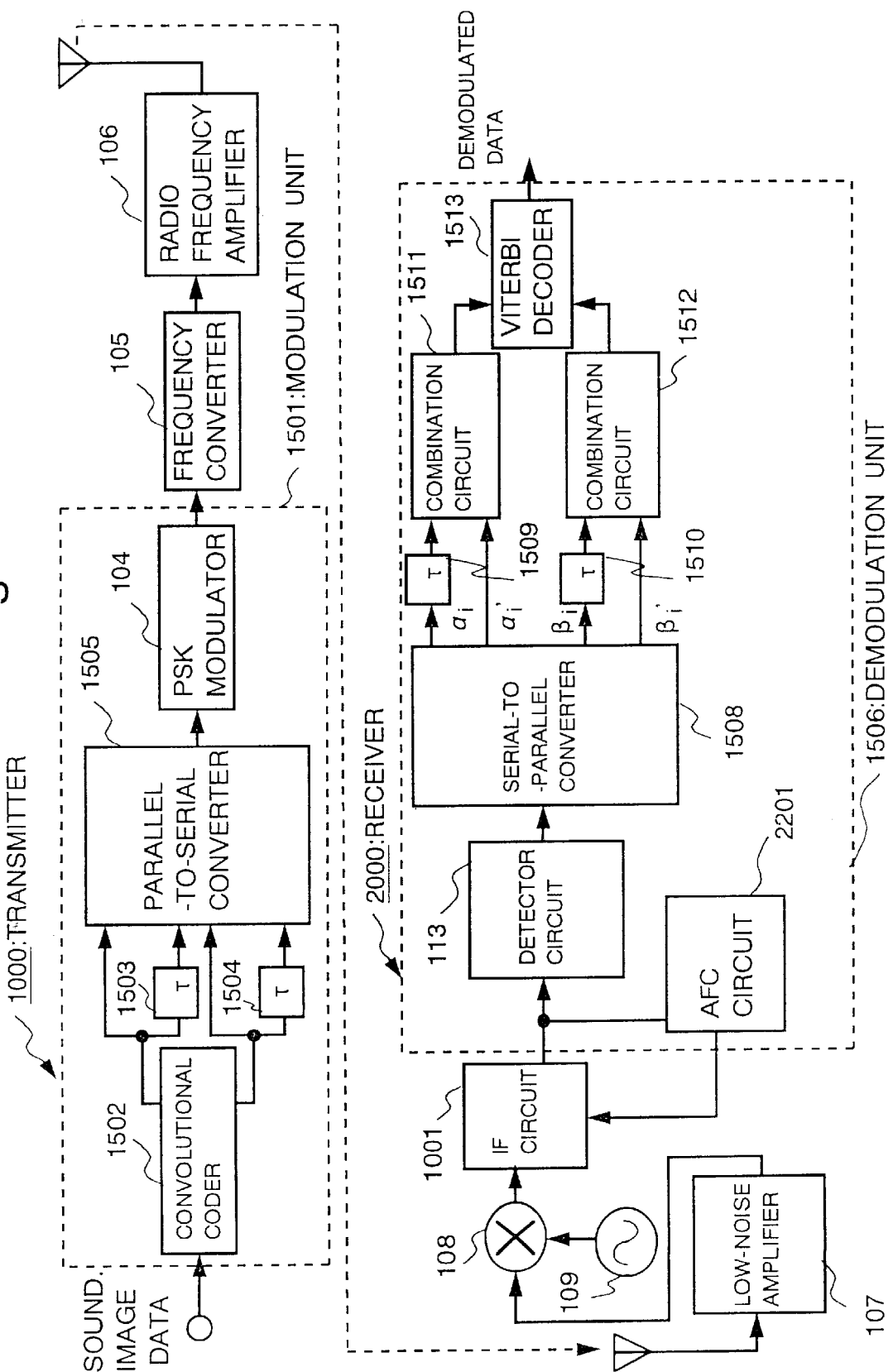
FIG. 22 shows a configuration of a communication system of Embodiment 10 of the present invention.

The configuration of a communication system for Embodiment 10 is shown in FIG. 22. In FIG. 22, parts the same as FIG. 15 or FIG. 10 are given the same numbers and their explanation is omitted. In FIG. 22, the received signal received by the receiver is amplified by low-noise amplifier 107, and then input into mixer 108. Mixer 108 mixes the received signal with the oscillation frequency close to the frequency of the received RF signal output from oscillator 109, and converts the received signal into intermediate frequency (IF). The converted received IF signal is input into IF circuit 1001 and then converted into baseband signal. IF circuit 1001 is the same as the IF circuit of FIG. 10, and its configuration is the same as shown in FIG. 11. To IF circuit 1001, the frequency control signal output from AFC circuit 2201 is input, to control the oscillation frequency of intermediate frequency oscillator 1101 in IF circuit 1001 to make the frequency offset of the received baseband signal 0.

The received baseband signal output from IF circuit 1001 is input into demodulation unit 111. The received baseband signal input into demodulation unit 111 is input into detector circuit 113 and input into AFC circuit 2201 as well. AFC circuit 2201 detects the frequency offset of the received baseband signal and outputs the frequency control signal to IF circuit 1001.

Figure 23:
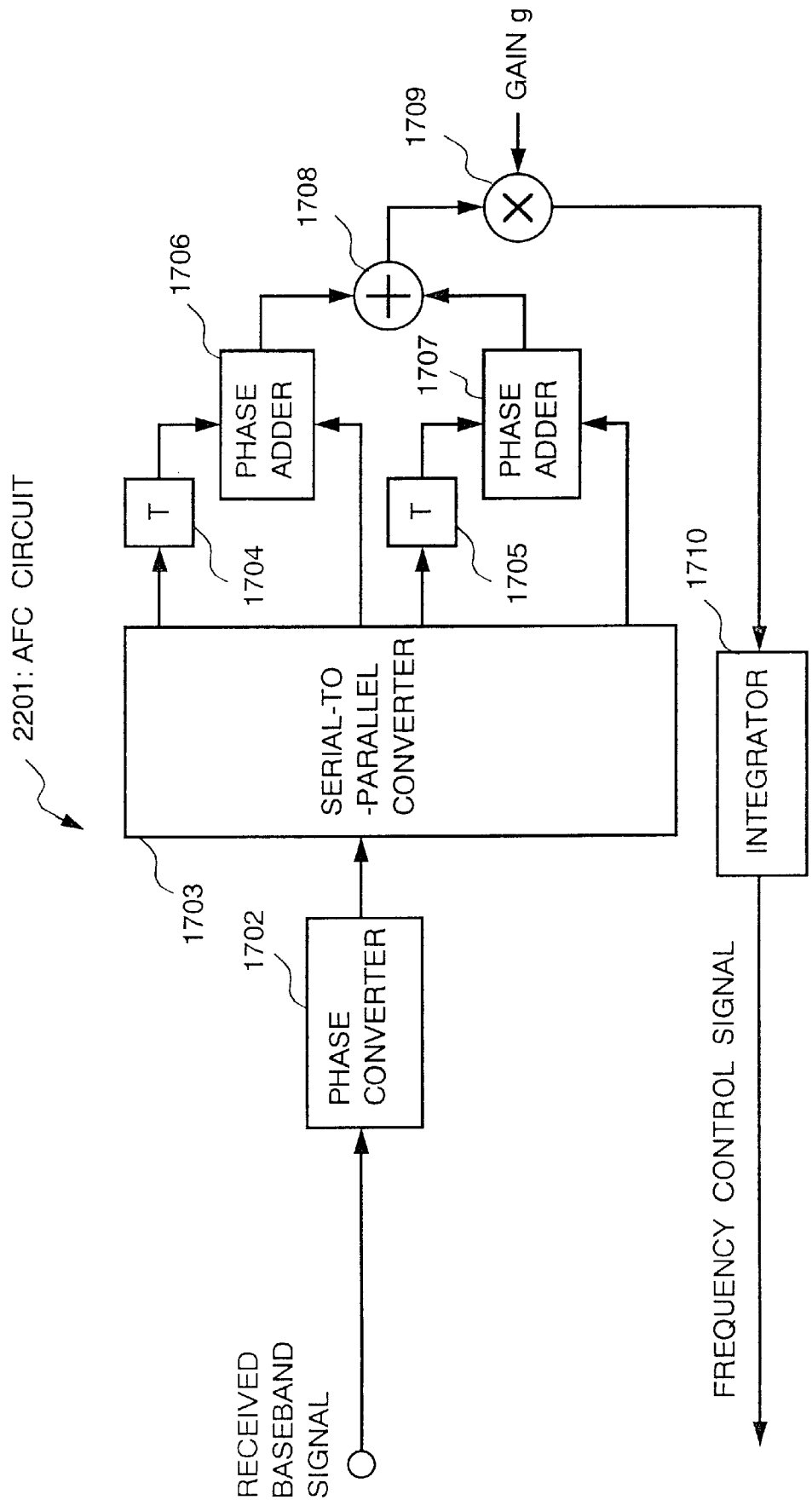
FIG. 23 shows the configuration of an AFC circuit of Embodiment 10.

FIG. 23 shows a configuration example of AFC circuit 2201. FIG. 23 shows the configuration in which phase rotator 1701 and integrator 1711 of FIG. 17 are omitted. Although phase rotator 1701 is provided for Embodiment 6 to compensate for the frequency offset, Embodiment 10 can omit phase rotator 1701 because the compensation for the frequency offset is performed by IF circuit 1001. Moreover, because integrator 1710 outputs an estimated frequency offset, which can be output to IF circuit 1001 as the frequency control signal, integrator 1711 can be omitted.

As described above, the frequency control signal, which is output from AFC circuit 2201, is fed back to intermediate frequency oscillator 1101 of IF circuit 1001, so as to compensate for the frequency offset by IF circuit 1001, the phase rotator and the integrator can be omitted from AFC circuit 2201. And the frequency error can be obtained without removing the modulation phase of the received signal, and a communication system equipped with a stable AFC circuit even under low CN ratio can be realized with less circuit configuration.

Embodiment 11

Although Embodiment 10 is configured in a manner that the frequency control signal output from AFC circuit 2201 is fed back to intermediate frequency oscillator 1101 of IF circuit 1001, this Embodiment is configured in such a way that the frequency control signal output from AFC circuit 2201 is fed back to oscillator 109.

Figure 24:
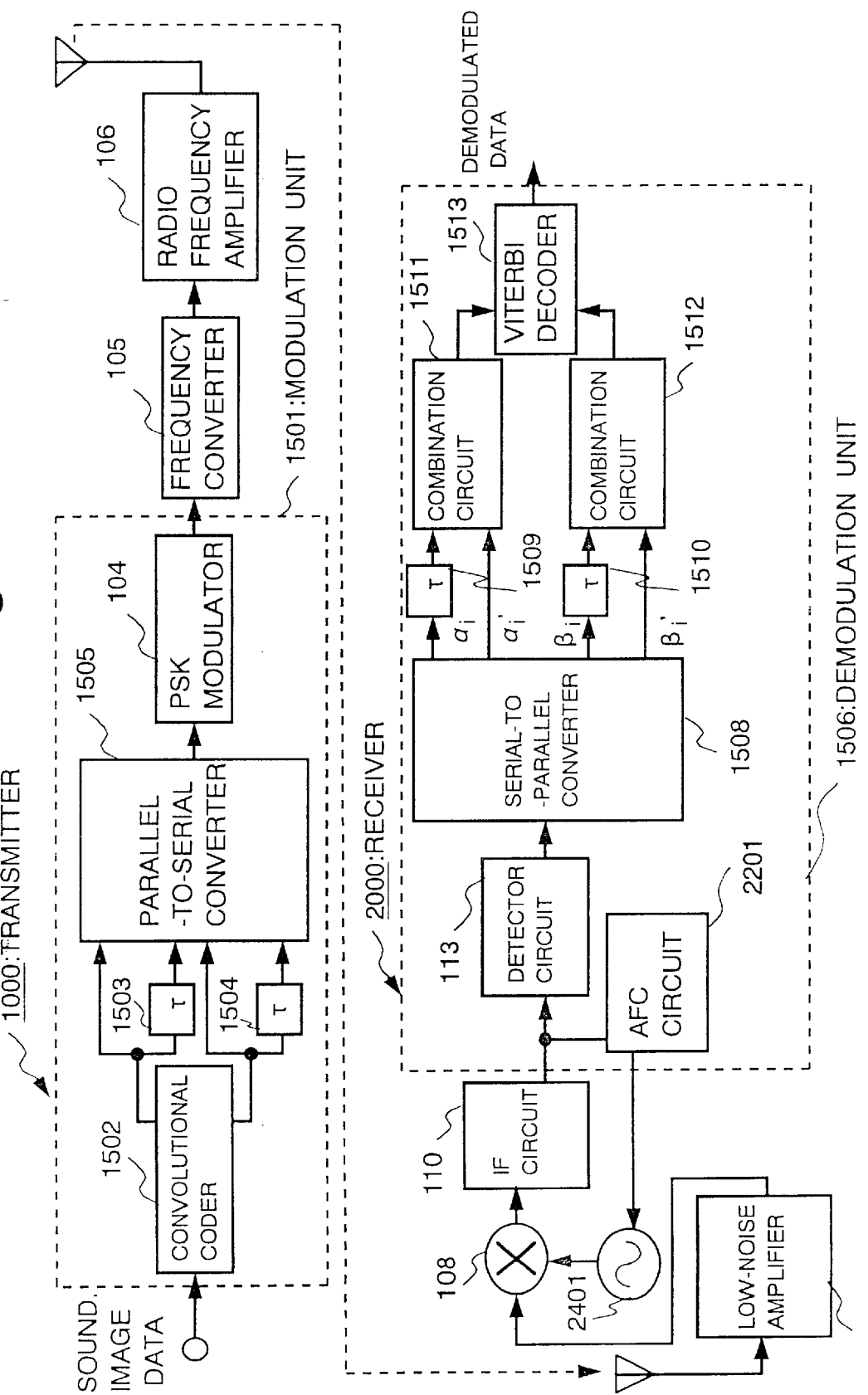
FIG. 24 shows a configuration of a communication system of Embodiment 11.

The configuration of the communication system of Embodiment 11 is shown in FIG. 24. In FIG. 24, parts the same as FIG. 15 are given the same numbers and their explanation is omitted. In FIG. 23, the received signal received by the receiver is amplified by low-noise amplifier 107, and input into mixer 108. Mixer 108 mixes the received signal with the oscillation frequency close to the received RF frequency output from oscillator 2401 and converts the received signal into the intermediate frequency.

In this Embodiment, the frequency control signal output from AFC circuit 2201 is input into oscillator 2401. The oscillation frequency close to the received RF frequency output from oscillator 2401 is controlled by the frequency control signal, so that the frequency difference from the RF frequency is to be equalized with the oscillation frequency of intermediate frequency oscillator 1101 of IF circuit 110.

That is, when the oscillation frequency output from oscillator 2401 is assumed to be $f_{RF-OSC}$, the frequency of the received RF signal to be $f_{RF-SIG}$ and the oscillation frequency of intermediate frequency oscillator 303 of IF circuit 110 to be $f_{IF-OSC}$, and when $f_{RF-OSC}$ is larger than $f_{RF-SIG}$, and if $f_{RF-OSC}-f_{RF-SIG}$ is larger than $f_{IF-OSC}$, then a signal to lower $f_{RF-OSC}$ is input from AFC circuit 2201.

Conversely, if $f_{RF-OSC}-f_{RF-SIG}$ is smaller than $f_{IF-OSC}$, then a signal to raise $f_{RF-OSC}$ is input from AFC circuit 2201.

In the meantime, when $f_{RF-OSC}$ is smaller than $f_{RF-SIG}$, and if $f_{RF-SIG}-f_{RF-OSC}$ is larger than $f_{IF-OSC}$, a signal to raise $f_{RF-OSC}$ is input from AFC circuit 2201.

Conversely, if $f_{RF-SIG}-f_{RF-OSC}$ is smaller than $f_{IF-OSC}$, then a signal to lower $f_{RF-OSC}$ is input from AFC circuit 2101.

The received IF signal output from mixer 108 is input into IF circuit 110 and converted into the baseband signal. The converted received baseband signal is input into demodulation unit 111. The received baseband signal input into demodulation unit 111 Is input into detector circuit 113 and input to AFC circuit 2201 as well. AFC circuit 2201 detects the frequency offset of the received baseband signal and outputs the frequency control signal to oscillator 2401.

In this way, the frequency control signal output from AFC circuit 2201 is fed back to oscillator 2101 to control the oscillation frequency of oscillator 2401 and compensate for the frequency offset. This configuration serves to omit the phase rotator and the integrator from AFC circuit 2201, to obtain the frequency error without removing the modulation phase of the received signal, thereby realizing a communication system equipped with a stable AFC circuit even under low CN ratio with less circuit configuration.

Embodiment 12

Although the above Embodiment 11 is configured that the oscillation frequency of the RF oscillator is controlled and converted into intermediated frequency by the mixer, the oscillation frequency of the RF oscillator of this Embodiment is controlled to be matched with the frequency of the received RF signal in a direct demodulation (direct conversion).

Figure 25:
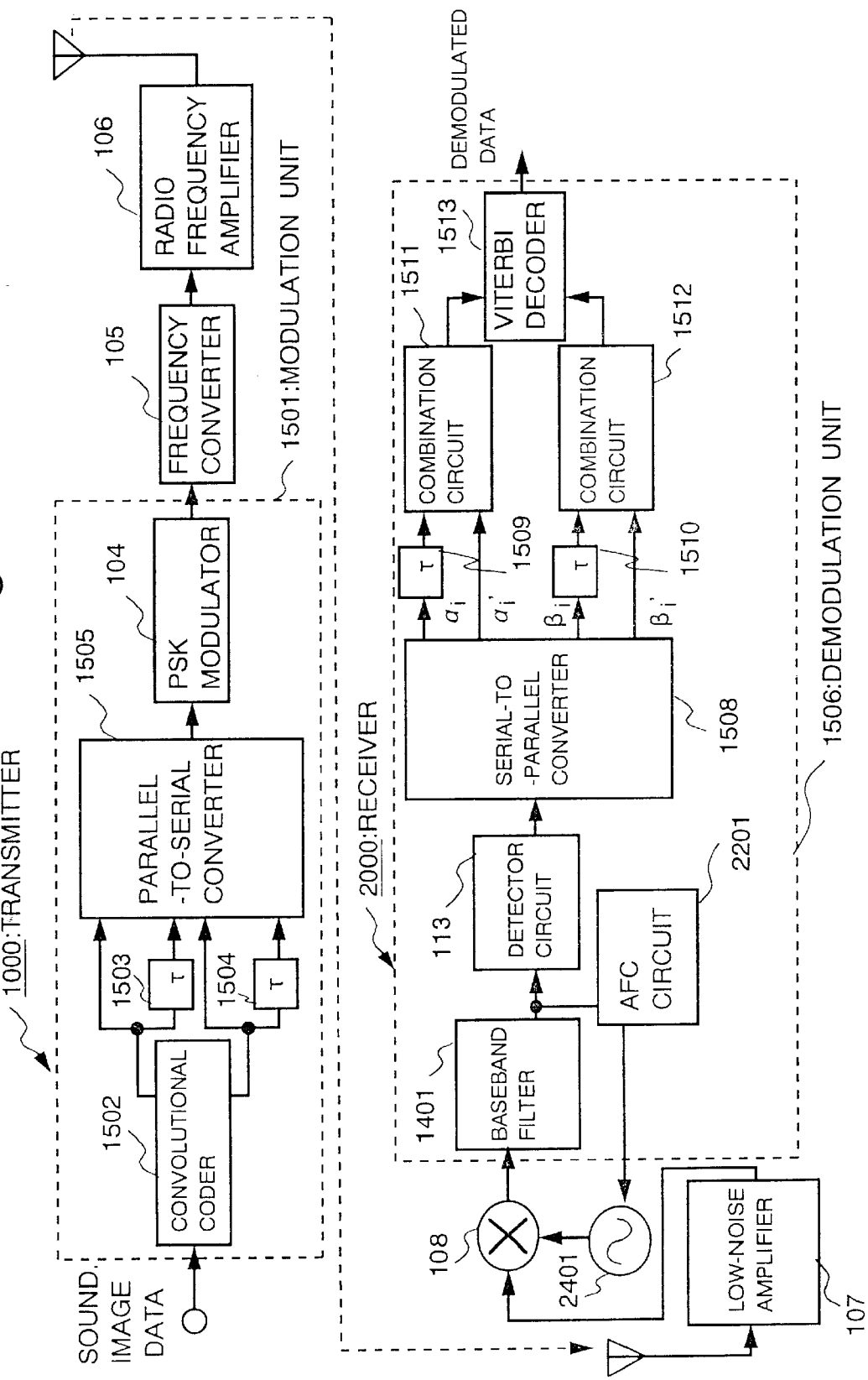
FIG. 25 shows a configuration of a communication system of Embodiment 12.

The configuration of a communication system of Embodiment 12 is shown in FIG. 25. In FIG. 25, parts the same as FIG. 14, FIG. 15, and FIG. 24 are given the same numbers and their explanation is omitted. In FIG. 25, the received signal received by the receiver is amplified by low-noise amplifier 107, and then input into mixer 108. Mixer 108 mixes the received signal with the oscillation frequency close to the received RF frequency output from oscillator 2401, to convert the received signal into the baseband signal.

Similarly to Embodiment 11, in this Embodiment, the frequency control signal output from AFC circuit 2201 is input into oscillator 2401. At oscillator 2401, the oscillation frequency is controlled to become identical to the frequency of the received RF signal.

That is, when the oscillation frequency output from oscillator 2401 is lower than the frequency of the received RF signal, the frequency control signal to raise the oscillation frequency of oscillator 2401 is input from AFC circuit 2201. Conversely, when the oscillation frequency output from oscillator 2401 is higher than the frequency of the received RF signal, the frequency control signal to lower the oscillation frequency of oscillator 2401 is input from AFC circuit 2201.

The received baseband signal output from mixer 108 is input into demodulation unit 111. The received baseband signal input into demodulation unit 111 is filtered by baseband filter 1401 for desired signals, and then input into detector circuit 113 and into AFC circuit 2201. as well. AFC circuit 2201 detects the frequency offset of the received baseband signal, and outputs the frequency control signal to oscillator 2401.

In this way, the frequency control signal output from AFC circuit 2201 is fed back to oscillator 2401 to control the oscillation frequency of oscillator 2401. This configuration serves to omit the phase rotator and integrator from AFC circuit 2201, and to obtain the frequency error without removing the modulation phase of the received signal, and realizes a communication system equipped with a stable AFC circuit even under low CN ratio. In addition, through the application of direct conversion scheme which converts the RF signal directly into the baseband signal without converting into the IF signal, the IF circuit can be simplified, and less circuit configuration can be achieved.

Embodiment 13

This Embodiment sets forth that after PSK modulation is performed by the transmitter, spectrum spreading is performed, and then inverse spreading is performed by the receiver for the coherent detection.

Figure 26:
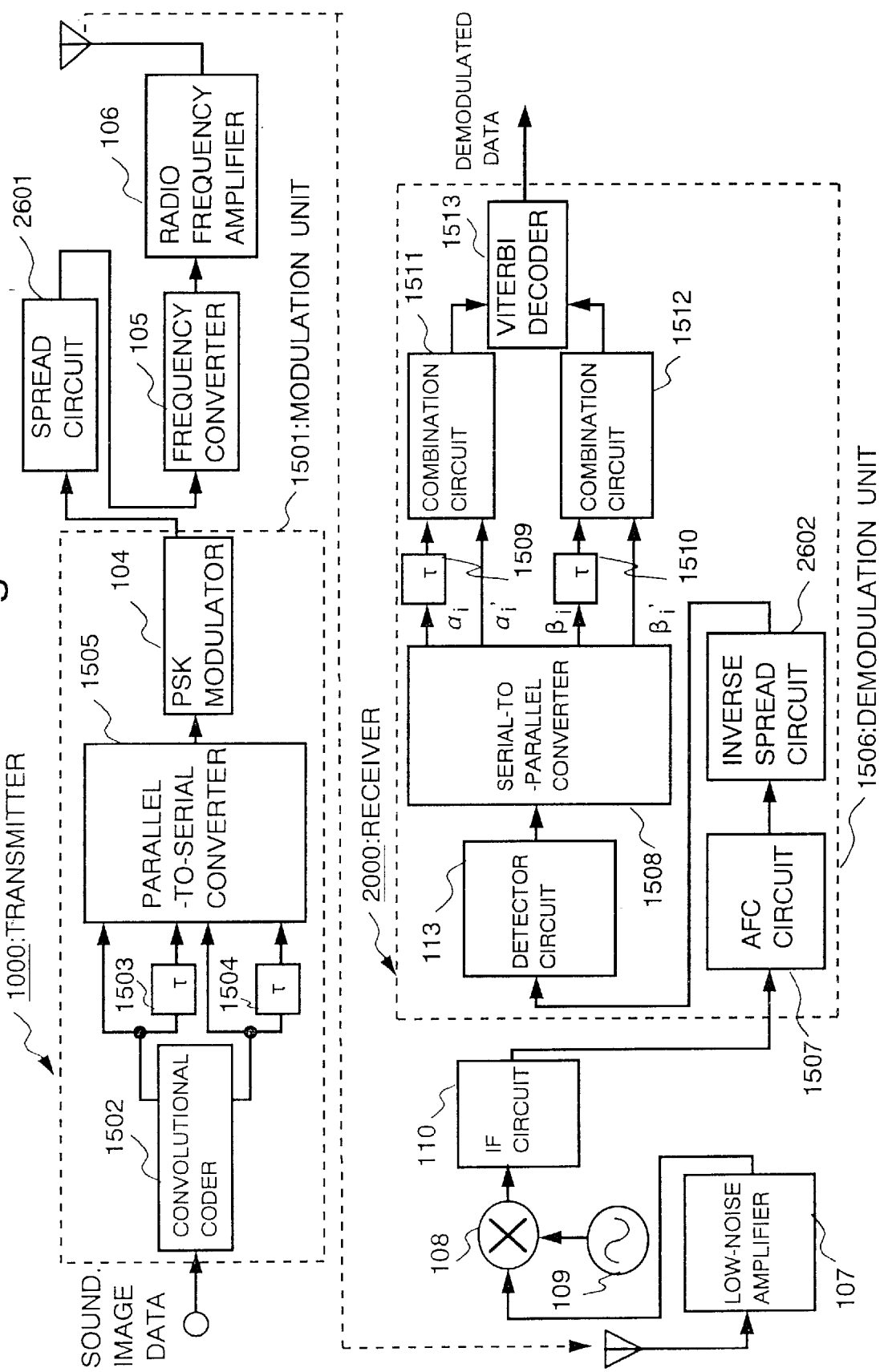
FIG. 26 shows a configuration of a communication system of Embodiment 13.

Embodiment 13 is explained with figures. FIG. 26 illustrates the configuration of a communication system for Embodiment 13. In FIG. 26, a spread circuit 2601 and an inverse spread circuit 2602 are shown. Explanation for the parts identical or corresponding to FIG. 15 is omitted by giving the identical numbers.

The operation is explained below. Similarly to Embodiment 6, sound, image, and other data is converted into a digital signal by sound coder, etc., to make data sequences to be transmitted. The data sequences to be transmitted are convolutionally coded by the convolutional coder 1502 of coding rate R 1/2. Two data sequences, the output from convolutional coder 1502 are branched out to two, one of which is directly input into parallel-to-serial converter 1505. The other is given the time delay τ by delay units 1503 and 1504 having the delay time equivalent to the M-bit data time period, and then input into parallel-to serial converter 1505. Parallel-to serial converter 1505 converts four parallel input data sequences into serial data sequences of data rate quadrapule the input data sequences and outputs them. The outputs from parallel-to-serial converter 1505 are PSK modulated by PSK modulation unit 104, and input into the spread circuit for spectrum spreading.

Figure 27:
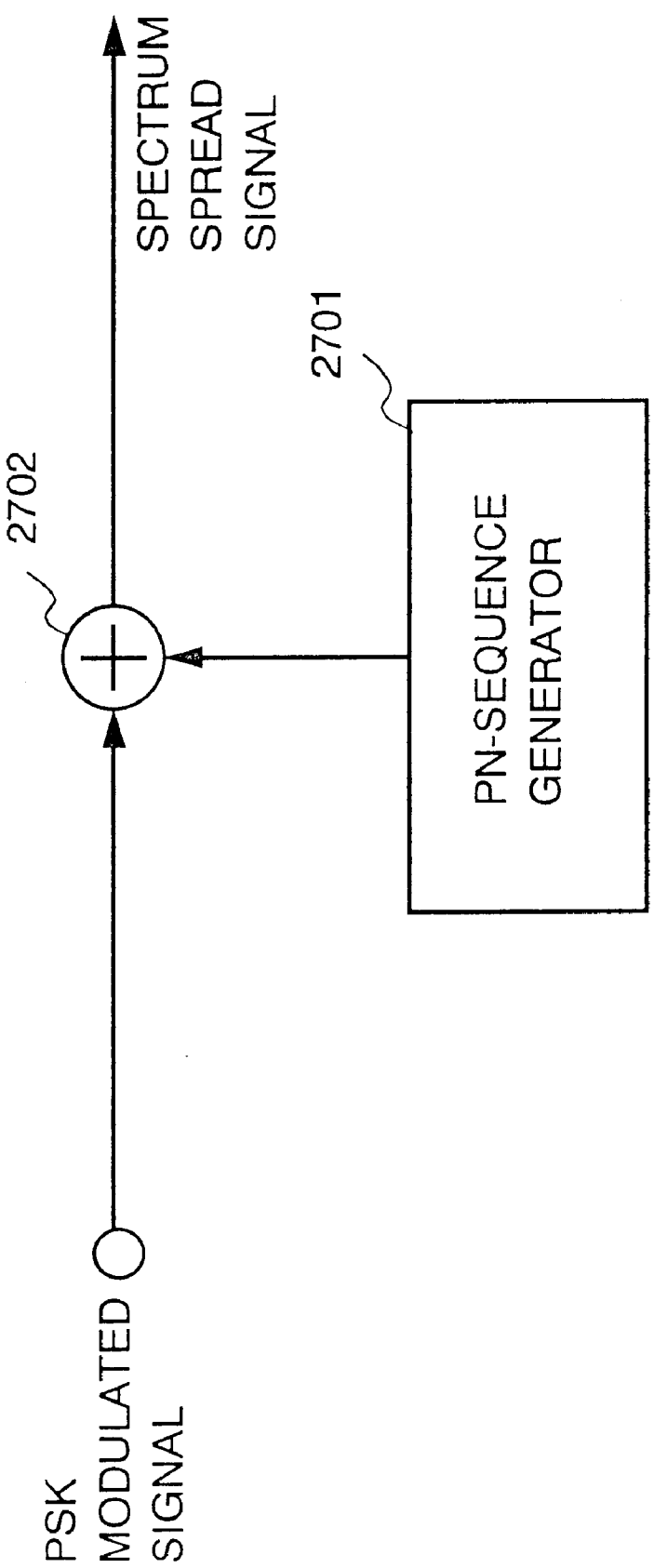
FIG. 27 shows a configuration of a spread circuit of Embodiment 13.

The operation of spread circuit 2601 is explained using a figure. FIG. 27 shows a configuration example of spread circuit 2601, and in the Figure, a PN sequence generator 2701, and a multiplier 2702 are illustrated. A modulated signal input into spread circuit 2601 is input into multiplier 2702, PN sequence generator 2701 generates PN sequences of the rate higher than the modulation data rate. Multiplier 2702 multiplies the PN sequence of the rate higher than the PN sequence modulation data rate output from PN sequence generator 2701 by the PSK modulation signal to output a spectrum spread signal.

Figure 28:
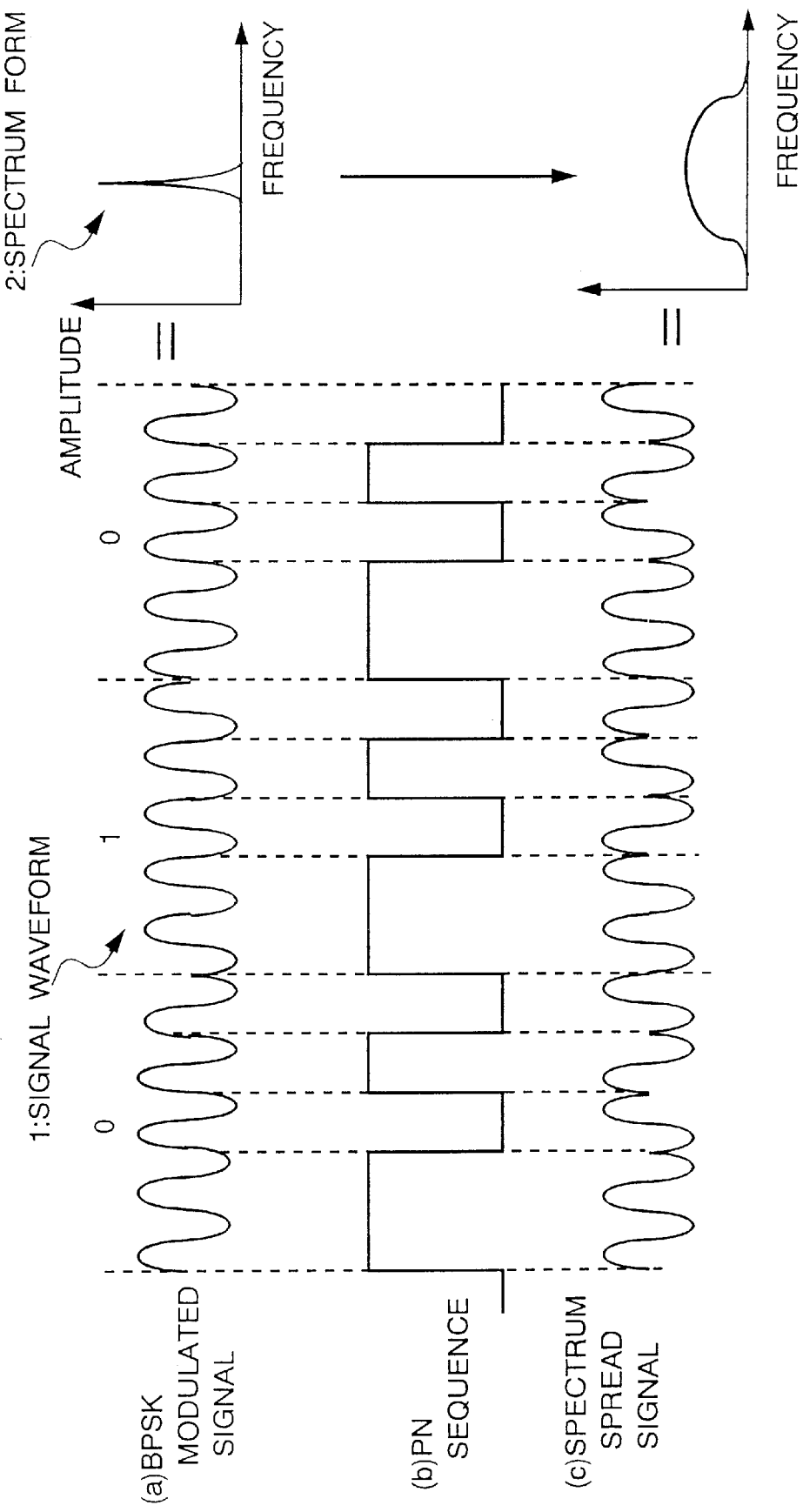
FIG. 28 illustrates the operation of the spread circuit of Embodiment 13.

As an example of applying the BPSK modulation system, FIG. 28 presents (a) BPSK modulated signal, (b) PN sequence, (c) a signal waveform 1 and spectrum form 2 of spectrum spread signal. The BPSK modulated signal having a narrow-band spectrum shown in FIG. 28 (a) is multiplied by a PN sequence with the rate higher than the modulation data rate shown in (b), and converted into the spectrum spread signal shown in (c). As shown in FIG. 28, the spectrum spread signal becomes a signal with a band wider than the BPSK modulated signal.

The spectrum spread signal output from spread circuit 2601 is frequency converted into a radio frequency by frequency converter 105. The signal converted into a radio frequency is power amplified by radio-frequency amplifier 106 before transmission. The transmitted radio signal is received by the receiver, and power amplified by low-noise amplifier 107, and input into mixer 108. Mixer 108 mixes the received RF signal with the oscillation frequency close to the frequency of the received RF signal output from oscillator 109, and converts the received RF signal into the intermediate frequency to produce a received IF signal. The converted received IF signal is input into IF circuit 110. IF circuit 110 converts the received IF signal into a received baseband signal.

The received baseband signal output from IF circuit 110 is input into demodulation unit 1506. The received baseband signal input into demodulation unit 1506 is input into AFC circuit 1507 to have its frequency offset compensated. The output from AFC circuit 1507 is input into inverse spread circuit 2602 to perform inverse spread of the spectrum.

Figure 29:
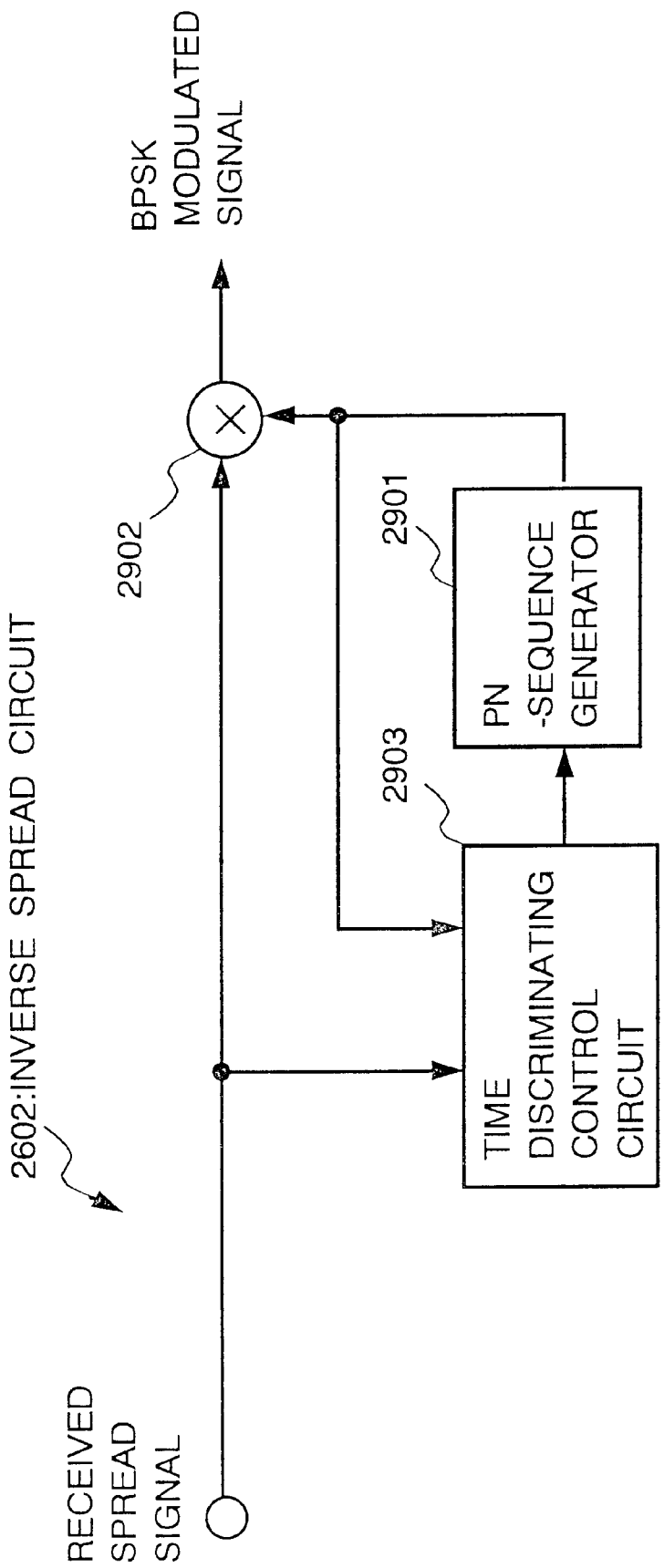
FIG. 29 shows the configuration of an inverse spread circuit Embodiment 13.

The operation of the inverse spread circuit is explained with reference to a figure. FIG. 29 shows a configuration example of the inverse spread circuit. In FIG. 29, a PN sequence generator 2901, a multiplier 2902, and a time-discriminating control circuit 2903 are shown. The received spread signal input into inverse spread circuit 2602 is input into time-discriminating control circuit 2903 to control PN sequence generator 2901 so that the PN sequence output from PN sequence generator 2901 would synchronize with the PN sequence of the transmitter. The received spread signal is then input into multiplier 2902, and multiplied by the PN sequence synchronized with the transmitter output from PN sequence generator 2901 by multiplier 2902 and the BPSK modulated signal is output.

Figure 30:
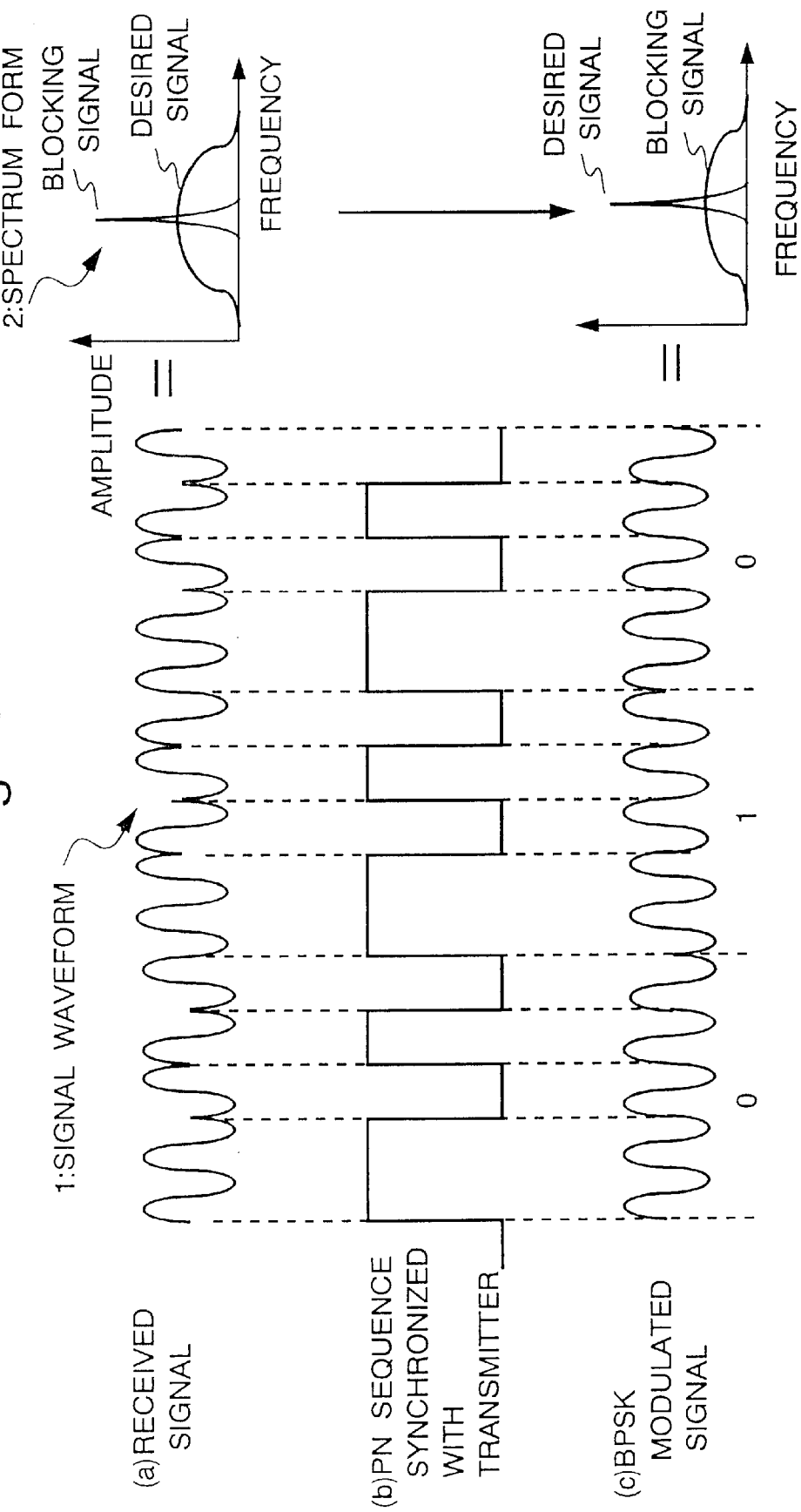
FIG. 30 shows the operation of the inverse spread circuit of Embodiment 13.
Figure 31:
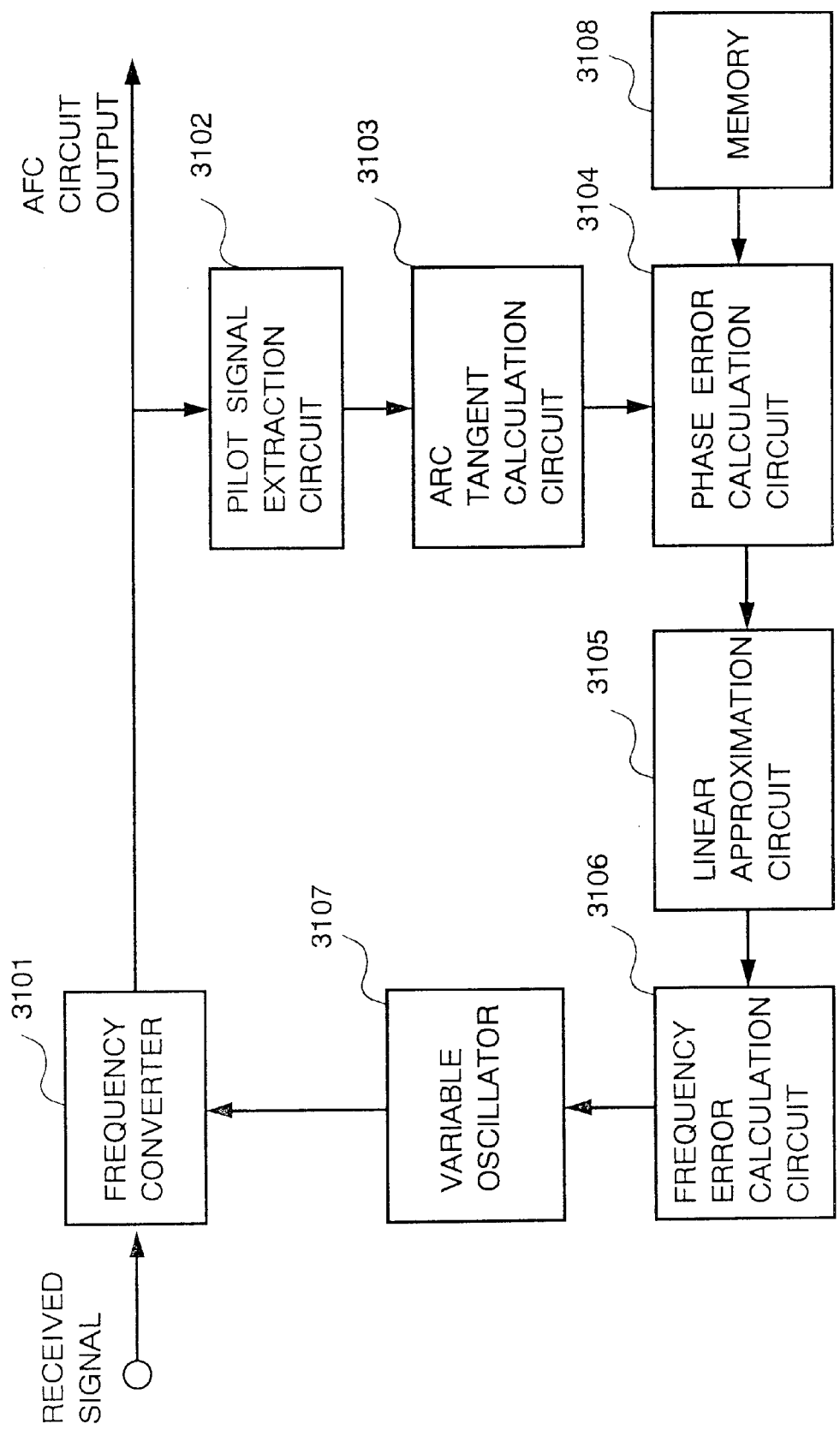
FIG. 31 shows the configuration of the conventional AFC circuit.
Figure 32:
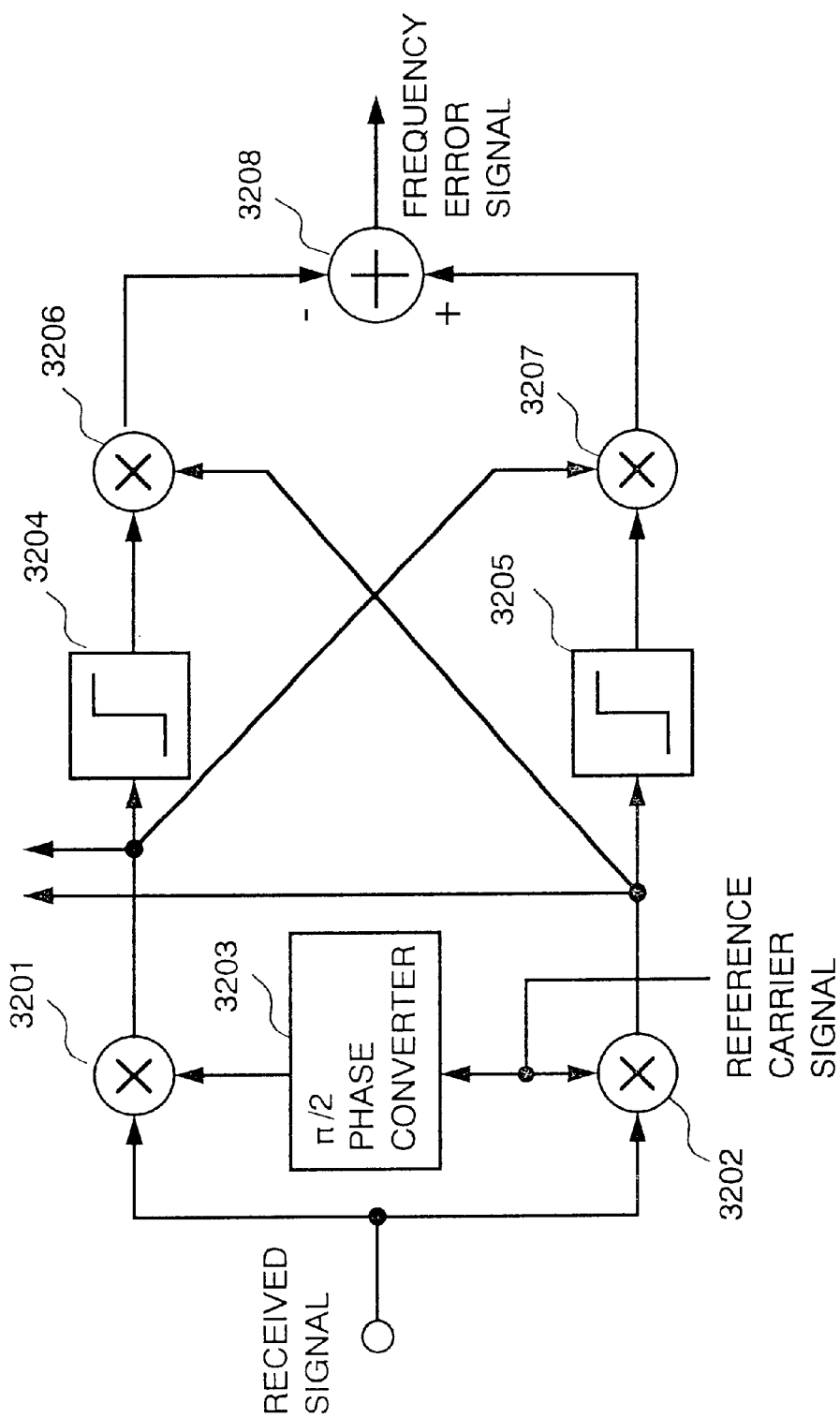
FIG. 32 illustrates another configuration of the conventional AFC circuit.
Figure 33:
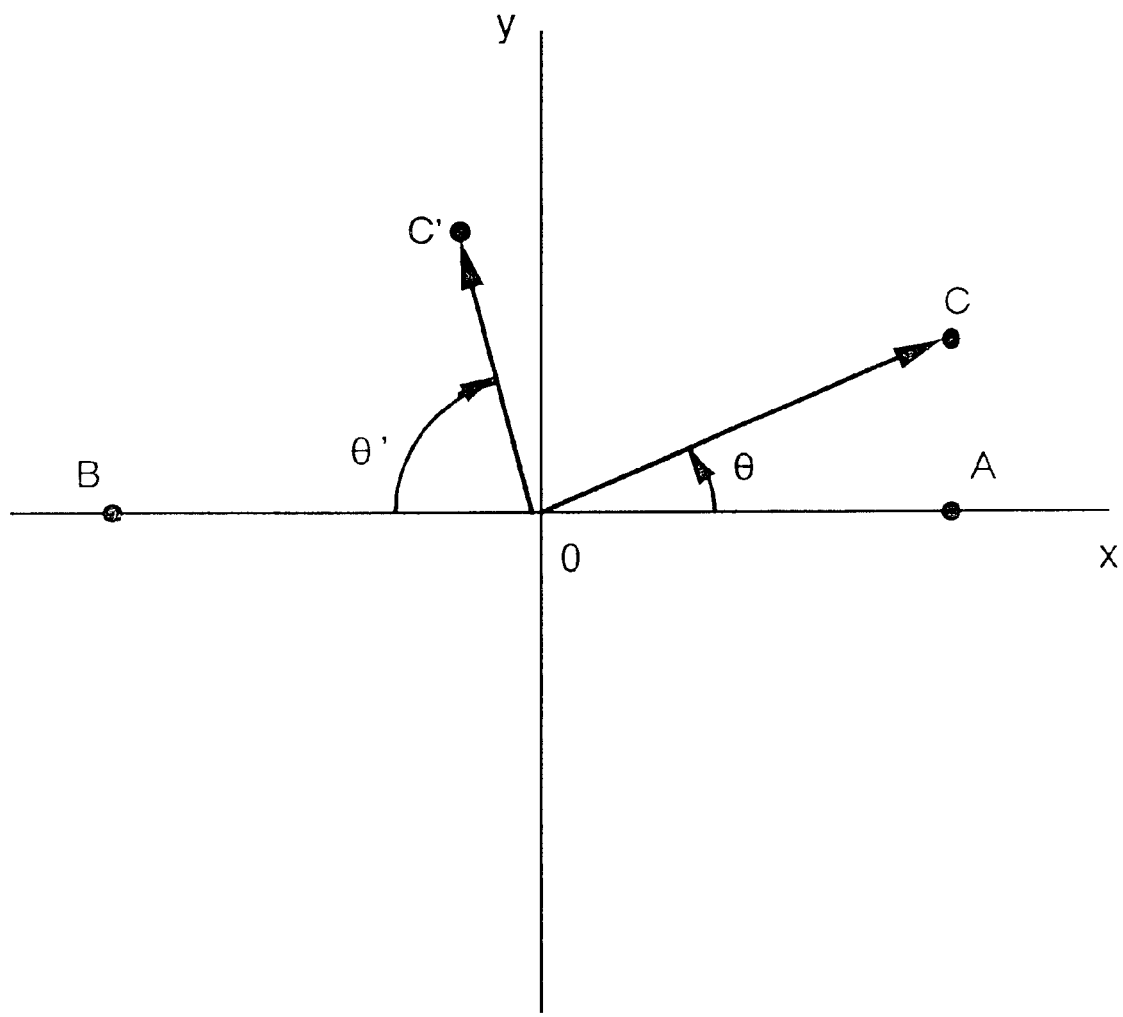
FIG. 33 is a baseband signal diagram in an event of a malfunctioning the conventional AFC circuit.
Figure 34:
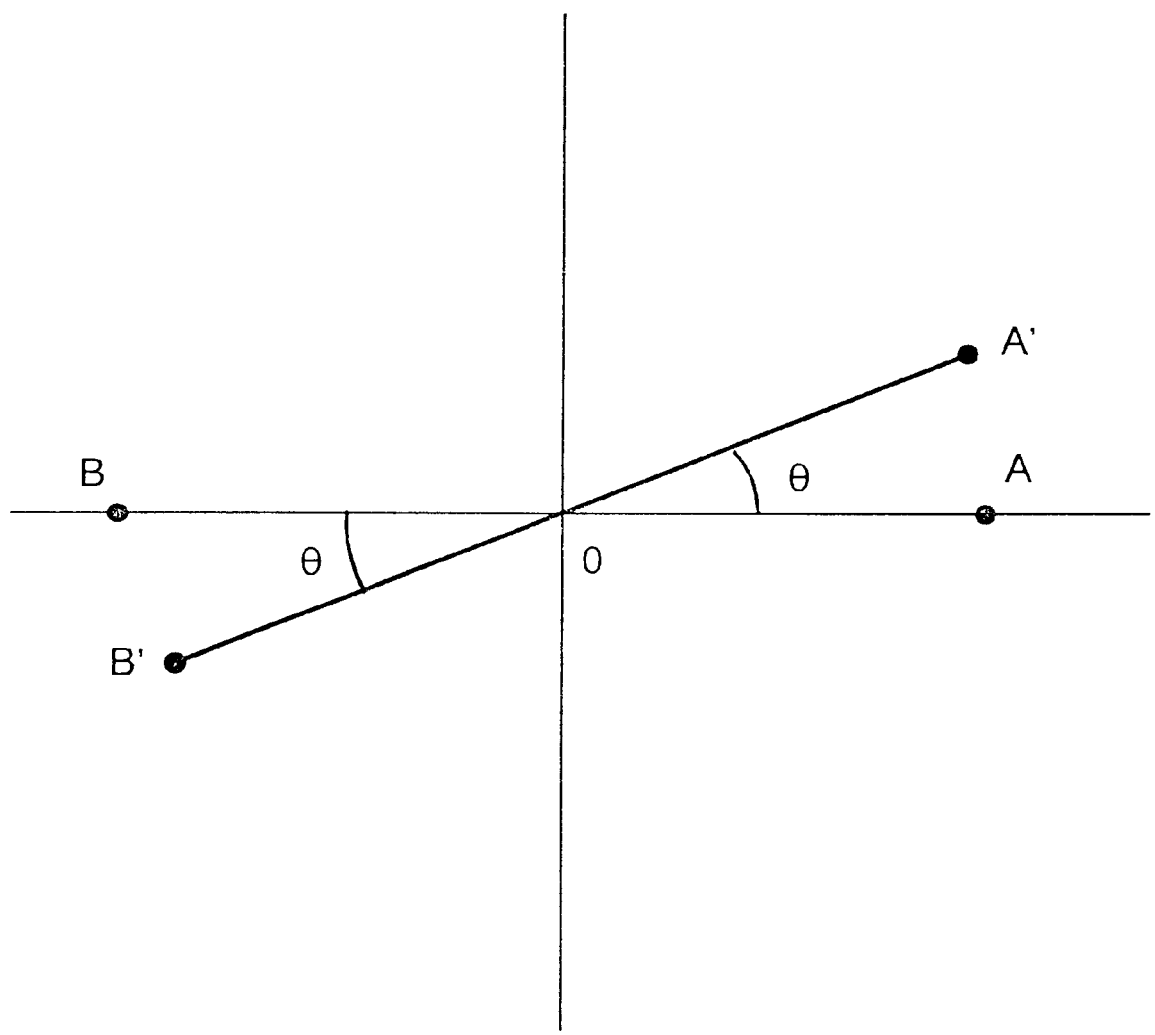
FIG. 34 is a diagram of the BPSK modulation phase.
Figure 35:
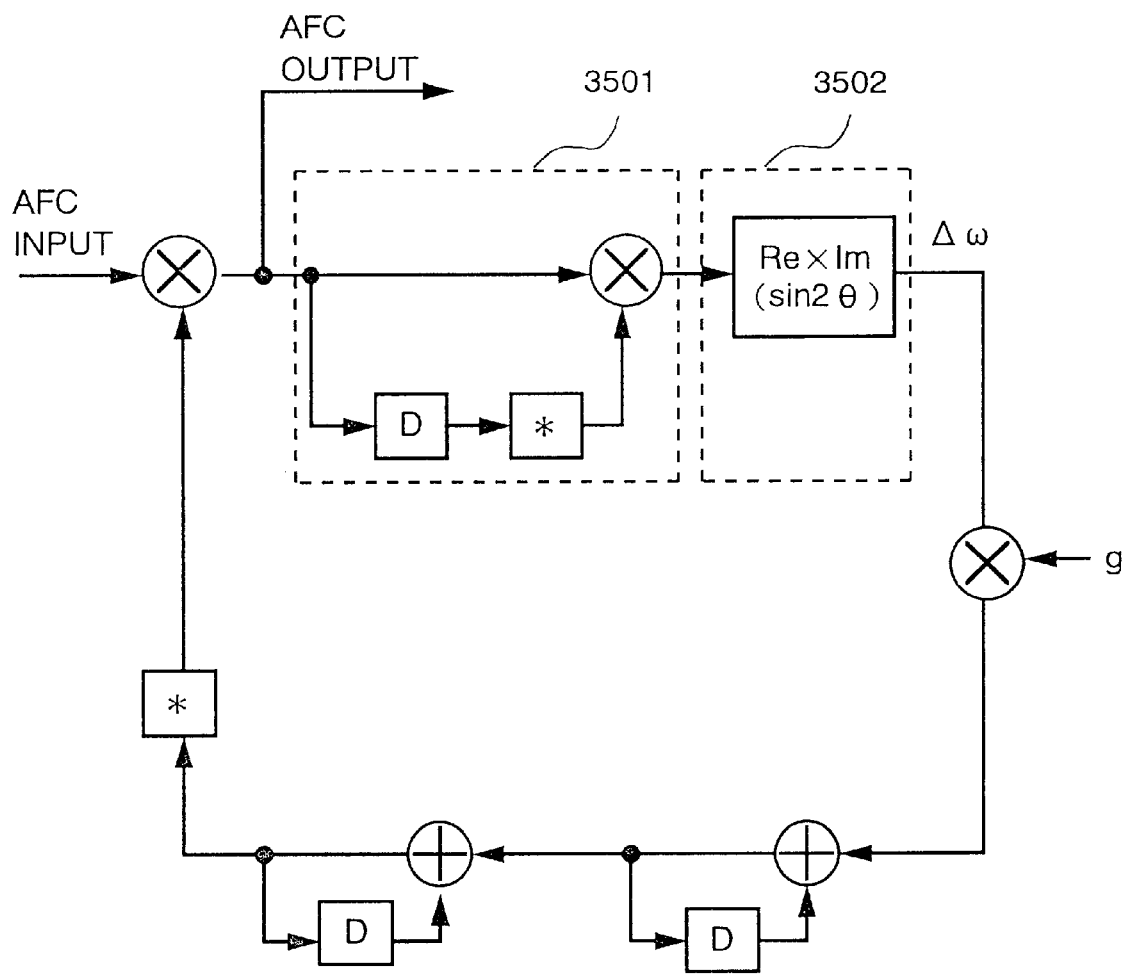
FIG. 35 shows the configuration of the conventional AFC circuit.

FIG. 30 shows received signal (a), the PN sequence (b) synchronized with the transmitter, and the signal waveform of the BPSK modulated signal 1, and spectral form 2 of the BPSK modulated signal (c). In FIG. 30, it is assumed that the received spread signal (a) contains narrow-band interfering signal from other stations besides the desired wide-band signal. When the received signal is multiplied by the PN sequence (b) synchronized with the transmitter, the correlation receiving is performed, realizing the BPSK modulated signal (c) having a narrow-band spectrum. Because the interfering signal from other stations is not spread at the transmitter, it is not correlatively received but the spectrum is spread and converted into low-level signal as shown in (c). That is, the spectrum spread system is to perform the spectrum spreading at the transmitter, and the inverse spreading at the receiving side, the interfering effects from other stations are reduced.

The PSK modulated signal output from inverse spread circuit 2602 is detected by detector circuit 113. The output from detector circuit 113 is input into serial-to-parallel converter 1508 and converted into four data sequences, $\{\alpha_i\}$, $\{\alpha_i'\}$, $\{\beta_i\}$, and $\{\beta_i'\}$. Because $\{\alpha_i'\}$ and $\{\beta_i'\}$ are given the delay τ equivalent to the M-bit time period to $\{\alpha_i\}$ and $\{\beta_i\}$, respectively at transmission time, by giving the delay τ equivalent to the M-bit time period to $\{\alpha_i\}$ and $\{\beta_i\}$ by delay units 1509 and 1510, the delay amount for both sequences can be equalized. Combination circuits 1511 and 1512 combine $\{\alpha_{i-M}\}$ with $\{\alpha_i'\}$ and $\{\beta_{i-M}\}$ with $\{\beta_i'\}$, respectively. The outputs from combination circuits 1511 and 1512 are input into Viterbi decoder 1513, which is the maximum likelihood decoder for the convolutional coder, to perform maximum likelihood decoding. The output from Viterbi decoder 1513, namely decoder output, is decoded by sound decoder, 310 and so on, and then output as sound data, image data, etc.

In the above operation, the application of time diversity technique characteristics of transmitting identical data at differentiated timing, and performing combined reception by equalizing the delay amount at the receiving side, the frequency offset is obtained without removing the modulation phase of the received signal, and a communication system with a stable AFC circuit even under low CN ratio can be achieved. Furthermore, by the configuration of performing the convolutional coding by the transmitter and Viterbi decoding by the receiver, it is advantageous in that the error rate can be lowered for the identical $E_b/N_0$. Moreover, by realizing the spectrum spread communication system by performing spectrum spreading and inverse spreading at data transmission and receiving, a robust communication system against interference or interruption and with excellent secrecy can be offered.

The above example represented a configuration in which the spectrum spreading is performed after the PSK modulation is performed by the transmitter, and inverse spreading is performed by the receiver, and then coherent detection is performed. However, it does not always have to be in this order, the PSK modulation can be performed after the spectrum spreading, and inverse spreading can be performed after the coherent detection.

Because the present invention is configured as so far described, it has the effects as given below.

In the present invention, in the system using the time diversity scheme, the frequency error is obtained without removing the modulation phase by the AFC circuit, and the frequency offset in the received signal is eliminated by the obtained error. An estimated frequency offset error stemming from the frequency error caused by the error in determining the modulation phase is reduced, and the communication system equipped with a stable AFC circuit even under low CN ratio can be achieved. Moreover, unlike the conventional examples, because a memory for storing known phase information is unnecessary for the receiver, a simplified circuitry can be realized, which further helps to reduce power consumption.

In the present invention, in the system using the time diversity scheme, the AFC circuit obtains the frequency error without removing the modulation phase, and the obtained error is fed back to the RF oscillator to eliminate the frequency offset in the received signal, and then converted into the baseband or IF frequency by the mixer, and the estimated frequency offset error stemming from the frequency error caused by the error in determining modulation phase is reduced, and a communication system equipped with a stable AFC circuit under low CN ratio is achieved with less circuit configuration.

In the present invention, the AFC circuit obtains the frequency error without removing the modulation phase, and the obtained error is fed back to the IF circuit to eliminate the frequency offset in the received signal, the estimated frequency offset error stemming from the frequency error caused by the error in determining the modulation phase, a communication system equipped with a stable AFC circuit under low CN ratio can be achieved with less circuit configuration.

In the present invention, the implementation of the convolutional coding and Viterbi decoding helps to achieve the communication system that indicates a better bit error rate.

In the present invention, the implementation of the spectrum spreading and inverse spreading helps to achieve the communication system with excellent interference-proof capability.

In the present invention, the diversity effect is obtained because the combination circuits perform the equal gain combination for identical received signals at differentiated timing.

In the present invention, the large diversity effect is obtained because the combination circuits perform the maximum ratio combination for the identical received signal at differentiated timing.

Having thus described several particular embodiments of the invention, various alterations, modifications, and improvements will readily occur to those skilled in the art. Such alterations, modifications, and improvements are intended to be unit of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An automatic frequency control communication system comprising:
   a transmitter which inputs transmission data, generates delayed transmission data having a time delay, multiplexes the delayed transmission data with the transmission data for generating multiplexed data, modulates the multiplexed data using Phase Shift Keying (PSK) modulation for generating a transmission signal, and transmits the transmission signal, and
   a receiver which receives the transmission signal transmitted by the transmitter as a received signal, detects the delayed transmission data and the transmission data included in the received signal, compensates for a phase shift of the received signal based on the delayed transmission data and the transmission data, and demodulates the received signal based on the delayed transmission data and the transmission data.

2. The automatic frequency control communication system of claim 1, wherein
   the transmitter further includes:
       a. a transmission delay unit for inputting the transmission data, adding the time delay, and outputting the delayed transmission data;
       b. a parallel-to-serial converter for converting the transmission data and the delayed transmission data from parallel to serial data;
       c. a PSK modulation unit for PSK modulating the parallel-to-serial converted data;
       d. a frequency converter for converting a frequency of the PSK modulated data; and
       e. a transmission unit for transmitting the frequency-converted data; and
   wherein the receiver further includes:
       a. an oscillator for oscillating a radio frequency;
       b. a mixer for inputting the received signal and mixing the input received signal with an output from the oscillator to convert the received signal into an IF signal;
       c. an IF circuit for converting the output-from the mixer into a baseband signal;
       d. an AFC circuit for eliminating a frequency offset from the output from the IF circuit;
       e. a detector circuit for detecting the output from the AFC circuit;
       f. a serial-to-parallel converter for converting the output from the detector circuit into received data corresponding to the transmission data of the transmitter and into a first delayed received data corresponding to the delayed transmission data of the transmitter;
       g. a received delay unit for adding the time delay to the received data and outputting a second delayed received data;
       h. a combination circuit for combining the first delayed received data with the second delayed received data; and
       i. a discriminator for discriminating a phase of the output from the combination circuit and outputting a demodulated data.

3. The automatic frequency control communication system of claim 1, wherein
   the transmitter further includes:
       a. a transmission delay unit for inputting the transmission data, adding the time delay to the input transmission data and outputting the delayed transmission data;

b. a parallel-to-serial converter for converting the transmission data and the delayed transmission data from parallel to serial data;

c. a PSK modulation unit for PSK modulating the parallel-to-serial converted data;

d. a frequency converter for converting a frequency of the PSK modulated data; and e. a transmission unit for transmitting the frequency-converted data; and wherein the receiver further includes:

a. an oscillator for oscillating a radio frequency;

b. a mixer for inputting the received signal and mixing the input received signal with the output from the oscillator to convert the received signal into a baseband signal;

c. a baseband filter for filtering the mixer output;

d. an AFC circuit for feeding a frequency control signal back to the oscillator to eliminate a frequency offset from the output from the baseband filter;

e. a detector circuit for detecting the output from the baseband filter;

f. a serial-to-parallel converter for converting the output from the detector circuit into a received data corresponding to the transmission data of the transmitter and to a first delayed received data corresponding to the delayed transmission data of the transmitter from serial to parallel data;

g. a received delay unit for adding the time delay to the received data and outputting a second delayed received data;

h. a combination circuit for combining the first delayed received data with the second delayed received data; and i. a discriminator for discriminating the phase of the combination circuit and outputting a demodulated data.

4. The automatic frequency control communication system of claim 1, wherein the transmitter further includes:

a. a convolutional coder for inputting the transmission data, and convolutionally coding the input transmission data;

b. a transmission delay unit for adding the time delay to the convolutionally coded transmission data, and outputting said delayed transmission data;

c. a parallel-to-serial converter for converting the convolutionally coded transmission data and the convolutionally coded delayed transmission data into parallel to serial data;

d. a PSK modulation unit for PSK modulating the parallel-to-serial converted data;

e. a frequency converter for converting the frequency of the PSK modulated data; and f. a transmission unit for transmitting the frequency converted data; and wherein the receiver further includes:

a. an oscillator for oscillating a radio frequency;

b. a mixer for inputting the received signal, and mixing the received signal with the output from the oscillator to convert the received signal into an IF signal;

c. an IF circuit for converting the mixer output into a baseband signal;

d. an AFC circuit for eliminating a frequency offset from the IF circuit;

e. a detector circuit for detecting the output from the AFC circuit;

f. a serial-to-parallel converter for converting the output from the detector circuit into received data corresponding to the transmission data of the transmitter and first delayed received data corresponding to the delayed transmission data of the transmitter from serial to parallel data;

g. a receive delay unit for adding the time delay to the received data, and outputting second delayed received data;

h. a combination circuit for combining the first delayed received data with the second delayed received data; and i. a maximum likelihood decoder for maximum likelihood decoding the output from the combination circuit.

5. The automatic frequency control communication system of claim 1, wherein the receiver includes:

a mixer circuit for mixing the received signal with a radio frequency signal to obtain an IF signal;

an IF circuit for converting the IF signal into a baseband signal;

and an AFC circuit for eliminating a frequency offset from the IF circuit, wherein the AFC circuit obtains a frequency error without removing a modulation phase in the output from the IF circuit, and eliminates the frequency offset by feeding a frequency error signal back to the IF circuit, and wherein the detector circuit detects the output from the IF circuit.

6. The automatic frequency control communication system of claim 2, wherein the AFC circuit obtains a frequency error without removing a modulation phase in the output from the IF circuit, and eliminates the frequency offset by feeding a frequency error signal back to the oscillator, and wherein the detector circuit detects the output from the IF circuit.

7. The automatic frequency control communication system of claim 1, wherein the transmitter further includes:

a. a convolutional coder for inputting the transmission data and convolutionally coding the transmission data;

b. a transmission delay unit for adding the time delay to the convolutionally coded transmission data, and outputting convolutionally encoded delayed transmission data;

c. a parallel-to-serial converter for converting the convolutionally coded transmission data and the convolutionally encoded delayed transmission data from parallel into serial data;

d. a PSK modulation unit for PSK modulating the parallel to serial converted data;

e. a frequency converter for converting the frequency of the PSK modulated data; and f. a transmission unit for transmitting the frequency-converted data; and wherein the receiver further includes:

a. an oscillator for oscillating a radio frequency;

b. a mixer for inputting the received signal, and mixing the input received signal with the output from the oscillator to convert the received signal into a baseband signal;

c. a baseband filter for filtering the output from the mixer;

d. an AFC circuit for outputting a frequency control signal out of the output from the baseband filter;

e. a detector circuit for detecting the output from the baseband filter;

f. a serial-to-parallel converter for converting the output from the detector circuit into received data corresponding to the transmission data of the transmitter and first delayed received data corresponding to the delayed transmission data of the transmitter from serial into parallel data;

g. a received delay unit for adding to the received data the time delay and outputting second delayed received data;

h. a combination circuit for combining the first delayed received data with the second delayed received data; and i. a maximum likelihood decoder for decoding the output from the combination circuit in the maximum likelihood.

8. The automatic frequency control communication system of claim 4, wherein the transmitter is equipped with a spread circuit for spreading the spectrum of the PSK modulated transmission data, and wherein the frequency converter converts the frequency of the spread transmission data into a spectrum of the spread circuit; and wherein the receiver is equipped with an inverse spread circuit for inversely spreading the spectrum of the output from the AFC circuit, and the detector circuit detects the output from the inverse spread circuit.

9. The automatic frequency control communication system of claim 4, wherein the transmitter is equipped with a spread circuit for spreading the spectrum of the transmission data converted from parallel to serial, and the PSK modulation unit PSK modulates the transmission data whose spectrum has been spread by the spread circuit, wherein the receiver is equipped with an inverse spread circuit for spreading a spectrum of the output from the detector circuit inversely, and wherein the serial-to-parallel converter converts the output from the inverse circuit from serial to parallel data.

10. The automatic frequency control communication system of claim 2, wherein the combination circuit of the receiver performs an equal gain combination.

11. The automatic frequency control communication system of claim 2, wherein the combination circuit of the receiver performs a maximum ratio combination.

12. The automatic frequency control communication system of claim 4, wherein a. the convolutional coder inputs the transmission data, and convolutionally codes the input transmission data in order to output the transmission data made up of a plurality of data sequences;

b. the transmission delay unit adds the time delay to the transmission data corresponding to the plurality of data sequences in order to output the delayed transmission data; and c. the parallel-to-serial converter converts the transmission data corresponding to the plurality of data sequences and the delayed transmission data from parallel into serial data;

and wherein a. the serial-to-parallel converter converts the output from the detector circuit into the received data corresponding to the transmission data corresponding to the plurality of data sequences and the first delayed received data corresponding to the delayed transmission data corresponding to the plurality of data sequences from serial to parallel data;

b. the received delay unit outputs the second delayed received data to which the time delay is added to the received data;

c. the combination circuit combines the first delayed received data and the second delayed received data; and d. the maximum likelihood decoder decodes the output from the combination circuit corresponding to the data sequences in the maximum likelihood in order to output decoded data.

13. The automatic frequency control communication system of claim 4, wherein a. the convolutional coder inputs the transmission data, and convolutionally codes the input transmission data in order to output convolutionally coded data made up of a plurality of data sequences;

b. the transmission delay unit gives the convolutionally coded data corresponding to each of the plurality of data sequences a first transmission delay time corresponding to a first set of data sequences to output in a first set of transmission data, and gives the convolutionally coded data corresponding to each of the plurality of data sequences a second transmission delay time corresponding to a second set of data sequences to output in a second set of transmission data; and c. the parallel-to-serial converter converts the first set of transmission data and the second set of transmission data from parallel into serial data; and wherein a. the serial-to-parallel converter converts the output from the detector circuit into the first received data corresponding to the first set of transmission data corresponding to the first set of data sequences and the second received data corresponding to the second set of transmission data corresponding to the second set of data sequences;

b. the received delay unit adds to the first received data corresponding to the plurality of data sequences a first received delay time corresponding to a first set of data sequences in order to output a first delayed signal, and adds to the second received data corresponding to a second set of data sequences a second received delay time in order to output the second delayed signal;

c. the combination circuit combines the first delayed signal and the second delayed signal; and d. the maximum likelihood decoder decodes the output from the combination circuit corresponding to the plurality of data sequences in maximum likelihood in order to output the decoded data; and wherein a sum of the first transmission delay time and the first received delay time equals each of the first set of data sequences, the second set of data sequences and the sum of the second transmission delay time and the second received delay time.

14. The automatic frequency control communication system of claim 3, wherein the AFC circuit obtains a frequency error without removing a modulation phase in the output from the IF circuit, and reduces the frequency offset by feeding a frequency error signal back to the IF circuit, and wherein the detector circuit detects the output from the IF circuit.

15. The automatic frequency control communication system of claim 3, wherein the AFC circuit obtains a frequency error without removing a modulation phase in the output from the IF circuit, and reduces the frequency offset by feeding a frequency error signal back to the oscillator, and wherein the detector circuit detects the output from the IF circuit.

16. The automatic frequency control communication system of claim 4, wherein the AFC circuit obtains a frequency error without removing a modulation phase in the output from the IF circuit, and reduces the frequency offset by feeding a frequency error signal back to the IF circuits and wherein the detector circuit detects the output from the IF circuit.

17. The automatic frequency control communication system of claim 4, wherein the AFC circuit obtains a frequency error without removing a modulation phase in the output from the IF circuit, and reduces the frequency offset by feeding a frequency error signal back to the oscillator, and wherein the detector circuit detects the output from the IF circuit.

18. The automatic frequency control communication system of claim 7, wherein the AFC circuit obtains a frequency error without removing a modulation phase in the output from the IF circuit, and reduces the frequency offset by feeding a frequency error signal back to the IF circuit, and wherein the detector circuit detects the output from the IF circuit.

19. The automatic frequency control communication system of claim 7, wherein the AFC circuit obtains a frequency error without removing a modulation phase in the output from the IF circuit, and reduces the frequency offset by feeding a frequency error signal back to the oscillator, and wherein the detector circuit detects the output from the IF circuit.

20. A communication method comprising steps of:
inputting a transmission data;
generating delayed transmission data having a time delay;
multiplexing the delayed transmission data and the transmission data to generate a multiplexed data;
modulating the multiplexed data using the Phase Shift Keying (PSK) modulation to generate a transmission signal;
transmitting the transmission signal;
receiving the transmission signal transmitted by the transmitter as a received signal;
detecting the delayed transmission data and the transmission data included in the received signal;
compensating for a phase shift of the received signal based on the delayed transmission data and the transmission data; and
demodulating data of the received signal based on the delayed transmission data and the transmission data.

21. A method for automatic frequency control in a transmitter comprising:
generating delayed transmission data having a time delay associated therewith relative to non-delayed transmission data;
multiplexing the delayed transmission data with the non-delayed transmission data to generate multiplexed data;
modulating the multiplexed data using Phase Shift Keying (PSK) modulation to generate a transmission signal; and
transmitting the transmission signal,
wherein the delayed transmission data is used to compensate for a phase shift in the transmission signal.

22. The method according to claim 21, wherein the transmission data and the delayed transmission data are convolutionally coded.

23. A method for automatic frequency control in a receiver comprising:
separating delayed transmission data from non-delayed transmission data in a received signal;
compensating for a phase shift associated with the received signal based on the separated delayed transmission data and non-delayed transmission data; and
demodulating the received signal based on the delayed transmission data and the non-delayed transmission data.

24. The method according to claim 23, wherein the step of demodulating further includes the steps of:
converting the received signal into a plurality of data sequences;
adding a delay to at least some of the data sequences to generate delayed and non-delayed data sequences;
combining the delayed and non-delayed data sequences to form combined data sequences; and
performing a maximum likelihood decoding on the combined data sequences.

25. The method according to claim 23 wherein the step of compensating further includes the steps of:
removing a frequency offset associated with the received signal; and inverse-spreading the received signal once the frequency offset has been removed.

26. A transmitter for providing automatic frequency control in a communication system comprising:
a transmit output section; and
a processing section coupled to the transmit output section, the transmitter configured to:
generate delayed transmission data having a time delay relative to transmission data,
multiplex the delayed transmission data with the transmission data to generating multiplexed data,
modulate the multiplexed data using Phase Shift Keying (PSK) modulation for generating a transmission signal, and
transmit the transmission signal,
wherein the delayed transmission data is used to compensate for a phase shift in the transmission signal.

27. The transmitter of claim 26, wherein the processing section further comprises:
a. a transmission delay unit adding the time delay to the transmission data to generate the delayed transmission data;
b. a parallel-to-serial converter for converting the transmission data and the delayed transmission data from parallel to serial data;
c. a PSK modulation unit for PSK. modulating the parallel-to-serial converted data;
d. a frequency converter for converting a frequency of the PSK modulated data; and
e. a transmission unit for transmitting the frequency-converted data.

28. The transmitter of claim 26, wherein the processing section further comprises:
a. a convolutional coder for convolutionally coding the transmission data;
b. a transmission delay unit for adding the time delay to the convolutionally coded transmission data, and outputting a convolutionally coded delayed transmission data;
c. a parallel-to-serial converter for converting the convolutionally coded transmission data and the convolutionally coded delayed transmission data into serial data;
d. a PSK modulation unit for PSK modulating the parallel-to-serial converted data; and
e. a frequency converter for converting the frequency of the PSK modulated data;
wherein the transmit output section transmits the frequency converted data.

29. The transmitter of claim 28, wherein the processing section further comprises a spread circuit for spreading the spectrum of the PSK modulated transmission data; wherein the frequency converter converts the frequency of the spread transmission data into a spectrum of the spread circuit.

30. The transmitter of claim 28, wherein the processing section further comprises a spread circuit for spreading the spectrum of the parallel to serial converted transmission data, and wherein the PSK modulation unit PSK modulates the spread spectrum transmission data.

31. The transmitter of claim 28, wherein:
  a. the convolutional coder is further configured to convolutionally code the transmission data to output a plurality of data sequences;
  b. the transmission delay unit is further configured to adds the time delay to the plurality of data sequences in order to output the delayed transmission data; and
  c. the parallel-to-serial converter converts the plurality of data sequences and the delayed transmission data from parallel into serial.

32. A transmitter for providing automatic frequency control in a communication system comprising:
  a transmit output section; and
  a processing section coupled to the transmit output section, the transmitter configured to:
    generate delayed transmission data having a time delay relative to transmission data,
    multiplex the delayed transmission data with the transmission data to generating multiplexed data,
    modulate the multiplexed data using Phase Shift Keying (PSK) modulation for generating a transmission signal, and
    transmit the transmission signal,
  wherein the processing section further comprises:
    a. a convolutional coder for convolutionally coding the transmission data;
    b. a transmission delay unit for adding the time delay to the convolutionally coded transmission data, and outputting a convolutionally coded delayed transmission data;
    c. a parallel-to-serial converter for converting the convolutionally coded transmission data and the convolutionally coded delayed transmission data into serial data;
    d. a PSK modulation unit for PSK modulating the parallel-to-serial converted data; and
    e. a frequency converter for converting the frequency of the PSK modulated data,
  wherein the transmit output section transmits the frequency converted data,
  wherein
    the transmission delay unit is further configured to give the convolutionally coded data corresponding to each of the plurality of data sequences a first transmission delay time corresponding to a first set of data sequences to output in a first set of transmission data, and gives the convolutionally coded data corresponding to each of the plurality of data sequences a second transmission delay time corresponding to a second set of data sequences to output in a second set of transmission data; and
    the parallel-to-serial converter is further configured to convert the first set of transmission data and the second set of transmission data from parallel into serial.

33. A receiver for providing automatic frequency control in a communication system comprising:
  a receive input section; and
  a receive processing section coupled to the receive input section, the receiver configured to:
    separate transmission data from delayed transmission data included in a received signal,
    compensate for a phase shift of the received signal based on the transmission data and the delayed transmission data, and
    demodulate the received signal based on the delayed transmission data and the transmission data.

34. The receiver of claim 33, wherein the receive processing section further comprises:
  a. an oscillator for generating a radio frequency;
  b. a mixer for mixing the received signal with the radio frequency to generate an IF signal;
  c. an IF circuit for converting the IF signal into a baseband signal;
  d. an AFC circuit for removing a frequency offset from the baseband signal;
  e. a detector circuit for detecting the baseband signal with removed frequency offset;
  f. a serial-to-parallel converter for converting the baseband signal with removed frequency offset into received data corresponding to the transmission data and into a first delayed received data corresponding to the delayed transmission data;
  g. a received delay unit for adding a time delay to the received data and outputting a second delayed received data;
  h. a combination circuit for combining the first delayed received data with the second delayed received data to generate combined data; and
  i. a discriminator for discriminating a phase of the combined data and outputting demodulated data.

35. The receiver of claim 33, wherein the receive processing section further includes:
  a. an oscillator for generating a radio frequency;
  b. a mixer for mixing the received signal with the radio frequency to generate a baseband signal;
  c. a baseband filter for filtering the baseband signal;
  d. an AFC circuit configured to provide a frequency control signal to the oscillator such that the radio frequency is generated which removes a frequency offset from the output of baseband filter;
  e. a detector circuit for detecting the output from the baseband filter;
  f. a serial-to-parallel converter for converting the output from the detector circuit into a received data corresponding to the transmission data and into a first delayed received data corresponding to the delayed transmission data from serial to parallel data;
  g. a received delay unit for adding a time delay to the received data and outputting a second delayed received data;
  h. a combination circuit for combining the first delayed received data with the second delayed received data to generate combined data; and
  i. a discriminator for discriminating a phase of the combined data and outputting demodulated data.

36. The receiver of claim 33, wherein the receive processing section further comprises:
  a. an oscillator for generating a radio frequency;
  b. a mixer for mixing the received signal with the radio frequency to generate an IF signal;

c. an IF circuit for converting the IF signal into a baseband signal;

d. an AFC circuit for removing a frequency offset from baseband signal;

e. a detector circuit for detecting the output from the AFC circuit;

f. a serial-to-parallel converter for converting the output from the detector circuit into received data corresponding to the transmission data and a first delayed received data corresponding to the delayed transmission data from serial to parallel data;

g. a receive delay unit for adding a time delay to the received data, and outputting a second delayed received data;

h. a combination circuit for combining the first delayed received data with the second delayed received data to generate combined data; and i. a maximum likelihood decoder for maximum likelihood decoding the combined data.

37. The receiver of claim 34, wherein the AFC circuit is further configured to:

obtain a frequency error without removing a modulation phase from the baseband signal, and eliminate the frequency offset by feeding a frequency error signal back to the IF circuit.

38. The receiver claim 34, wherein the AFC circuit is further configured to:

obtain a frequency error without removing a modulation phase from the baseband circuit, and eliminate the frequency offset by feeding a frequency error signal back to the oscillator.

39. The receiver of claim 33, wherein the receive processing section further comprises:

a. an oscillator for generating a radio frequency;

b. a mixer for mixing the received signal with the radio frequency to generate a baseband signal;

c. a baseband filter for filtering the baseband signal;

d. an AFC circuit for outputting a frequency control signal based on the filtered baseband signal;

e. a detector circuit for detecting the output from the baseband filter;

f. a serial-to-parallel converter for converting the output from the detector circuit into a received data corresponding to the transmission data and a first delayed received data corresponding to the delayed transmission data from serial into parallel data;

g. a received delay unit for adding to the received data a time delay and outputting a second delayed received data;

h. a combination circuit for combining the first delayed received data with the second delayed received data to generate combined data; and i. a maximum likelihood decoder for maximum likelihood decoding the combined data.

40. The automatic frequency control communication system of claim 36, wherein the receiver processing section further comprises an inverse spread circuit for inversely spreading the spectrum of the baseband signal output from the AFC circuit.

41. The receiver of claim 36, wherein the receive processing section further comprises an inverse spread circuit for inversely spreading a spectrum of the output from the detector circuit.

42. The receiver of claim 36, wherein:

a. the serial-to-parallel converter is further configured to convert the output from the detector circuit into the received data corresponding to the transmission data and further corresponding to a first plurality of data sequences and the first delayed received data corresponding to the delayed transmission data and further corresponding to a second plurality of data sequences from serial to parallel data; and d. the maximum likelihood decoder is further configured to maximum likelihood decode the output from the combination circuit corresponding to the first and second data sequences.

43. The receiver of claim 36, wherein:

a. the serial-to-parallel converter is further configured to convert the output from the detector circuit into the first received data corresponding to a first set of transmission data corresponding to a first set of data sequences and the second received data corresponding to a second set of transmission data corresponding to a second set of data sequences;

b. the received delay unit is further configured to add to the first god received data corresponding a first received delay time corresponding to a first set of data sequences to generate a first delayed signal, and adds to the second received data a second received delay time corresponding to a second set of data sequences to generate a second delayed signal;

c. the combination circuit is further configured to combine the first delayed signal and the second delayed signal; and d. the maximum likelihood decoder is further configured to maximum likelihood decode the output from the combination circuit corresponding to the plurality of data sequences to generate the decoded data; and wherein a sum of a first transmission delay time and the first received delay time equals the sum of each time delay associated with the first set of data sequences, the second set of data sequences, and the sum of a second transmission delay time and the second received delay time.

44. A transmitter for providing automatic frequency control in a communication system, comprising:

a transmit output section; and a processing section coupled to the transmit output section, the transmitter configured to:

input transmission data, generate delayed transmission data having a time delay associated therewith relative to the input transmission data, multiplex the delayed transmission data with the input transmission data to generate multiplexed data, modulate the multiplexed data using Phase Shift Keying (PSK) modulation for generating a transmission signal, and transmit the transmission signal, wherein the processing section further comprises:

a. a convolutional coder for convolutionally coding the input transmission data;

b. a transmission delay unit for adding the time delay to the convolutionally coded input transmission data, and outputting a convolutionally coded delayed transmission data;

c. a parallel-to-serial converter for converting the convolutionally coded input transmission data and the convolutionally coded delayed transmission data into serial data;

d. a PSK modulation unit for PSK modulating the parallel-to-serial converted data; and e. a frequency converter for converting the frequency of the PSK modulated data, wherein the transmit output section transmits the frequency converted data;

the convolutional coder is further configured to convolutionally code the input transmission data to output a plurality of data sequences;

the transmission delay unit is further configured to add the time delay to the plurality of data sequences in order to output the delayed transmission data; and the parallel-to-serial converter converts the plurality of data sequences and the delayed transmission data from parallel into serial.

45. The transmitter of claim 44, wherein the transmission delay unit is further configured to give the convolutionally coded data corresponding to each of the plurality of data sequences a first transmission delay time corresponding to a first set of data sequences to output in a first set of transmission data, and gives the convolutionally coded data corresponding to each of the plurality of data sequences a second transmission delay time corresponding to a second set of data sequences to output in a second set of transmission data; and the parallel-to-serial converter is further configured to convert the first set of transmission data and the second set of transmission data from parallel into serial.

46. A communication system comprising:

a transmitter, which:

inputs transmission data, generates delayed transmission data having a time delay associated therewith relative to the input transmission data, multiplexes the delayed transmission data with the input transmission data to generate multiplexed data, modulates the multiplexed data to generate a transmission signal, and transmits the transmission signal; and a receiver, which detects the delayed transmission data and the transmission data in a received signal;

compensates for a phase shift associated with the received signal based on the detected delayed transmission data and the transmission data; and demodulates the received signal based on the delayed transmission data and the transmission data.

47. A communication method comprising steps of:

inputting transmission data;

generating delayed transmission data having a time delay;

multiplexing the delayed transmission data and the transmission data to generate a multiplexed data;

modulating the multiplexed data to generate a transmission signal;

transmitting the transmission signal;

receiving the transmission signal transmitted by the transmitter as a received signal;

detecting the delayed transmission data and the transmission data included in the received signal;

compensating for a phase shift of the received signal based on the delayed transmission data and the transmission data; and demodulating data of the received signal based on the delayed transmission data and the transmission data.

\* \* \* \* \*